United States Patent
Arimoto et al.

(10) Patent No.: US 7,480,168 B2
(45) Date of Patent: Jan. 20, 2009

(54) SEMICONDUCTOR MEMORY DEVICE

(75) Inventors: Kazutami Arimoto, Hyogo (JP); Hiroki Shimano, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 28 days.

(21) Appl. No.: 11/819,583

(22) Filed: Jun. 28, 2007

(65) Prior Publication Data

US 2008/0175038 A1    Jul. 24, 2008

Related U.S. Application Data

(63) Continuation of application No. 11/397,811, filed on Apr. 5, 2006, now Pat. No. 7,248,495, which is a continuation of application No. 10/922,936, filed on Aug. 23, 2004, now Pat. No. 7,046,543, which is a continuation of application No. 10/119,094, filed on Apr. 10, 2002, now Pat. No. 6,785,157.

(30) Foreign Application Priority Data

| May 21, 2001 | (JP) | ............................. 2001-151084 |
| Jul. 9, 2001 | (JP) | ............................. 2001-208431 |
| Sep. 26, 2001 | (JP) | ............................. 2001-294441 |

(51) Int. Cl.
*G11C 11/24* (2006.01)
(52) U.S. Cl. ............. 365/149; 365/230.06; 365/230.03; 365/189.09
(58) Field of Classification Search ................. 365/149, 365/230.06, 230.03, 189.09
See application file for complete search history.

(56) References Cited

U.S. PATENT DOCUMENTS

| 5,013,679 A | 5/1991 | Kumagai et al. |
| 5,495,440 A | 2/1996 | Asakura |
| 5,798,545 A | 8/1998 | Iwasa et al. |
| 6,023,438 A | 2/2000 | Tanaka et al. |
| 6,038,160 A | 3/2000 | Nakne et al. |

(Continued)

FOREIGN PATENT DOCUMENTS

JP    2000-124331 A    4/2000

OTHER PUBLICATIONS

K. Fujishima, et al *"A Storage-Node-Boosted Ram With Word-Line Delay Compensation"* IEEE Journal of Solid-State Circuits, vol. SC-17, No. 5, Oct. 1982, pp. 872-876.

(Continued)

*Primary Examiner*—Connie C Yoha
(74) *Attorney, Agent, or Firm*—McDermott Will & Emery LLP

(57) ABSTRACT

Conductive lines constituting word lines of memory cells and conductive lines constituting memory cell plate electrodes are formed in the same interconnecting layer in a memory device including a plurality of memory cells each including a capacitor for storing data in an electrical charge form. By forming the capacitors of the memory cells into a planar capacitor configuration, a step due to the capacitors is removed. Thus a dynamic semiconductor memory device can be formed through CMOS process, and a dynamic semiconductor memory device suitable for merging with logic is achieved. Data of 1 bit is stored by two memory cells, and data can be reliably stored even if the capacitance value of the memory cell is reduced due to the planar type capacitor.

9 Claims, 36 Drawing Sheets

U.S. PATENT DOCUMENTS

| | | |
|---|---|---|
| 6,081,036 A | 6/2000 | Hirano et al. |
| 6,088,286 A * | 7/2000 | Yamauchi et al. ...... 365/230.06 |
| 6,151,244 A | 11/2000 | Fujino et al. |
| 6,240,006 B1 | 5/2001 | Kawasaki |
| 6,297,985 B1 | 10/2001 | Kang |
| 6,392,942 B2 | 5/2002 | Noda et al. |
| 6,573,613 B2 | 6/2003 | Arimoto et al. |
| 6,781,915 B2 | 8/2004 | Arimoto et al. |
| 6,785,157 B2 | 8/2004 | Arimoto et al. |
| 6,898,137 B2 | 5/2005 | Arimoto et al. |
| 7,020,039 B2 | 3/2006 | Tran et al. |
| 2002/0141228 A1 | 10/2002 | Fujino |

OTHER PUBLICATIONS

U.S. Appl. No. 09/760,804, filed Jan. 17, 2001.

* cited by examiner

F I G. 8
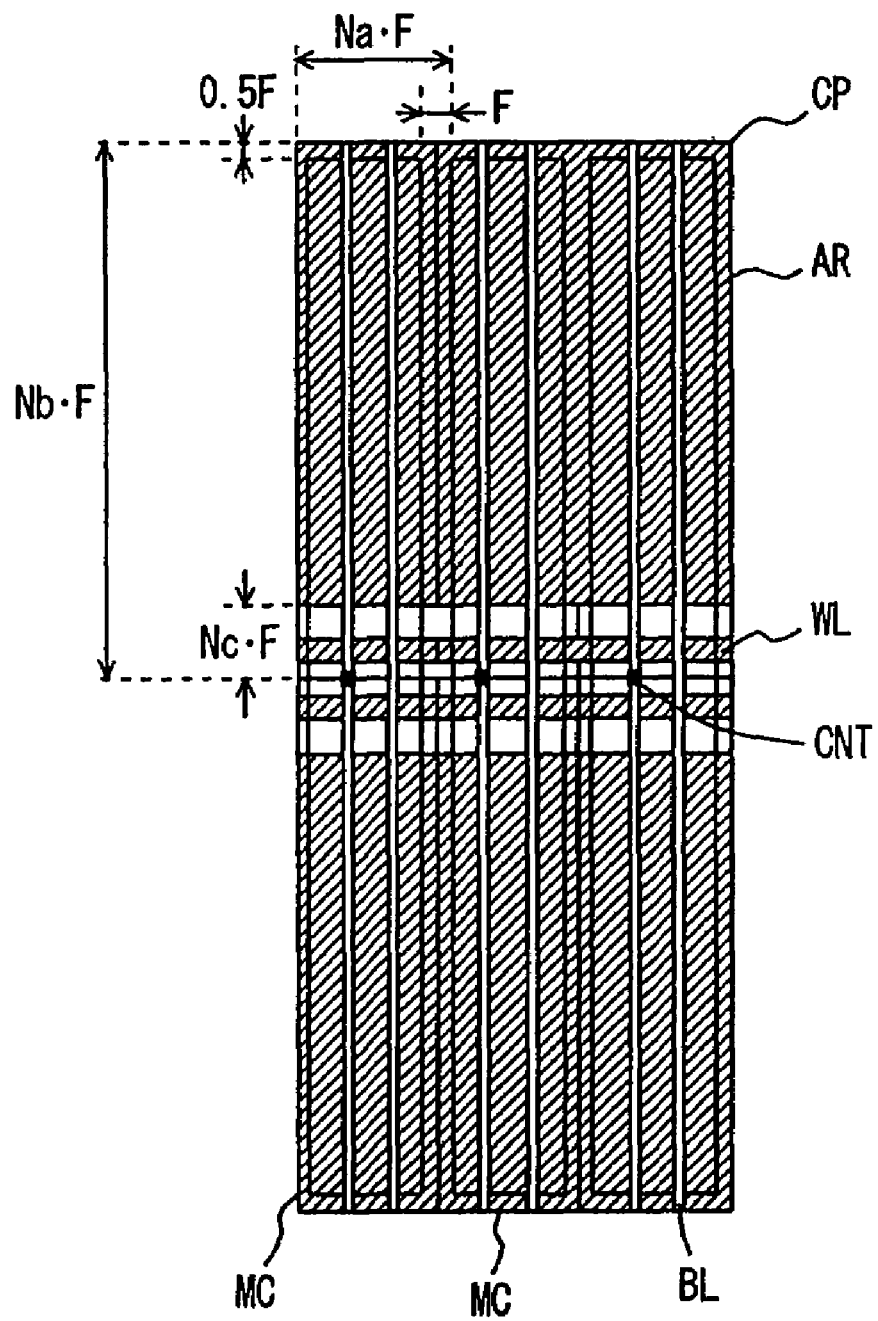

F I G. 1 9
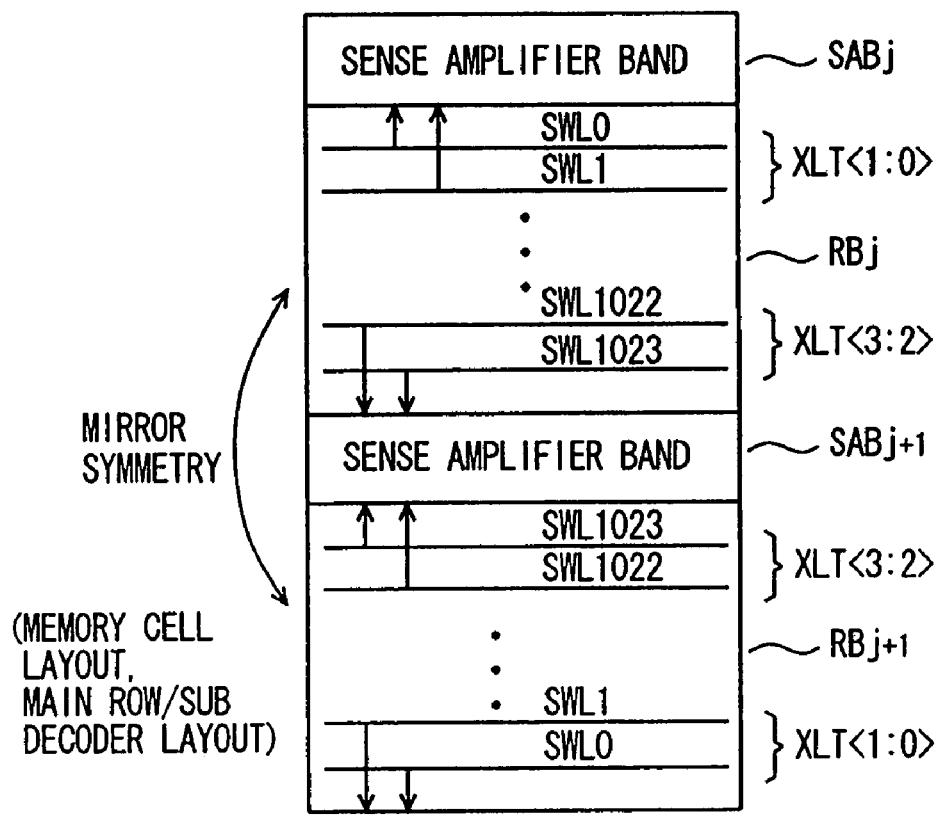
F I G. 2 0
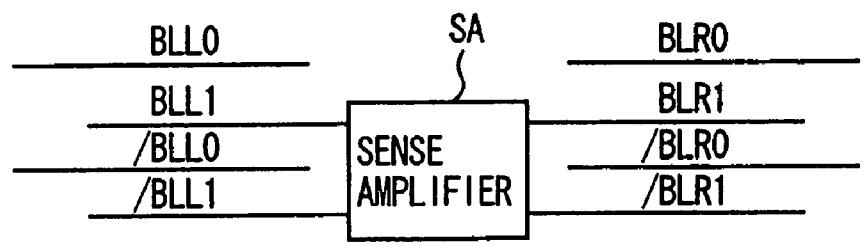

SEMICONDUCTOR MEMORY DEVICE

This application is a Continuation of application Ser. No. 11/397,811, filed on Apr. 5, 2006, now U.S. Pat. No. 7,248,495, which is a Continuation of U.S. application Ser. No. 10/922,936, filed on Aug. 23, 2004, now U.S. Pat. No. 7,046,543, which is a Continuation of U.S. application Ser. No. 10/119,094, filed on Apr. 10, 2002, now U.S. Pat No. 6,785,157, which in turn claims the benefit of Japanese Application No. 2001-151084, filed on May 21, 2001, Japanese Application No. 2001-208431, filed on Jul. 9, 2001, and Japanese Application No. 2001-294441, filed on Sep. 26, 2001, the disclosures of which Applications are incorporated by reference herein.

BACKGROUND OF THE INVENTION

1. Field of the Invention

The present invention relates to a semiconductor memory device, and particularly to a semiconductor memory device having memory cells storing data in capacitors.

2. Description of the Background Art

In a data processing field and the like, a circuit device called a system LSI (large-scale integrated circuit), wherein a memory device and a logic such as a processor are integrated in the same semiconductor chip, has been widely used in order to process data at a high speed with low power consumption. In the system LSI, the logic and the memory device are interconnected through on-chip interconnect lines. Therefore, the system LSI has the following advantages: (1) since the load of the signal interconnection lines is smaller than that of on-board interconnection lines, data/signals can be transmitted at a high speed; (2) since the number of pin terminals is not limited, the number of data bits can be made large so that the band width in transmitting data can be widened; (3) since the constituent elements are integrated on the semiconductor chip, the system scale can be reduced to implement a down-sized and light system, as compared to the configuration wherein discrete elements are arranged on a board; and (4) a macro prepared as a library can be arranged as a component formed on a semiconductor chip, and the efficiency of design is improved.

For the above-mentioned reasons, system LSIs are widely used in various fields. As a memory device to be integrated in the system LSI, there are used a DRAM (dynamic random access memory), an SRAM (static random access memory), and a flash type EEPROM (electrically erasable read only memory). As the logic, a processor for performing control and processing, an analogue processing circuit such as an A/D converting circuit, a logic circuit for performing a dedicated logic processing and such are used.

In the case that a processor and a memory device are integrated in a system LSI, in order to reduce the number of manufacturing steps and costs, these logic and memory device should be formed in the common manufacturing steps as long as possible. In a DRAM, data are stored in as capacitor in an electrical charge form. This capacitor has electrodes, called a cell plate electrode and a storage node electrode, on a semiconductor substrate region. The structure of this capacitor has a complicated shape, such as a hollow cylindrical shape, in order to reduce the occupancy area of the capacitor and to increase the capacitance thereof as far as possible. With a DRAM and logic mixed process for forming a DRAM and a logic in the same manufacturing steps, transistors of the logic and those of the DRAM are formed in the same manufacturing steps. However, it becomes necessary to carry out a manufacturing step for forming capacitors of the DRAM, and a flattening step for reducing a step height between the DRAM and the logic or between the memory array of the DRAM and the peripheral circuitry thereof, wherein the step height is caused based on the three-dimensional structure of the capacitors of the DRAM. Thus, problems that the number of manufacturing steps increases significantly and chip costs increases are caused.

In an SRAM, its memory cell is composed of 4 transistors and 2 load elements. These load elements are usually formed of MOS transistors (insulated gate field effect transistors), but are not formed of capacitors or the like. Therefore, the SRAM can be formed through a full CMOS logic process. That is, the SRAM and a logic can be formed in the same manufacturing steps. An SRAM has been used, for example, for a register file memory and a cache memory for a processor because of the high speed operability thereof and others.

In an SRAM, its memory cell is a flip-flop circuit. Thus, so far as a power supply voltage is supplied to the SRAM, data are held therein. Therefore, the SRAM does not require any refreshing for holding data, unlike a DRAM. Accordingly, the SRAM does not require any complicated memory control associated with the refreshing which is indispensable for the DRAM. For the SRAM, therefore, control is made simpler than for the DRAM. Thus, the SRAM is widely used as a main memory in order to simplify the system structure of a portable information terminal and such.

However, in portable information terminals, a larger quantity of data such as voice data and image data must be handled with a recent improvement in functions thereof. Thus, a memory having a large memory capacity is strongly required.

Concerning DRAM, the size thereof is being shrunk (is being miniaturized) as the miniaturizing process is being developed. For example, in a 0.18-μm DRAM process, a cell size of 0.3 square μm is achieved. On the other hand, in SRAMs, their full CMOS memory cell is composed of 2 P channel MOS transistors and 4 N channel MOS transistors, that is, 6 MOS transistors as a whole. Even if the shrinking process advances, it is necessary to isolate an N well for forming the P channel MOS transistors in a memory cell from a P well for forming the N channel MOS transistors thereof Because of a restriction due to separation distance between the wells and others, the shrinking of the memory size in SRAMs advances less than in DRAM. For example, the memory size of an SRAM with a 0.18-μm CMOS logic process is about 7 square μm, and is about 20 times greater than the memory size of DRAM. Thus, when an SRAM is used as a main memory having a large memory capacity, the size of the chip becomes very large. Accordingly, it is very difficult to merge an SRAM having a memory capacity of 4 M bits or more with a logic in a system LSI having a restricted chip area.

SUMMARY OF THE INVENTION

An object of the present invention is to provide a semiconductor memory device having a small occupancy area and making it possible to achieve a large memory capacity without increasing the number of manufacturing steps significantly.

Another object of the present invention is to provide a semiconductor memory device which has an array configuration of a small occupancy area and can be produced with a process similar to a CMOS process.

A further object of the present invention is to provide a semiconductor memory device having a memory cell configuration which has a small occupancy area and is suitable for a CMOS production process.

A still further object of the present invention is to provide a semiconductor memory device having a memory cell configuration which has a small occupancy area and is based on DRAM cells.

A semiconductor memory device according to a first aspect of the present invention includes memory cells arranged in row and columns and each including a capacitor having a cell plate electrode receiving a reference voltage and a storage electrode for accumulating electric charges according to storage data; and word lines arranged corresponding to the rows of memory cells and each connecting to the memory cell in the corresponding row. These word lines are formed in the same interconnecting layer as the cell plate electrodes.

The semiconductor memory device according to the first aspect of the present invention further includes bit lines arranged corresponding to the columns of memory cells, and each connecting to the memory cells in the corresponding column; and a row selecting circuit for selecting an addressed word line from the word lines in accordance with an address signal. The bit lines are arranged in pairs, and the memory cells are arranged such that data in the selected memory cells are simultaneously read out onto the bit lines in a pair by a selected word line.

A semiconductor memory device according to a second aspect of the present invention includes memory cells arranged in rows and columns. Each of the memory cells includes a capacitor having a cell plate electrode receiving a reference voltage and a storage electrode for accumulating electric charges according to storage data.

The semiconductor memory device according to the second aspect of the present invention further includes word lines arranged corresponding to rows of the memory cells and each connecting to the memory cells on a corresponding row. These word lines include an interconnection line formed as the same interconnecting layer of the cell plate electrode. The cell plate electrodes and the word lines are arranged in pairs.

The semiconductor memory device according to the second aspect of the present invention further includes a cell plate voltage control circuit for changing the cell plate electrode voltage from this reference voltage level after data are read out from the memory cell in an access period of a memory cell, and returning the cell plate electrode voltage to the reference voltage level when the access cycle is completed.

A semiconductor memory device according to a third aspect of the present invention includes memory cells arranged in rows and columns. Each of the memory cells includes a capacitor having a cell plate electrode receiving a reference voltage and a storage electrode for accumulating electric charges according to storage data.

The semiconductor memory device of the third aspect of the present invention further includes word lines arranged corresponding to the rows of memory cells and each connecting to the memory cells on a corresponding row. Each of the word lines includes an interconnection line formed in an interconnection layer lower than and different from an interconnection layer of the cell plate electrodes.

The semiconductor memory device of the third aspect of the present invention further includes bit lines arranged corresponding to the columns of memory cells and each connecting to the memory cells in the corresponding column. These bit lines are formed in a layer above the word lines and the cell plate electrodes. A contact is shared between two memory cells aligned in the column direction, and the memory cells adjacent in the row direction are simultaneously connected to the corresponding bit lines. The memory cells connected to a pair of the bit lines adjacent to each other constitute a unit for storing 1-bit data.

A semiconductor memory device according to a fourth aspect of the present invention includes memory cells arranged in rows and columns. Each of the memory cells includes a capacitor having a cell plate electrode receiving a reference voltage and a storage electrode for accumulating electric charges according to storage data.

The semiconductor memory device according to the fourth aspect of the present invention further includes word lines arranged corresponding to the rows of memory cells and each connecting to the memory cells in the corresponding row. Each of the word lines includes an interconnection line formed in a lower first interconnection layer that is different from an interconnecting layer of the cell plate electrodes. The cell plate electrodes include an interconnection line formed in a second interconnection layer above the first interconnection layer.

The semiconductor memory device according to the fourth aspect of the present invention further includes bit lines arranged corresponding to the columns of memory cells and each connecting to the memory cells in the corresponding column. Each of these bit lines is formed above the word lines and the cell plate electrodes. Units composed of two memory cells are arranged with one column shifted in the column direction, and the bit lines constituting a pair sandwiches a bit line of another bit line pair. The memory cells of a unit are simultaneously connected to the corresponding bit lines of a pair, and a 1-bit data is stored in the memory cells constituting a unit.

A semiconductor memory device according to a fifth aspect of the present invention includes memory cells arranged in row and columns. Each of the memory cells includes a capacitor having a cell plate electrode receiving a reference voltage and a storage electrode for accumulating electric charges according to storage data, and the storage electrode layer is formed facing to the cell plate electrode on a surface of a semiconductor substrate region.

The semiconductor memory device according to the fifth aspect of the present invention further includes word lines arranged corresponding to the rows of memory cells and each connecting to the memory cells in the corresponding row; and a cell plate voltage control circuit for changing the voltage of the cell plate electrodes to a first reference voltage level in synchronization with the transition of a selected word line into a non-select state upon completion of an access cycle for selecting a memory cell, and changing the first reference voltage to a second reference voltage level upon starting of the access cycle.

By forming the word lines connected to the memory cell rows and the cell plate electrodes of the memory cell capacitors at the same interconnecting layer, the projection of the memory capacitors in the upper direction from the substrate can be suppressed. That is, the three-dimensional configuration of the capacitor section can be set into a parallel plate type capacitor. Thus, a step based on the memory cell capacitors can be reduced. Moreover, the word lines and the cell plate electrodes of the memory cell capacitors can be formed by the same manufacturing process. As a result, CMOS process can be used for the manufacturing process of the memory cells, and the memory cell capacitors and the word lines can be formed through the same manufacturing process as that of the logic.

Furthermore, it becomes unnecessary to use a flattening process (planarization process) step for reducing the step height between the logic and the memory. Thus, the number of the manufacturing steps can be reduced.

Additionally, by using DRAM cells as the memory cells, memory cells having a small occupancy area can be achieved. Even in the configuration in which 1-bit data is stored in two DRAM cells, the area of the memory cell unit for storing the 1-bit data can be made far smaller as compared to SRAM. Thus, a semiconductor memory device which has a small occupancy area and is suitable for merging with a logic can be achieved.

By making the word lines and the cell plate electrodes at different interconnection layers, the facing area of each of the cell plate electrodes and the corresponding storage node electrode can be made large. Consequently, the capacitance of the memory cells can be made large and a sufficiently large capacitance can be ensured against shrinking of memory cells.

By changing the cell plate voltage dependently on an operation cycle, it is possible to compensate for a change in the voltage of the storage node according to leakage current. Thus, data-holding characteristics can be improved.

By making the memory cells into the trench isolation configuration and forming the cell plate electrodes, over the insulating film, on the side walls of the trenches, the so-called isolation merged type memory cell capacitors can be realized. In memory cells subjected to shrinking, memory cell capacitors having a sufficiently large capacitance can be implemented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a diagram showing memory cell size and memory cell capacitor size in the first and second embodiments of the present invention;

FIG. 19 is a diagram schematically showing correspondence relationship between sense amplifiers and memory cells in a modification of the third embodiment of the present invention;

FIG. 20 is a diagram schematically showing connection between a sense amplifier in the arrangement shown in FIG. 19 and bit lines;

DESCRIPTION OF THE PREFERRED EMBODIMENTS

First Embodiment

Figure 1:
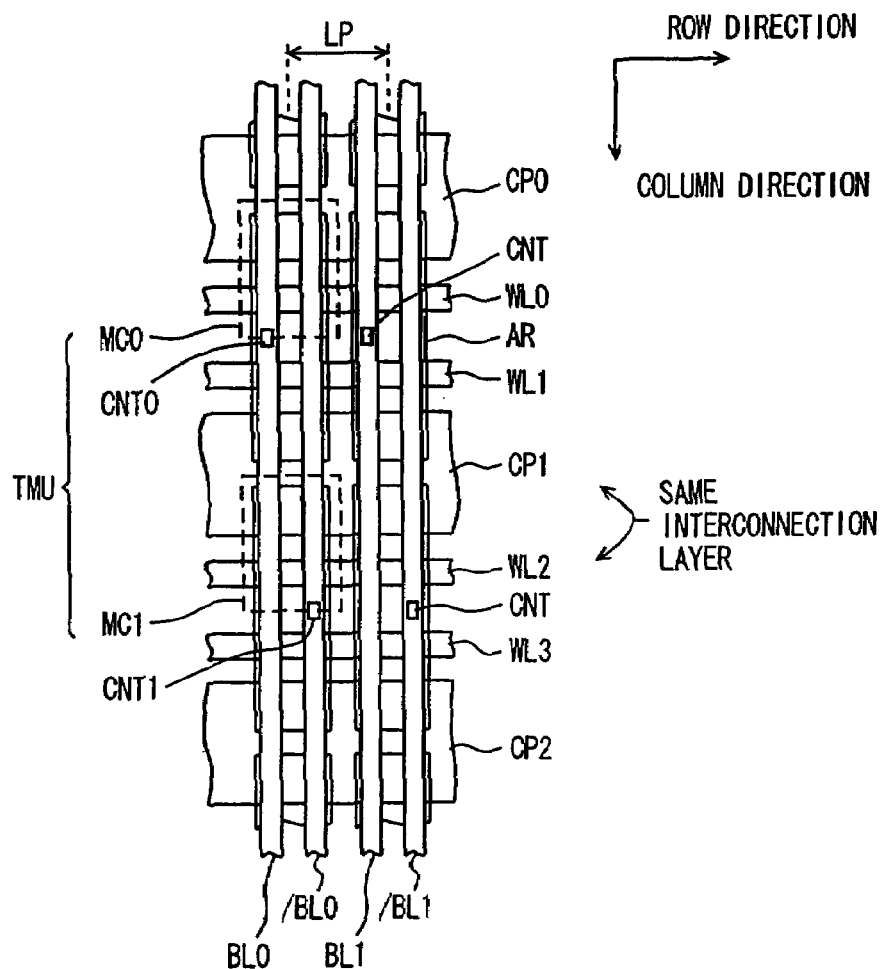
FIG. 1 is a diagram showing a layout of a memory cell array according to a first embodiment of the present invention.

FIG. 1 is a diagram schematically showing the configuration of an array section of a semiconductor memory device according to a first embodiment of the present invention. A layout of memory cells arranged in 4 rows and 2 columns is shown representatively in FIG. 1. In FIG. 1, word lines WL0-WL3 are arranged extending in the row direction. Cell plate electrode lines CP0-CP2 are formed in the same interconnection layer as word lines WL0-WL3 and in parallel to these word lines. Accordingly, cell plate electrode lines CP0-CP2 are arranged such that adjacent cell plate lines sandwich two word lines, and are arranged extending in the row direction in the memory cell array. The cell plate electrode lines adjacent to each other in the column direction are separated from each other by a word line WL arranged in between.

Word line WL0-WL3 are arranged corresponding to memory cell rows, and are connected to the memory cells in corresponding rows.

A constant reference voltage (cell plate voltage) is applied to each of the cell plate electrode lines.

Active areas AR for forming the memory cells are arranged in the column direction in alignment with each other at predetermined intervals. Two memory cells are formed in active area AR. Active area AR crosses two word lines arranged adjacently to each other, and is arranged such that a part of the active area overlaps with the cell plate electrode in a plan view.

Bit lines BL0, /BL0, BL1 and /BL1 are arranged along the column direction in alignment with active areas AR.

Contact CNT for connecting an active area to the bit line is provided between the adjacent word lines (word lines WL0 and WL1, or WL2 and WL3). In FIG. 1, through a contact CNT0, the active area of a memory cell MC0 is connected to a bit line BL0, and through contact CNT1, the active area for forming a memory cell MC1 is connected to bit lines /BL0.

These memory cells MC (MC0 and MC1) have the configuration of a DRAM cell, as will be described in detail later. 1-bit data is stored by memory cells MC0 and MC1. A set of the memory cells for storing 1-bit data is referred to as a twin cell unit MU hereinafter.

Two bit lines are arranged in a pitch (arrangement interval) Lp of the memory cells in the row direction. The memory cell pitch is the distance between center lines of the active areas for forming memory cells adjacent to each other in the row direction.

In the arrangement of the memory cells illustrated in FIG. 1, active area AR is arranged in each row and each column. The memory cells is arranged at each crossing of rows and columns. This arrangement of the memory cells is called "closest packing cell arrangement", and is usually used in an open bit line configuration, which is low in noise immunity. However, By arranging two bit lines in memory cell pitch Lp as illustrated in FIG. 1, it is possible to adopt a "folded bit line configuration", which is high in noise immunity, in the "closest packing cell arrangement". In other words, by selecting the adjacent word lines (for example, word lines WL0 and WL2) with one word line interposed in between simultaneously, complementary data are read out onto bit lines BL0 and /BL0. By amplifying the data differentially, memory data in twin cell unit TMU can be read out.

Figure 2:
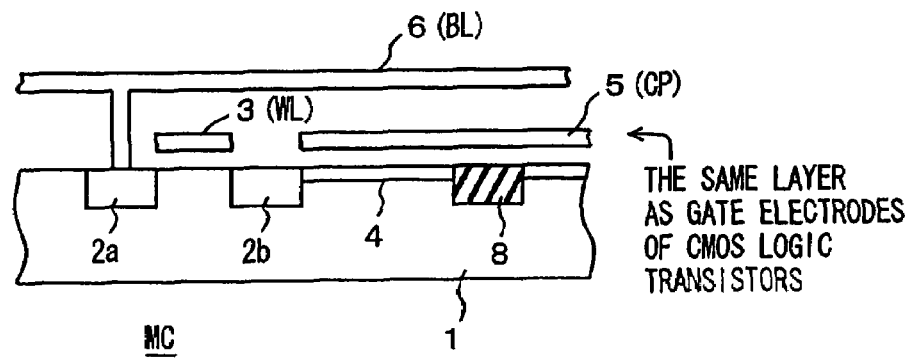
FIG. 2 is a diagram schematically showing a cross sectional structure of the memory cell illustrated in FIG. 1.

FIG. 2 is a diagram schematically showing a cross sectional structure of each of the memory cells in the memory cell arrangement illustrated in FIG. 1. In FIG. 2, memory cell MC includes impurity regions 2a and 2b formed, spaced from each other, on the surface of semiconductor substrate region 1, a conductive layer 3 formed, with a not-shown gate insulating film interposed thereunder, on the surface of the region between impurity regions 2a and 2b, a storage node region 4 connected electrically to impurity region 2b, a conductive layer 5 arranged facing to storage node region 4, and a conductive layer 6 connected electrically to impurity region 2a.

Conductive layer 3 constitutes a word line WL, conductive layer 5 constitutes a cell plate electrode line CP, and conductive layer 6 constitutes a bit line BL. Conductive layer 5 constituting the cell plate electrode is arranged facing the storage node electrode region of the adjacent memory cell across a cell isolation region 8. Storage node region 4 may be merely an inversion layer formed on the surface of semiconductor substrate region 1, or may be an impurity region into which an impurity is implanted and has an inversion layer formed on the surface thereof.

The surface of a cell isolation film formed in cell isolation region 8 is made flat, for example, by CMP (chemical mechanical polishing) process and is made to have substantially the same height as the surface of the substrate region, in order to make the step in the DRAM section as small as possible.

Conductive layers 3 and 5 are made in the same interconnection layer formed of silicon-containing materials, for example, polycrystal silicon into which an impurity is implanted (doped polysilicon), polycides such as tungsten silicide (WSix) or cobalt silicide (CoSix), or salicide (self-aligned silicide). Conductive layers 3 and 5 are formed in the same interconnection layer as gate electrodes of transistors (transistors of the logic and peripheral transistors of the memory device) in a CMOS logic process. The wording "formed in the same interconnection layer" means "produced in the same manufacturing process step".

A gate insulating film and a capacitor insulating film are formed just under conductive layers 3 and 5, respectively. These gate insulating film and capacitor insulating film may be the same insulating film formed in the same manufacturing step. The gate insulating film and capacitor insulating film may be formed by oxide films different in thickness through a dual gate oxide film process. The "dual gate oxide film process" is a process in which two kinds of oxide films (insulating films) different in thickness are formed through selective etching of the oxide films.

Conductive film 6 constituting bit line BL is made of a first metal interconnection layer, and is formed above cell plate CP so that the so-called CUB (capacitor under bit line) configuration is achieved.

The memory cell capacitor has a planar type capacitor structure, and the storage node electrode is formed of a storage node electrode layer made of, for example, a diffusion layer at the surface of semiconductor substrate region 1, or an inversion layer formed at the surface of semiconductor substrate region 1. The cell plate electrode is formed extending in parallel to the word lines. Since the cell plate electrode line and the word lines are formed in the same interconnection layer through the same manufacturing process step, it is unnecessary to add new layers for the cell plate electrode and the storage node electrode. Thus, the manufacturing process can be made simple.

A step between the memory array section and the peripheral circuit section is not produced because of the planar capacitor structure. Thus, it is unnecessary to introduce a flattening (planarization) process for reducing this step height, such as CMP (chemical mechanical polishing). Therefore, the memory array can be substantially formed through a CMOS logic process, and the memory cell array can be formed in the same manufacturing steps for forming the transistors of the logic.

When a row is selected, a row active command for directing row selection is applied together with a row address. A (sub) word line pair with one (sub) word line interposed in between (see FIG. 1) is simultaneously selected by degenerating a second least significant bit (RA<1>), for example, in the row address. For example, when word lines WL0 and WL2 are simultaneously selected, memory cells MC0 and MC1 are connected to bit lines BL0 and /BL0, respectively.

Not-shown sense amplifiers are arranged corresponding to the bit line pairs. The sense amplifiers differentially amplify the voltages on the corresponding bit line pairs. Accordingly, complementary data are stored in memory cells MC0 and MC1, that is, an H level data is stored in one of the memory cells and an L level data is stored in the other memory cell. As a result, 1-bit data is stored in twin cell unit TMU.

Figure 3:
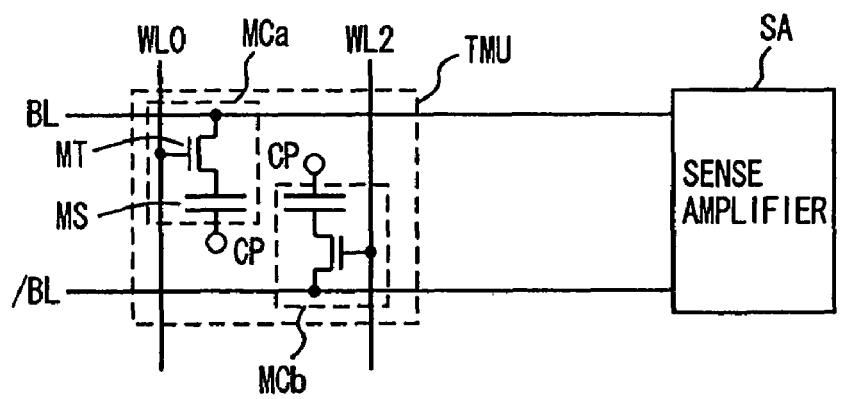
FIG. 3 is a diagram showing connection among a memory cell, a sense amplifier and bit lines in the first embodiment of the present invention.

FIG. 3 is a diagram showing an electrically equivalent circuit of the twin cell unit. In FIG. 3, twin cell unit TMU includes two memory cells MCa and MCb. Memory cell MCa is connected to a bit line BL, and memory cell MCb is connected to a bit line/BL. Each of memory cells MCa and MCb includes a capacitor MS for storing data and an access transistor MT rendered conductive in response to a signal on the corresponding word line and connects the capacitor MS to the corresponding bit line. Access transistor MT is formed of, for example, an N channel MOS transistor.

A sense amplifier SA for amplifying the voltages of bit lines BL and /BL differentially is provided for bit lines BL and /BL.

Upon accessing data, word lines WL0 and WL2 are simultaneously driven into a select state. Responsively, the memory data in memory cell MCa is read out onto bit line BL, and the memory data in memory cell MCb is read out onto bit line /BL. Then, sense amplifier SA is activated to amplify differentially the voltages corresponding to the data transferred onto bit lines BL and /BL.

A voltage (SN, H) and a voltage (SN, L) at the storage nodes of memory cells MC storing the H level data and the L level data are approximately represented by the following expressions:

$$V(SN,H) \approx Vbb + (VCCS - Vbb) \cdot \exp(-T/\tau a), \text{ and}$$

$$V(SN,L) \approx Vbb \cdot (1 - \exp(-T/\tau b)).$$

Vbb is a negative voltage applied to the substrate region of the memory cells. Coefficients τa and τb each are a time constant decided dependently on a leakage current between the storage node and capacitor electrode (cell plate electrode), a leakage current between the storage node and the substrate region, an off leakage current of the memory cell transistors, and others. When memory data in two memory cells are read out onto the bit line pair in a 1-bit/2-cell mode (twin cell mode) in which 1-bit data is stored in the two memory cells (DRAM cells), a read-out voltage difference ΔVb1 of the bit line pair is represented by the following expression:

$$\Delta Vb1 = Cs \cdot (V(SN,H) - V(SN,L))/(Cs + Cb),$$

wherein Cs represents the capacitance of memory cell capacitor MS and Cb represents parasitic capacitance of each of bit lines BL and /BL.

Figure 4A:
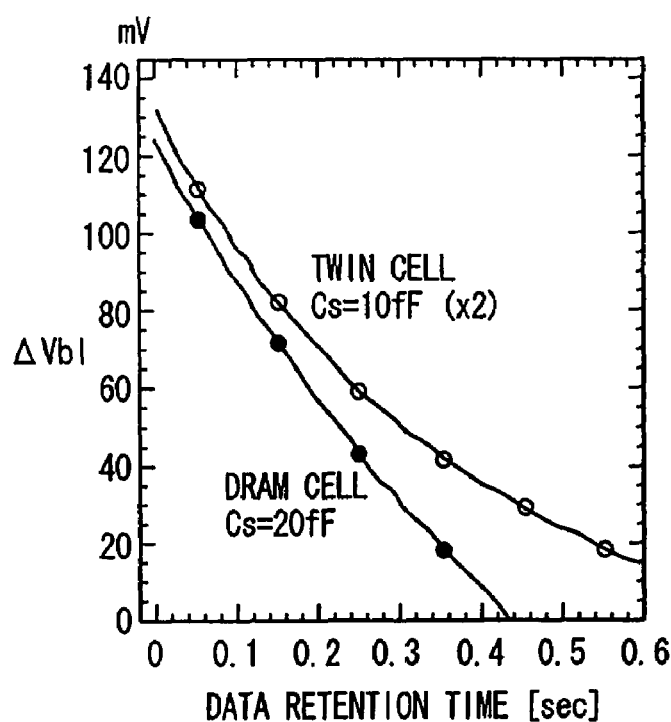
FIG. 4A is a graph showing the charge retention characteristics of the memory cell according to the first embodiment of the present invention.

FIG. 4A is a graph representing a simulation result of a relationship (that is, a relationship between the read-out voltage difference between the bit line pair and data retention time) in a conventional DRAM cell and the twin cell unit. In FIG. 4A, a vertical axis represents the bit line read-out voltage difference and a transverse axis represents the data holding time.

In the DRAM cell (memory cell), the capacitance Cs of the memory cell capacitor is 20 fF. On the other hand, for the twin cell unit, two capacitors Cs each having a capacitance of 10 fF are used.

Figure 4B:
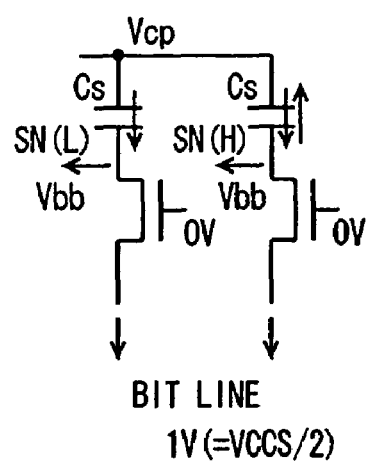
FIG. 4B is a diagram showing an electrically equivalent circuit of the memory cells exhibiting the charge retention characteristics shown in FIG. 4A.

As shown in FIG. 4B, in a storage node SN(L) storing an L level data, there are a leakage current from the cell plate cell, a leakage current to the substrate region, and a leakage current flowing through the access transistor to the corresponding bit line. On the other hand, in a storage node SN(H) storing an H level data, there are a leakage current between the storage node and the cell plate electrode, a leakage current to the substrate region, and a leakage current flowing through the access transistor to the corresponding bit line. A precharge voltage for the bit line is 1 V.

In the case that simulation is performed under conditions of the leakage currents represented in FIG. 4B, the twin cell unit has a difference in read-out voltage ΔVb1 greater than that of the DRAM cell as the data-holding time elapses. It can be understood that as the minimum voltage difference (sense sensitivity) between the bit line pair which the sense amplifier can normally amplify differentially is smaller, the data retention characteristics of the twin cell unit is better than that of the DRAM cell. Therefore, in the case that the capacitance of the memory cell capacitor is smaller than the capacitance of the standard DRAM cell, the data retention characteristics can be reliably maintained by storing data in the twin cell mode. Thus, it is possible to achieve a memory cell which occupies a small area and is superior in data retention characteristics.

Figure 5:
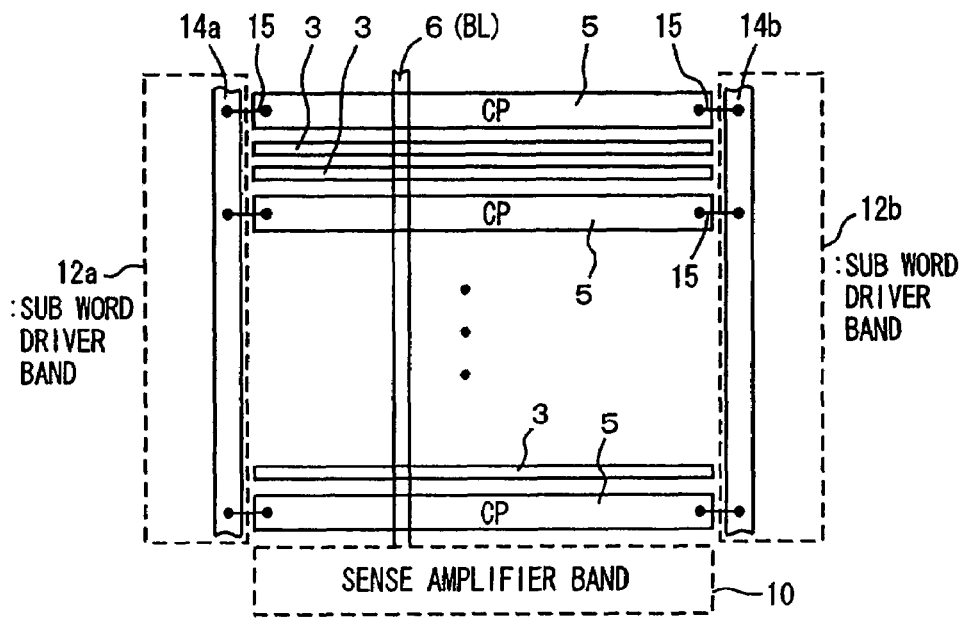
FIG. 5 is a diagram schematically showing the configuration of cell plate electrodes in the first embodiment of the present invention.

FIG. 5 is a diagram schematically showing the arrangement of the cell plate electrode lines in the first embodiment of the present invention. FIG. 5 shows an arrangement of the cell plate electrode lines for one memory sub array, which is an arrangement unit of sub word lines in a hierarchical word line configuration. A conductive layer 5 to be cell plate electrode lines CP and conductive layer 3 to be (sub) word lines are arranged, in the same interconnection layer, extending in the row direction and in parallel with each other. Sub word driver bands 12a and 12b including sub word drivers for driving the (sub) word lines are arranged at both sides of this memory sub array. It is supposed that the word lines are arranged in a hierarchical word line configuration of the main word lines and the sub word lines. The sub word lines will be referred to as word lines hereinafter.

In sub word driver bands 12a and 12b, conductive lines 14a and 14b made of the same first level interconnection layer as the conductive layer 6 to be bit line BL, for example, are arranged. Each of conductive layers 14a and 14b is connected through a contact 15 to cell plate electrode conductive layer 5. Conductive layer 6 to be bit line BL is connected to the sense amplifier included in a sense amplifier band 10.

By arranging conductive lines 14a and 14b for transmitting the cell plate voltage in sub word driver bands 12a and 12b, the cell plate voltage at a stable and necessary voltage level can be supplied even if cell plate electrode lines CP are separated from each other in the column direction in the memory cell array.

Figure 6:
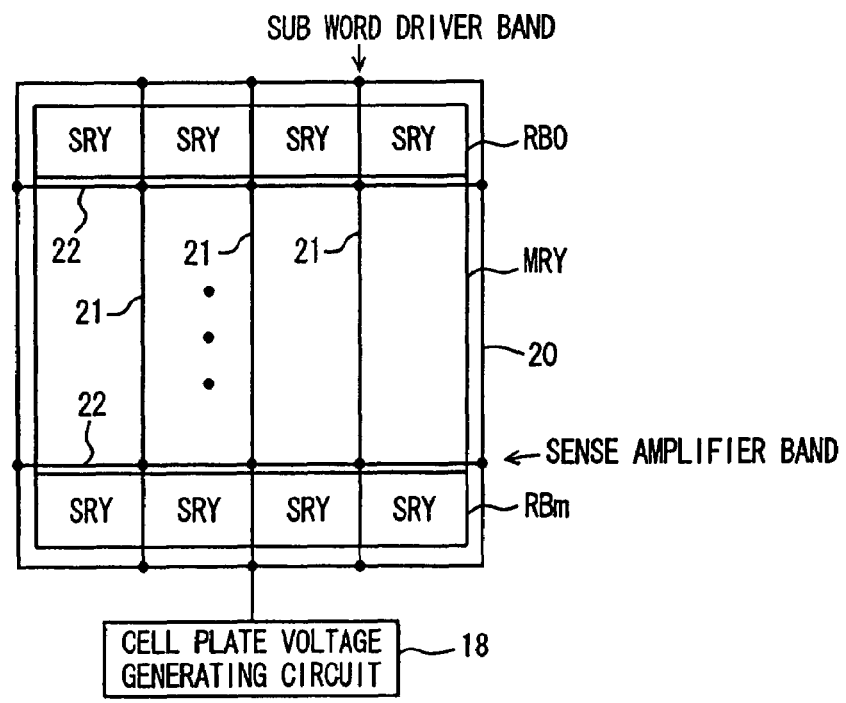
FIG. 6 is a diagram schematically showing the arrangement of the whole of the cell plate electrodes in the first embodiment of the present invention.

FIG. 6 is a diagram schematically showing the arrangement of the whole of the cell plate electrode lines. In FIG. 6, a cell plate voltage line 20 for transmitting the cell plate voltage from a cell plate voltage generating circuit 18 is provided along the outer circumference of a memory array MRY. Memory array MRY is divided into plural row block RB0-RBm. Each of row blocks RB0-RBm is divided into plural memory sub arrays SRY by the sub word driver bands. The arrangement of the cell plate lines is provided to memory sub arrays SRY, as shown in FIG. 5.

In the sense amplifier bands between row blocks RB0-RBm, cell plate voltage transmitting lines 22 are provided along the row direction. In the sub word driver bands between the memory sub arrays, cell plate voltage transmitting lines 21 are provided along the column direction. Cell plate voltage transmitting lines 20, 21 and 22 are interconnected at crossings thereof. Cell plate voltage transmitting lines 21 and 22 are connected to cell plate electrode lines CP in memory sub arrays SRY.

As shown in FIG. 6, the cell plate voltage transmitting lines arranged in a meshed shape on memory array MRY are used to transmit the cell plate voltage from cell plate voltage generating circuit 18 to cell plate electrode lines CP inside the memory sub arrays SRY. The cell plate voltage can be stably supplied to cell plate electrode lines CP arranged in the divided line configuration.

Cell plate voltage transmitting lines 21 and 22 arranged in memory array MRY may be formed in the same interconnecting layer as bit lines BL.

As described above, according to the first embodiment of the present invention, DRAM cells are used as memory cells, word lines and cell plate electrodes are formed in the same interconnection layer, and memory cell capacitors having a planar capacitor configuration is use for the memory cell capacitor. Thus, the following advantages are achieved: manufacturing process steps exclusively for forming a cell plate electrode layer become unnecessary; a step between a memory cell array section and a peripheral circuit section can be reduced so that process steps exclusively for reducing the step height become unnecessary; and the memory cell array section can be substantially manufactured according to a CMOS process. Thus, the memory cell array can be formed through the same process for manufacturing logic transistors.

Second Embodiment

Figure 7:
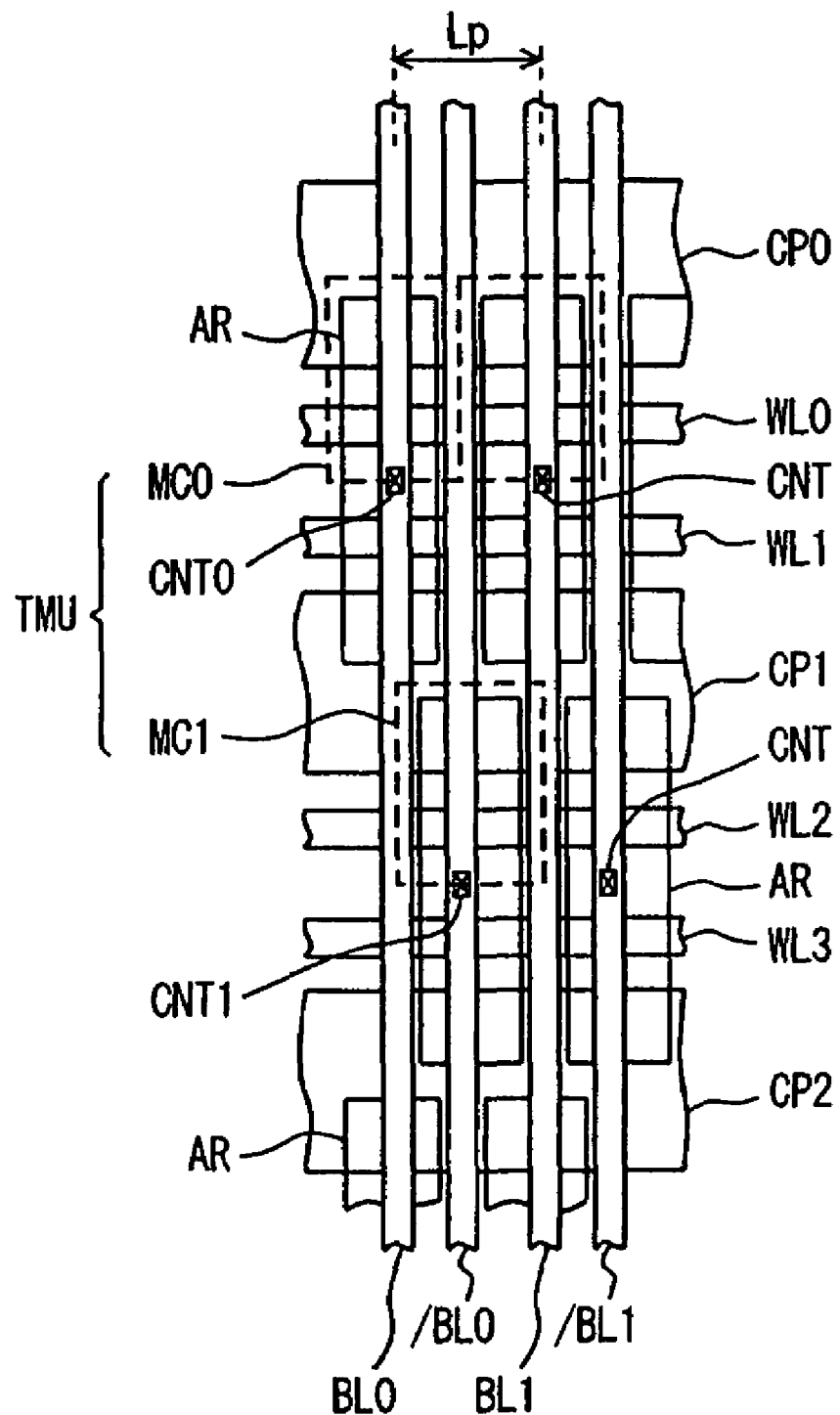
FIG. 7 is a diagram showing a layout of a memory cell array in a second embodiment of the present invention.

FIG. 7 is a diagram schematically showing a layout of a memory array according to a second embodiment of the present invention. In the layout illustrated in FIG. 7, active areas AR for forming memory cells are arranged in a staggered arrangement in the column direction such that active areas AR are shifted by ½ of pitch Lp of the memory cells in the row direction. The other configurations are the same as in the layout illustrated in FIG. 1. Therefore, in the arrangement of the memory cells illustrated in FIG. 7, with the two memory cells adjacent in the column direction being one unit, and a plurality of the memory cell layout units are arranged in the column direction with the pitch of the one bit line deviated. Two bit lines BL (BL0-/BL1) are arranged in pitch LP in the row direction of the memory cells.

Upon selecting memory cells, two word lines, for example, word lines WL0 and WL2 are simultaneously selected. Storage data in a memory cell MC0 is read out onto bit line BL0 through a contact CN0, and storage data in a memory cell MC1 is read out onto bit line /BL0 through a contact CNT1. Therefore, upon reading out data in the twin cell mode, bit lines BL0 and/BL0 form a pair, and bit lines BL1 and /BL1 form a pair. Complementary data are read out onto the bit lines in a pair, and the voltages on the bit lines in a pair are differentially amplified by the corresponding sense amplifier. Thus, a folded bit line configuration can be achieved.

In folded bit line configuration for the memory cells in a conventional DRAM, the size ratio between length and width thereof is generally about 2:1. An 8 F2 cell having a width of 2 F and a length of 4 F is generally adopted, wherein F is a value called a feature size (geometrical dimension) of design and is a value of a design standard (minimum dimension) plus a margin for overlap in a transfer step in a photolithography process in the manufacturing of the memory cells, and others.

FIG. 8 is a diagram showing the size of the memory cell in the arrangement of the memory cells as shown in FIG. 7. FIG. 8 illustrates three active areas AR arranged in alignment in the row direction. The distance between active areas AR in the row direction is the feature size F. Pitch LP in the row direction of memory cells MC is represented by Na·F. Active areas AR adjacent in the column direction are spaced apart from each other by the feature size F. The distance between one end of cell plate electrode line CP and the end of active area AR is 0.5 F.

The distance between bit line contact CNT and the other end of cell plate electrode line CP is represented by Nc·F, and the size of memory cell MC in the column direction is represented by Nb·F. In this case, the area Scap of a planar capacitor is represented by the following expression:

$$Scap=(Na·F-F)·(Nb·F-Nc·F-0.5 F)$$

The size (area) Scell of memory cell MC is represented by the following expression:

$$Scell=Na·F·Nb·F$$

For the capacitor area Scap required for ensuring a capacitance Cs necessary for storing data stably, memory cell making the memory cell size Scell minimum can be implemented by making the ratio between length and width (Nb:Na) sufficiently larger than 2:1 of conventional DRAM.

Even if pitch Lp of the memory cells in the word line direction is small, bit line contacts CNT can be regularly formed on active areas AR by arranging active areas AR to be shifted by one bit line pitch as illustrated in FIG. 7. Thus, the bit line contacts can easily be laid out. In the case of the first embodiment, a contrivance of layout is necessary in order to arrange the bit line contacts in active areas AR narrow in the row direction since two bit lines are similarly arranged in alignment with active areas AR.

Therefore, by arranging active areas AR in the column direction to be shifted by ½ of memory cell pitch Lp in the row direction in the configuration in which two bit lines are arranged between the pitches in the row direction of the memory cells, the bit line contacts can be constantly arranged in alignment with active areas AR. Thus, the bit line contacts can easily be laid out.

Third Embodiment

Figure 9:
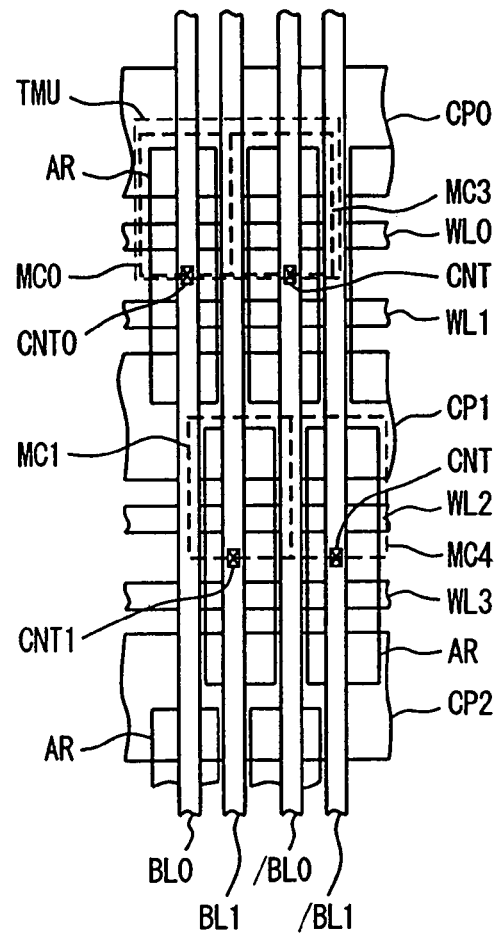
FIG. 9 is a diagram showing a layout of a memory cell array according to a third embodiment of the present invention.

FIG. 9 is a diagram schematically showing a layout of a memory array according to a third embodiment of the present invention. The layout of memory cells illustrated in FIG. 9 is the same as the layout of the memory array illustrated in FIG. 7. In the configuration illustrated in FIG. 9, adjacent bit lines do not constitute a bit line pair. A bit line pair is provided by two bit lines with one bit line interposed in between. Upon selection of a word, one of word lines is selected. Therefore, memory cells MC0 and MC3 constitute a twin cell unit TMU, and memory cells MC1 and, MC4 constitute another twin cell unit. The other configurations are the same as in FIG. 7. The same reference numerals are allotted to the corresponding components, and detailed explanation thereof is omitted.

In the configuration as illustrated in FIG. 9, one of the word lines is selected, but two word lines do not need to be selected. Thus, current consumption can be reduced.

A bit line onto which no memory cell data is read out is arranged between a bit line pair onto which memory cell data are read out. Therefore, by maintaining the bit line pair onto which no memory cell data are read (non-selected bit line pair) at a precharge voltage level, the bit lines of this non-select bit line pair can be used as shielding interconnect lines. Thus, capacitive coupling noise between bit lines can be suppressed further. Moreover, with memory cells each having a CUB configuration, the arrangement having an immunity (that is, resistance against the above-mentioned capacitive coupling noise). which is as large as that of a COB (capacitor over bit line) configuration, can be achieved.

Figure 10:
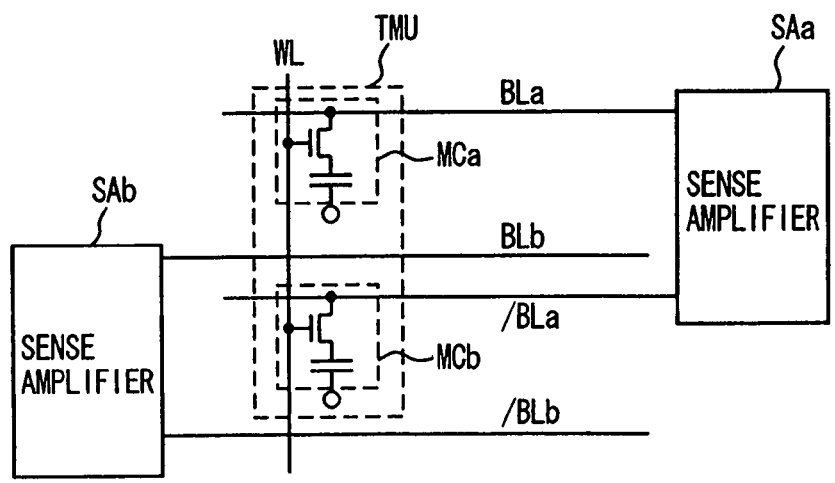
FIG. 10 is a diagram showing an electrically equivalent circuit of the memory cells shown in FIG. 9.

FIG. 10 is a diagram schematically showing a main portion of the third embodiment of the present invention. In FIG. 10, a memory cell MCa is arranged corresponding to a crossing of a word line WL and a bit line BLa, and a memory cell MCb is arranged corresponding to a crossing of word line WL and a bit line /BLa. A bit line BLb is arranged between bit lines BLa and /BLa, and bit line /BLa is arranged between bit lines BLb and /BLb. Bit lines BLa and /BLa are connected to a sense amplifier SAa, and bit lines BLb and /BLb are connected to a sense amplifier SAb. Sense amplifiers SAa and SAb are alternately arranged at both sides of the bit lines.

When word line WL is selected in the arrangement as shown in FIG. 10, data in memory cells MCa and MCb are read out onto bit lines BLa and /BLa. No memory cell data are read out onto lint lines BLb and /BLb. In this state, by a not shown bit line precharge/equalize circuit, bit lines BLb and /BLb are held at a predetermined precharge voltage level and sense amplifier SAa is maintained in a non-active state. Sense amplifier SAa is activated to amplify data in a twin cell unit TMU composed of memory cells MCa and MCb.

Figure 11:
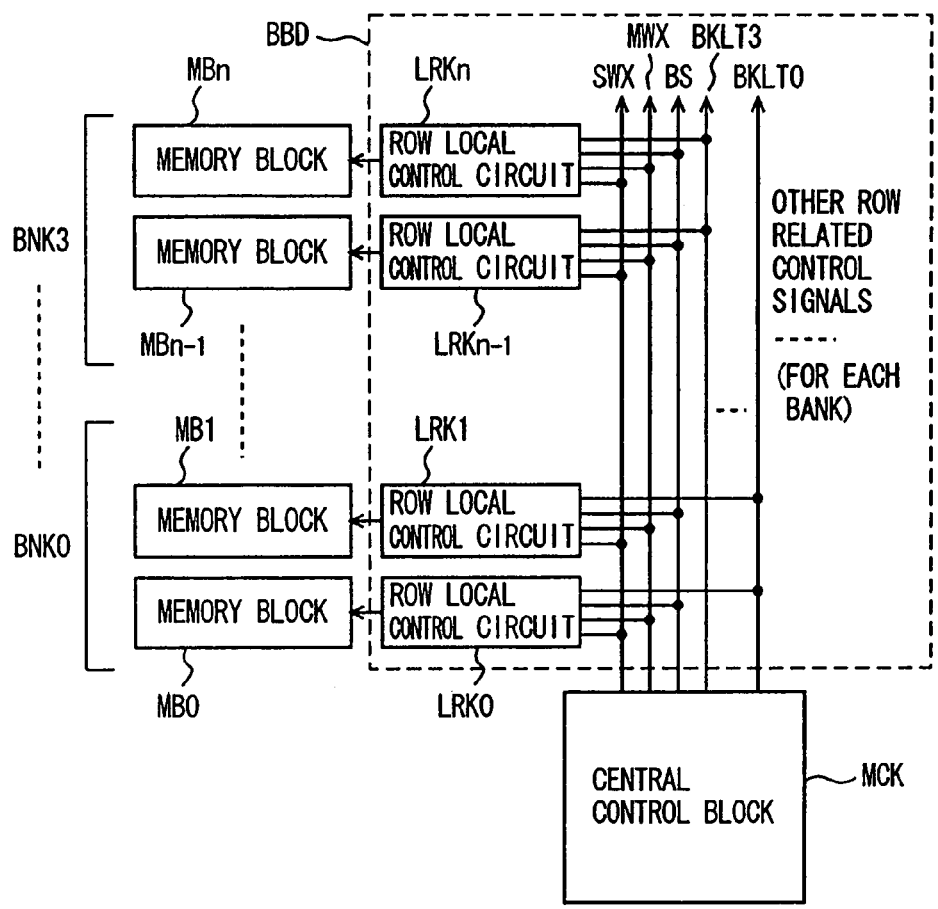
FIG. 11 is a diagram schematically showing the configuration of the whole of a semiconductor memory device according to the third embodiment of the present invention.

FIG. 11 is a diagram schematically showing the configuration of the whole of a semiconductor memory device according to the third embodiment of the present invention. In FIG. 11, a memory array is divided into plural memory blocks MB0-MBn. Each of memory blocks MB0-MBn includes memory cells arranged in rows and columns, sense amplifiers, a sub word driver band in which sub word drivers for selecting a sub word line are arranged. Blocks MB0-MBn are divided into banks BNK0-BNK3 for each predetermined number of the blocks. In a backbone band BBD, row local control circuits LRK0-LRKn are arranged corresponding to memory blocks MB0-MBn, respectively. A main control signal and a bank designating signal from central control block MCK are transmitted through backbone band BBD to row local control circuits LRK0-LRKn.

In FIG. 11, the signals transmitted through backbone band BBD from central control block MCK, include bank designating signals BKLT0-BKLT3, a block selecting signal BS for selecting a memory block in each of the banks, a pre-decoded signal MWX for selecting a main word line, and a sub word line pre-decoded signal SWX for selecting a sub word line. Other row related control signals, such as a main sense amplifier activating signal for activating a sense amplifier, are generated from central control block MCK and transmitted through backbone band BBD.

When a command related to row selection is externally supplied to central control block MCK, a main control signal and block selecting signal BS for selecting a row is generated. In this case, in central control block MCK, other row related control signals, such as the sense amplifier activating signal, are generated for the individual banks in accordance with a bank address for designating a selected bank.

In the arrangement as shown in FIG. 11, row local control circuits LRK0-LRKn are selectively activated in accordance with the row related control signals and block selecting signal BS for individual banks from central control block MCK, so as to perform operation related to row selection in a corresponding memory block.

Figure 12:
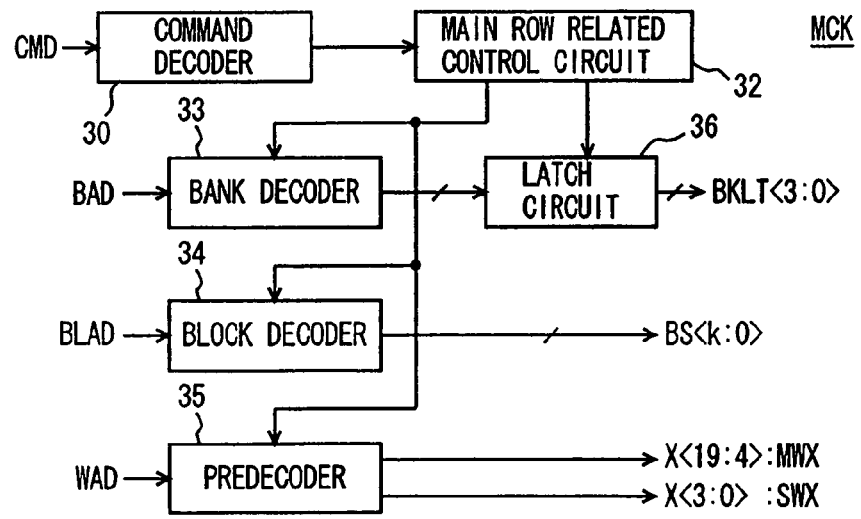
FIG. 12 is a diagram schematically showing the configuration of a central control block shown in FIG. 11.

FIG. 12 is a diagram schematically showing the configuration of central control block MCK as shown in FIG. 11. In FIG. 12, central control block MCK includes a command decoder 30 for decoding a command CMD for instructing an operation mode and generating an operation mode instructing signal in accordance with the decode result, a main row related control circuit 32 for generating a control signal related to row selection in accordance with the operation mode instructing signal from command decoder 30, a bank decoder 33 activated in accordance with an output signal from main row related control circuit 32 to decode a bank address signal BAD, a block decoder 34 activated in accordance with the output signal from main row control circuit 32 to decode a block address signal BLAD for generating block selecting signals BS<k:0>, a pre-decoder 35 activated under control of the output signals from main row control circuit 32 to pre-decode a word line address signal WAD and generate pre-decode signals MWX (=X<19:4>) for selecting a main word line and pre-decode signals SWX (=X<3:0>) for selecting a sub word line, and a latch circuit 36 for latching an output from bank decoder 33 in accordance with the output signal from main row related control circuit 32 to generate bank designating signals BKLT<3:0>.

Latch circuit 36 includes latch circuits (flip-flop) arranged corresponding to banks BNK0-BNK3, and holds a bank designating signal BKLTi in an active state during the time when the corresponding bank is selected.

Main row related control circuit 32 also generates a row related control signal for each bank in accordance with the output signal from command decoder 30. Pre-decode signals X<19:4> (=MWX) outputted from pre-decoder 35 is divided into groups each having a predetermined number of pre-decode signals. In accordance with a pre-decode signal from each of the groups, a main word line out of 256 main words is designated. In accordance with pre-decode signals X<3:0> (=SWX), one sub word line out of four sub word lines is selected. In other words, a 4-way hierarchical word line configuration, in which 4 sub word lines are arranged for one main word line, is employed in memory blocks MB0-MBn.

Figure 13:
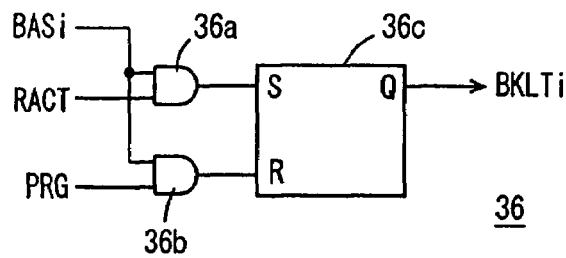
FIG. 13 is a diagram showing an example of the configuration of a latch circuit shown in FIG. 12.

FIG. 13 is a diagram showing an example of the configuration of latch circuit 36 as shown in FIG. 12. FIG. 13 shows the configuration of a latch circuit for a bank BNKi. In FIG. 13, latch circuit 36 includes an AND circuit 36a which receives a row activation instructing signal RACT and a bank designating signal BASi from bank decoder 33 shown in FIG. 12, an AND circuit 36b which receives bank designating signal BASi and a precharge instructing signal PRG, and a flip-flop 36c which is set in response to a rise of an output signal from AND circuit 36a and is reset in response to a rise of an output signal from AND circuit 36b. Bank designating signal BKLTi is outputted from an output Q of flip-flop 36c.

When a row active command instructing selection of a row is applied, row activation instructing signal RACT is outputted from command decoder 30 shown in FIG. 12. When the precharge command for setting a bank into a precharge state is applied, precharge instructing signal PGR is outputted from command decoder 30 shown in FIG. 12. Therefore, bank designating signal BKLTi is kept in a select state during the time when bank BNKi is in a row selecting state.

Figure 14:
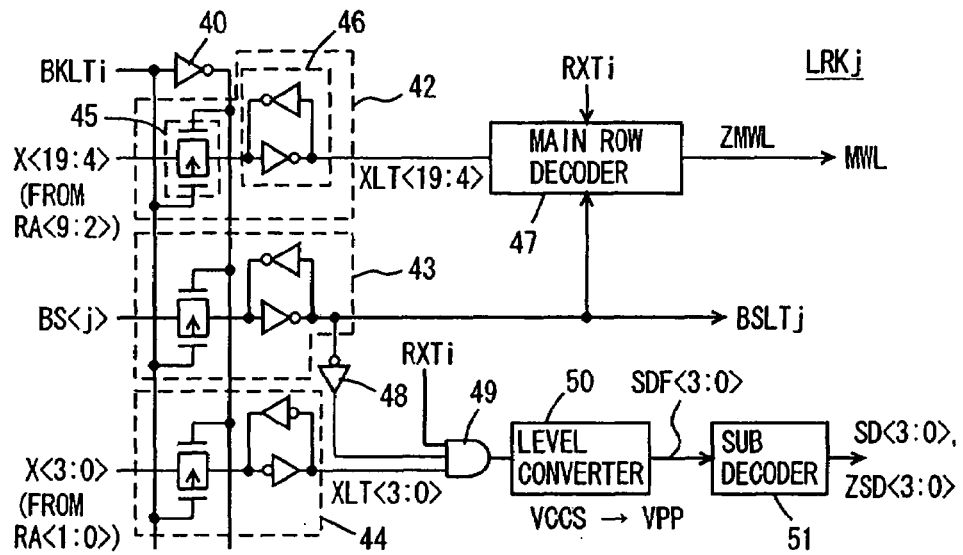
FIG. 14 is a diagram showing an example of the configuration of a row related local control circuit shown in FIG. 12.

FIG. 14 is a diagram schematically showing the configuration of portions related to word line selection in the row local control circuit. In FIG. 14, the configuration of a row local control circuit LRKj for a memory block MBj is representatively shown. Memory block MBj is included in bank BNKi.

In FIG. 14, row local control circuit LRKj includes an inverter 40 receiving latch bank designating signal BKLTi, a L level latch circuit 42 for latching pre-decode signals X<19:4> in accordance with an output signal from inverter 40 and latch bank designating signal BKLTi, a level latch circuit 43 for latching a block selecting signal BS<j> in response to latch bank designating signal BKLTi and the output signal from inverter 40 to generate a latch block selecting signal BSLTj, and a level latch circuit 44 for latching pre-decode signals X<3:0> in accordance with latch bank designating signal BKTLi and the output signal from inverter 40 to generate a latch pre-decode signal XLT<3:0>. Latch circuits 42, 43 and 44 have the same configuration, and in FIG. 14, reference numerals are attached only to components of latch circuit 42.

Level latch circuit 42 includes a transmission gate 45 rendered conductive in response to latch bank designating signal BKLTi and the output signal from inverter 40, and an inverter latch 46 for latching pre-decode signals X<19:4> supplied through transmission gate 45. Inverter latch 46 generates latch pre-decode signals XLT<19:4>.

Furthermore, row local control circuit LRKj includes a main row decoder 47 for decoding latch pre-decoding signals XLT<19:4> and transmitting a main word line driving signal ZMWL on main word line MWL in accordance with a word line activating timing signal RXTi, an inverter 48 receiving latch block selecting signal BSLTj, an AND circuit 49 receiving word line activating timing signal RXTi, the output signal from inverter 48 and latch pre-decode signals XLT<3:0>, a level shifter 50 for converting the level of the output signal from AND circuit 49 to generate sub decode fast signals ZSDF<3:0>, and a sub decoder 51 receiving the output signal from level shifter 50 to generate complementary sub decode signals SD<3:0> and ZSD<3:0>.

Level shifter 50 converts a signal of an amplitude at a peripheral power supply voltage level VCC to a signal of an amplitude at a high voltage level VPP higher than an array power supply voltage VCCS. Sub decoder 51 receives sub decode fast signals ZSDF<3:0> having amplitude VPP from level shifter 50 to generate sub decode signals SD<3:0> having amplitude VPP and complementary sub decoding signals ZSD<3:0> having amplitude VCCS. When a corresponding sub word line is selected, sub decode signal SD turns into an H level (i.e., a high level) of high voltage level VPP and a complementary sub decode signal ZSD turns into an L level (i.e., a low level). Sub decode signals SD<3:0> are generated by inverting sub decode fast signals ZSDF<3:0>.

Word line activating timing signal RXTi attains an H level of the peripheral power supply voltage level when selected, and is supplied from central control block MCK as shown in FIG. 11 to bank BNKi.

When latch bank designating signal BKLTi attains an H level, or a select state, in row local control circuit LRKj shown in FIG. 14, transmission gate 45 is rendered non-conductive in each of level latch circuits 42-44 and level latch circuits 42-44 enter a latching state. When memory block MBj corresponding to row local control circuit LRKj is selected, latch block selecting signal BSLTj attains L level of a select state. On the other hand, when the corresponding memory block MBj is in a non-select state, latch block selecting signal BSLTj is at H level.

When latch block selecting signal BSLTj is in the non-select state, the output signal from inverter 48 is at L level and the output signal from AND circuit 49 is at L level. Thus, all sub decode fast signals ZSDF<3:0> from level shifter 50 are kept in a non-select state (at H level). On the other hand, when latch block selecting signal BSLTj is in the select state, the output signal from inverter 48 attains H level. Moreover, AND circuit 49 supplies latch pre-decode signals XLT<3:0> to level shifter 50 in accordance with word line activating timing signal RXTi.

Level shifter 50 converts the level of latch pre-decode signals XLT<3:0> to generate sub decode fast signals ZSDF<3:0>. One of latch pre-decode signals XLT<3:0> is in a select state and the other latch pre-decode signals XLT<3:0> are in a non-select state. The voltage level of the non-selected latch pre-decode signals is transitions to high voltage level VPP and the selected latch pre-decode signal is driven into L level. Therefore, one of sub decode fast signals ZSD<3:0> is in a select state (at L level).

When word line activating timing signal RXTi is activated at a predetermined timing, main word line driving signal ZMWL from main row decoder 47 is driven in accordance with the decoding result. AND circuit 49 is enabled so that output signals thereof are changed in accordance with latch pre-decode signals XLT<3:0>. A sub word line corresponding to an addressed row is driven into a select state in accordance with sub decode signals SD<3:0> and ZSD<3:0> from sub decoder 51 and main word line driving signal ZMWL from main row decoder 47.

When BNKi is in a non-select state, latch bank designating signal BKLTi is at L level of a non-select state and all of level latch circuits 42-44 are in a conductive state. By transmitting block selecting signals BS<k:0> from central control block MCK to row local control circuits LRKn-LRK0 through backbone band BBD, latch block selecting signal BKLTj is already in a definite state at a decode timing of main row decoder 47 and sub decoder 51. Thus, word line selecting operation can be performed at a faster timing.

Pre-decode signals X<19:4> are generated from row address bits RA<9:2>, and pre-decode signals X<3:0> are generated from row address bits RA<1:0>. Block selecting signal BS<j> is generated from the row address of an appropriate bit number, dependently on the number of memory blocks.

Figure 15:
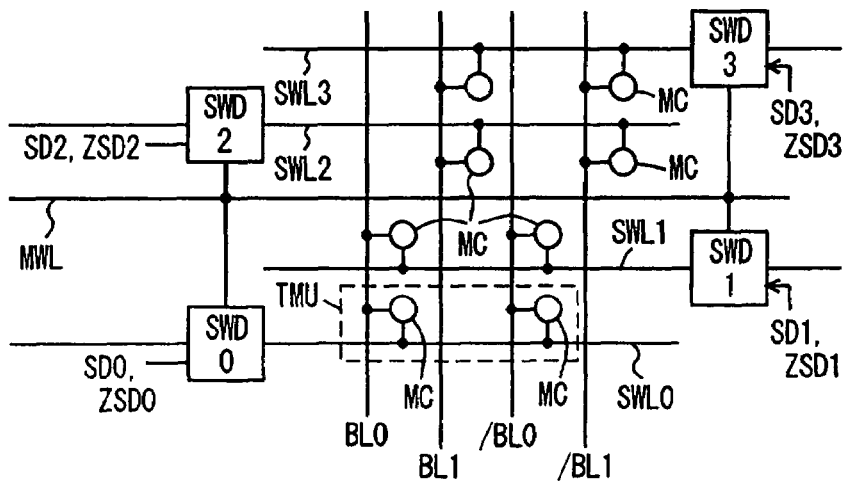
FIG. 15 is a diagram schematically showing the configuration of a memory block shown in FIG. 11.

FIG. 15 is a diagram schematically showing the configuration of a portion related to one main word line MWL. As shown in FIG. 15, four sub word lines SWL0-SWL3 are provided for main word line MWL. Respective sub word lines SWL0-SWL3 are driven into a select state in accordance with a main word line driving signal on main word line MWL and sub decode signals SD<3:0> and ZSD<3:0> by sub word drivers SWD0-SWD3. Sets of sub decode signals SD0 and ZSD0 to SD3 and ZSD3 are applied to sub word drivers SWD0-SWD3, respectively.

Memory cells MC are arranged corresponding to crossings between sub word lines SL0 and SWL1, and bit lines BL0 and /BL0. Memory cells MC are also arranged corresponding to crossings between sub word lines SWL2 and SWL3, and bit lines BL1 and /BL1. Therefore, if a sub word line to be selected can be specified, the sense amplifier to be activated can be specified. Since non-selected bit line pairs can be specified, with the bit lines of the non-selected bit line pairs used as shielding interconnection lines, sensing operation can be performed easily by holding bit line precharging/equalizing circuits provided to the non-selected bit line pairs in an active state.

The number of the sense amplifiers performing the sense operation is reduced to half times, so that sensing current can also be reduced to half times. Thus, a semiconductor memory device which is low in current consumption and is superior in noise immunity can be achieved.

Sub decoders 51 shown in FIG. 14 are arranged in crossings of sub word driver bands where sub word drivers SWD are arranged and sense amplifier bands where the sense amplifiers are arranged, corresponding to the respective sub word driver bands. Only sub decode fast signals ZSDF<3:0> are transmitted to the sense amplifier bands. Thus, according to the present configuration, the number of interconnection lines can be made smaller than in the configuration in which complementary sub decoding signals SD<3:0> and ZSD<3:0> are transmitted through sense amplifier bands. Through one sub decoder, the sub decode signals are transmitted to the sub word drivers arranged in the corresponding sub word driver band, and therefore, the sub word decode signals are transmitted at a high speed to drive a corresponding sub word line into a select state.

Figure 16:
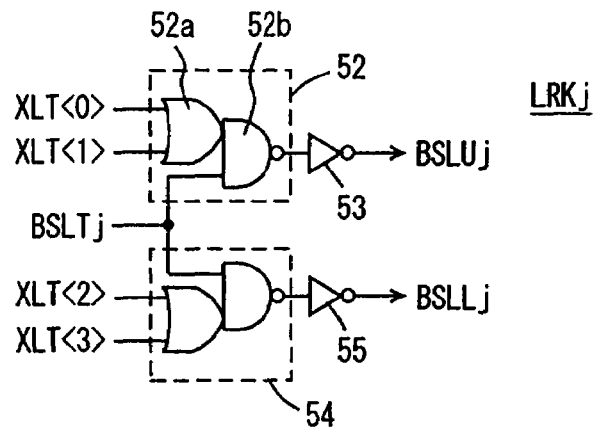
FIG. 16 is a diagram showing the configuration of a sense amplifier band designating signal generating section in a row related local control circuit shown in FIG. 12.

FIG. 16 is a diagram showing an example of the configuration of a sense amplifier control section of row local control circuit LRKj. In FIG. 16, row local control circuit LRKj includes a composite gate 52 receiving latch pre-decoding signals XLT<0> and XLT<1> and latch block selecting signal BSLTj, an inverter 53 for inverting an output signal from composite gate 52 to generate an upper side sense amplifier band designating signal BSLUj, a composite gate 54 receiving latch pre-decode signals XLT<2> and XLT<3> and latch block selecting signal BSLTj, and an inverter 55 for inverting an output signal from composite gate 54 to generate a lower side sense amplifier band designating signal BSLLj.

Composite gates 52 and 54 have the same configuration, and only the latch pre-decode signals applied thereto are different. In FIG. 16, reference numerals are attached to components of composite gate 52. Composite gate 52 equivalently includes an OR circuit 52a which receives latch pre-decode signals XLT<0> and XLT<1>, and a NAND circuit 52b which receives output signals from the OR circuit and latch block selecting signal BSLTj.

When either latch pre-decode signal XLT<0> or XLT<1> is driven into a select state, one of sub word lines SWL0 and SWL1 is driven into a select state. When either latch pre-decode signals XLT<2> or XLT<3> is driven into a select state, one of sub word lines SWL2 and SWL3 is driven into a select state. The shown configuration is a hierarchical word line configuration, and therefore, the terms of "main" word lines and "sub" word lines are used in order to distinguish main/sub word lines. Latch pre-decode signals XLT<0>-XLT<3> correspond to sub word line SWL0-SWL3, respectively.

Figure 17:
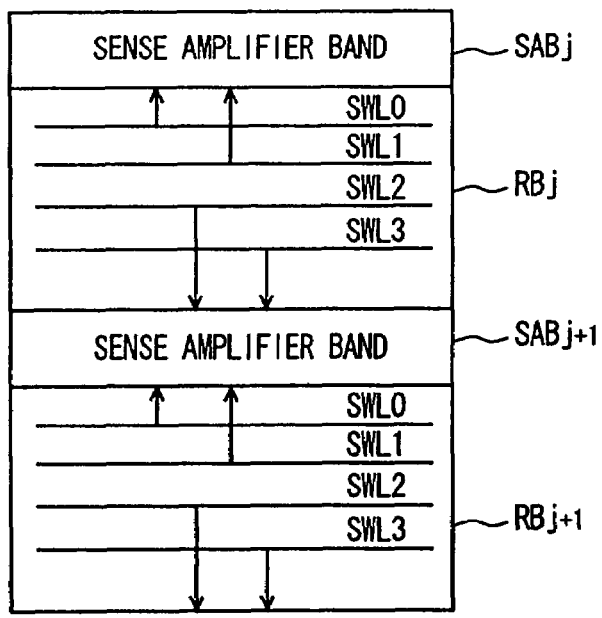
FIG. 17 is a diagram showing correspondence relationship between memory cells and sense amplifiers in the third embodiment of the present invention.

FIG. 17 is a diagram schematically representing corresponding relationship between a selected sub word line and sense amplifiers. In FIG. 7, a sense amplifier band SABj+1 is arranged between row blocks RBj and RBj+1, and a sense amplifier band SABj is arranged above row block RBj. These sense amplifier bands have sense amplifiers arranged in the configuration of an alternate arrangement type. The sense amplifiers are alternately arranged at both sides of the corresponding row block in the sense amplifier bands.

When sub word line SWL0 or SWL1 is selected in row block RBj, sensing operation is performed by upper side sense amplifier band SABj. In this state, all of the sense amplifiers included in sense amplifier band SABj+1 are kept in a non-active state. When sub word line SWL2 or SWL3 is selected in row block RBj, sensing operation is performed by lower side sense amplifier band SABj+1 and the sense amplifiers included in sense amplifier band SABj are kept in a non-active state.

In the same way, when sub word line SWL0 or SWL1 is selected in row block RBj+1, sensing operation is performed by upper side sense amplifier band SABj+1 and the sense amplifiers included in a not shown lower side sense amplifier band are kept in a non-active state. When sub word line SWL2 or SWL3 is selected in row block RBj+1, sensing operation is performed by the sense amplifiers in a not shown sense amplifier band below row block RBj+1.

Therefore, in any of the row blocks, the position of the sense amplifiers which perform sensing operation is determined uniquely, dependently on the position of a selected sub word line. Thus, the activation of the sense amplifiers can easily be controlled.

Figure 18:
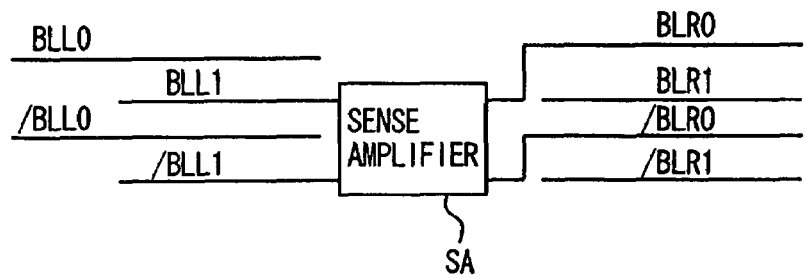
FIG. 18 is a diagram showing connection between sense amplifiers in a sense amplifier band shown in FIG. 17 and bit lines.

FIG. 18 is a diagram showing connection between one sense amplifier and bit lines. As shown in FIG. 17, in sense amplifier band SABj+1, sense amplifier SA performs sense operation on memory cells on sub word line SWL2 or SWL3 in row block RBj. On the other hand, in row block RBj+1, sense amplifier SA performs sense operation on memory cells on sub word line SWL0 or SWL1. As shown in FIG. 18, therefore, different bit lines are connected to the same sense amplifier SA between the adjacent row blocks. Specifically, sense amplifier SA is electrically connected to bit lines BLL1 and /BLL1 in one row block of the adjacent row blocks, and is electrically connected to bit lines BLR0 and /BLR0 in the other row block. Bit lines BLL0 and /BLL0 are connected to a not shown sense amplifier. In the same way, bit lines BLR1 and /BLR1 are connected to another not shown sense amplifier.

As shown in FIG. 18, the bit lines connected to sense amplifier SA are different every row block. However, sense amplifier SA is arranged corresponding to four bit lines in each sense amplifier band SAB (SABj, SABj+1). Different bit lines in adjacent row blocks can easily be connected electrically to the same sense amplifier SA.

The bit lines selected according to a column address are different for each row block. However, the position of a memory cell is designated on the basis of a bank address, a block address, a row address, and a column address, and therefore, no problem concerning external data access is caused.

Upon column selection, one of the sense amplifiers in the sense amplifier bands is selected in accordance with a column selecting signal. It is sufficient to select a column select gate provided for an activated sense amplifier band upon column selection. In the case that a column decoder is arranged in alignment with a row decoder corresponding to each row block, it is merely required to enable a column decoder arranged corresponding to an activated amplifier band in accordance with the block address.

In the case that a column decoder is arranged in common to a plurality of the row blocks, it is required to apply a signal of the logical product of a sense amplifier activating signal and a column selecting signal to a column selecting gate for selecting a column. Alternatively, a local IO line arranged corresponding to the row blocks are connected to a global IO line provided in common to the row blocks in accordance with a block selecting signal. Page size is equivalently ½ times of the page size of a conventional DRAM array arrangement. Therefore, even if the positions of the bit lines connected to a sense amplifier are different, the column addresses of the associated bit lines can be made the same by doubling a column selecting signal, that is, by assigning the same column address to the adjacent bit line pairs. Thus, it is possible to perform correctly a column selection on the activated sense amplifiers.

Modification

FIG. 19 is a diagram schematically showing the configuration of a modification of the third embodiment of the present invention. In FIG. 19, sub word lines SWL0-AWL1023 are mirror-symmetrically arranged in row blocks RBj and RBj+1. Specifically, in row block RBj, sub word lines SWL0-SWL1023 are arranged in this order from sense amplifier band SABj at the upper side thereof towards sense amplifier band SABj+1 at the lower side thereof. On the other hand, in row block RBj+1, sub word lines SWL1023-SWL0 are arranged in this order from sense amplifier band SABj+1 at the upper side thereof towards a not shown sense amplifier band at the lower side thereof.

Corresponding to the mirror symmetrical arrangement of memory cells in row blocks RBj and RBj+1, signals to main row decoders and sub decoders are mirror-symmetrically arranged. When sub word line SWL0 or SWL1 is designated in accordance with latch pre-decode signals XLT<1:0> in row block RBj, and sensing operation is performed by sense amplifier band SABj. On the other hand, when sub word line SWL1022 or SWL1023 (SWL2 or SWL3) is designated in accordance with latch pre-decode signals XLT<3:2> in row block RBj, sensing operation is performed by sense amplifier band SABj+1 at the lower side.

Therefore, in the case that one of latch pre-decode signals XLT<1:0> is selected in row block RBj, sense amplifier band identifying signal BSLUj is activated in the configuration shown in FIG. 16. On the other hand, in the case that one of latch pre-decode signals XLT<3:2> is selected, sense amplifier band identifying signal BSLLj is activated. In row block RBj+1, the arrangement thereof is mirror-symmetrical, and therefore, when one of latch pre-decode signals SLT<1:0> is selected, sense amplifier band identifg signal BSLLj is activated, and when one of latch pre-decode signals XLT<3:2> is selected, sense amplifier band identifying signal BSLUj is activated.

In this way, bits lines in the same column are connected to the same sense amplifier SA as shown in FIG. 20. According to a selected word line (sub word line), the corresponding sense amplifier band can be activated correctly. In FIG. 20, bit lines BLL1 and /BLL1 in one of adjacent row blocks are connected to sense amplifier SA, and bit lines BLR1 and /BLR1 in the other row block are connected to the same sense amplifier SA. Bit lines BLL0 and /BLL0 are connected to a not shown sense amplifier, and bit lines BLR0 and /BLR0 are also connected to a not shown sense amplifier.

Thus, according to the shown configuration, the bit lines on the same column in the adjacent row blocks are electrically connected to the same sense amplifier SA. As for a column address, therefore, a column selecting gate connected to sense amplifier SA can be selected on the basis of the same column selecting signal.

In this configuration, a column decoder may be arranged in alignment with a row decoder and arranged for each row block, or may be arranged in common to the row blocks.

Figure 21:
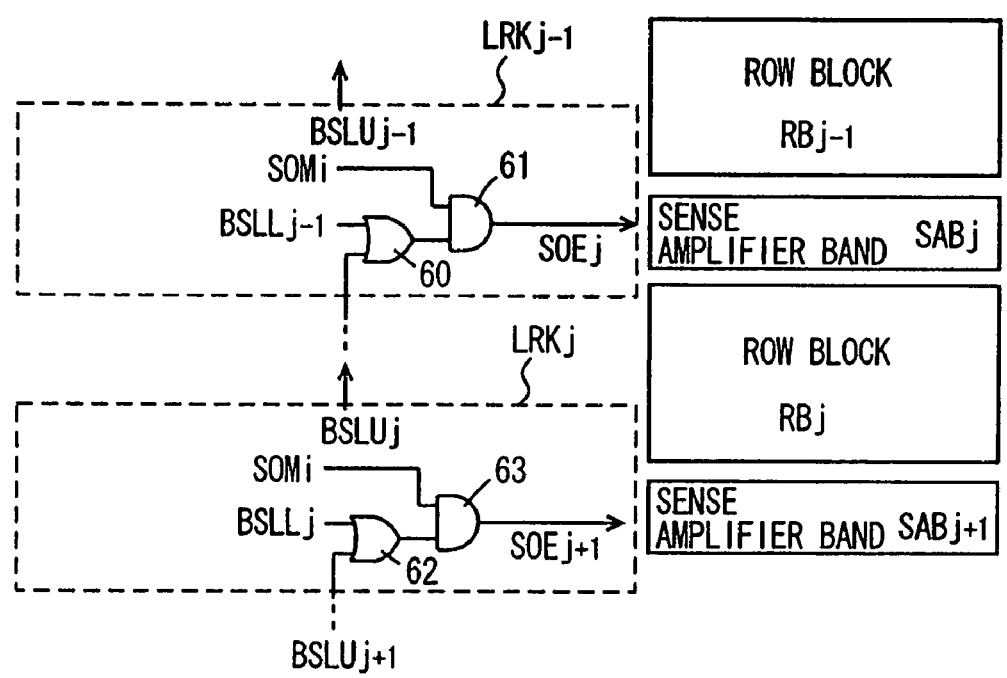
FIG. 21 is a diagram showing the configuration of a sense amplifier control section in the row related local control circuit shown in FIG. 12.

FIG. 21 is a diagram showing the configuration of a sense amplifier control section in the row local control circuit. In FIG. 21, a row local control circuit LRKj−1 is provided for sense amplifier band SABj, and a row local control circuit LRKj is provided for sense amplifier band SABj+1. Row blocks RBj−1 and RBj share sense amplifier band SABj, and row block RBj and a not shown row block RBj+1 share sense amplifier band SABj+1.

Row local control circuit LRKj−1 includes an OR circuit 60 which receives sense amplifier band identifying signals BSLLj−1 and BSLUj, and an AND circuit 61 which receives output signals from OR circuit 60 and a main sense amplifier activating signal SOMi. A sense amplifier activating signal SOEj is supplied from AND circuit 61 to the sense amplifiers in sense amplifier band SABj.

Row local control circuit LRKj includes an OR circuit 62 which receives sense amplifier band identifying signals BSLLj and BSLUj+1, and an AND circuit 61 which receives output signals from OR circuit 62 and main sense amplifier activating signal SOMi. AND circuit 63 outputs a sense amplifier activating signal SOEj+1 for sense amplifier band SABj+1.

When a row is selected in row block RBj, one of sense amplifier identifying signals BSLUj and BSLLj is activated in row local control circuit LRKj. Therefore, when main sense amplifier activating signal SOMi is activated, one of sense amplifier activating signals SOEj and SOEj+1 from AND circuits 61 and 63 is activated so that one of sense amplifier bands SABj and SABj+1 is activated.

Main sense amplifier activating signal SOMi is a signal generated from central control block MCK shown in FIG. 11 to a selected bank BNKi.

Figure 22:
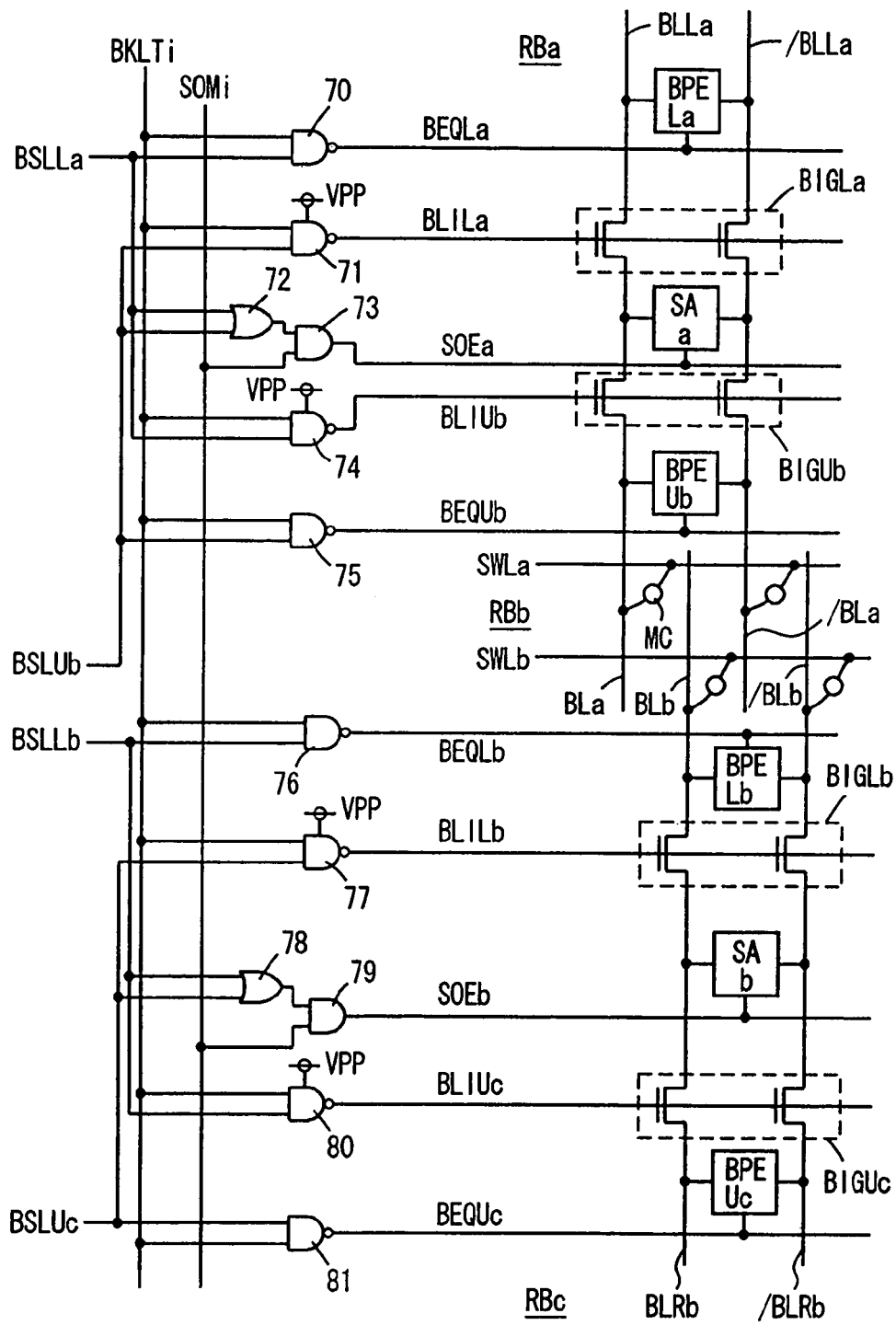
FIG. 22 is a diagram more specifically showing the configuration of the memory block and row related local control circuit of the semiconductor memory device in the third embodiment of the present invention.

FIG. 22 is a diagram more specifically showing the configuration of the row local control circuit. FIG. 22 shows the configuration of the row local control circuit for three row blocks RBa, RBb, and RBc. In FIG. 22, in row block RBa a bit line precharge/equalize circuit BPEa is provided to bit lines BLLa and /BLLa. Bit lines BLLa and /BLLa are connected to a sense amplifier SAa through a bit line isolating gate BIGLa.

In row block RBb, bit lines BLa and /BLa are connected to sense amplifier SAa through a bit line isolating gate BIGUb and bit lines BLb and /BLb are connected to a sense amplifier SAb through a bit line isolating gate BIGLb. A bit line precharge/equalize circuit BPEUb is provided to bit lines BLa and /BLa. A bit line precharge/equalize circuit BPELb is provided to bit lines BLb and /BLb.

In row block RBc, bit lines BLRb and /BLRb are connected to sense amplifier SAb through a bit line isolating gate BIGUc. A bit line precharge/equalize circuit BPEUc is provided to bit lines BLRb and /BLRb.

When a sub word line SWLa is selected in row block RBb, data in memory cells MC are read out onto bit lines BLa and /BLa. When a sub word line SWLb is selected, the data in memory cells MC are read out onto bit lines BLb and /BLb.

An equalization instructing signal BEQLa to a bit line precharge/equalize circuit BPEa is outputted from a NAND circuit 70 which in turn receives latch bank designating signal BKLTi and a sense amplifier band identifying signal BSLLa. An isolation instructing signal BLILa to bit line isolating gate BIGLa is outputted from a NAND circuit 71 which receives latch bank designating signal BKLTi and a sense amplifier band identifyig signal BSLUb. NAND circuit 71 has a level converting function of converting a signal at a level of peripheral power supply voltage VCC to a signal of high voltage level VPP.

A sense amplifier activating signal SOEa to sense amplifier SAa is generated from a combination of an OR circuit 72 which receives sense amplifier band designating signals BSLLa and BSLUb and a NAND circuit 73 which receives an output signal from OR circuit 72 and main sense amplifier activating signal SOMi.

An isolation instructing signal BLIUb to a bit line isolating gate BIGUb is generated from a NAND circuit 74 which receives sense amplifier band designating signal BSLLa and latch bank designating signal BKLTi. This NAND circuit 74 also has a level converting function of converting a signal at a level of peripheral power supply voltage VCC to a signal of high voltage level VPP.

An equalization instructing signal BEQUb to bit line precharge/equalize circuit BPEUb is generated from a NAND circuit 75 which receives sense amplifier band identifyg signal BSLUb and latch bank designating signal BKLTi.

An equalization instructing signal BEQLb to bit line precharge/equalize circuit BPELb is generated from a NAND circuit 76 which receives sense amplifier band identifying signal BSLLb and latch bank designating signal BKLTi.

An isolation instructing signal BLILb to bit line isolating gate BIGLb is generated from a NAND circuit 77 which receives latch bank designating signal BKLTi and a sense amplifier band identifying signal BSLUc. This NAND circuit 77 also has a level converting function of converting a signal of the peripheral power supply voltage level to a signal of the high voltage level.

A sense amplifier activating signal SOEb to sense amplifier SAb is generated from a combination of an OR circuit 78 which receives sense amplifier band identifying signals BSLLb and BSLUc and an AND circuit 79 which receives an output signal from OR circuit 78 and main sense amplifier activating signal SOMi.

An isolation instructing signal BLIUc to bit line isolating gate BIGUc is generated from a NAND circuit 80 which receives sense amplifier band identifying signal BSLLb and latch bank designating signal BKLTi.

An equalization instructing signal BEQUc to a bit line precharge/equalize circuit BPEUc is generated from a NAND circuit 81 which receives latch bank designating signal BKLTi and a sense amplifier band identifying signal BSLUc.

Each of NAND circuits 70, 75, 76 and 81 which generate bit line equalization instructing signals may have a level converting function and generate bit line precharge/equalize instructing signals at the high voltage level.

In the configuration shown in FIG. 22, sense amplifier band identifing signal BSLLa indicates that the sense amplifier band including sense amplifier SAa is used when row block RBb is selected. Sense amplifier band identifying signal BSLUb indicates that row block RBb is selected and sense operation is performed by the sense amplifier band including sense amplifier SAa. Sense amplifier band identifying signal BSLLb indicates that row block RBb is selected and sense operation is performed by the sense amplifier band including sense amplifier SAb. Sense amplifier band identifying signal BSLUc indicates that row block RBc is selected and sense operation is performed by the sense amplifier band including sense amplifier SBb.

It is now assumed that sub word line SWLa is selected in row block RBb. Since memory cell data are read out onto bit lines BLa and /BLa in this state, sense operation is performed by sense amplifier SAa. In this case, therefore, sense amplifier band identifying signal BSLUb attains H level and the other sense amplifier band identifying signals BSLLa, BSLLb and BSLLc are at L level of an inactive state. Equalization instruction signal BEQUb from NAND circuit 75 turns L level so that bit line precharge/equalize circuit BPEUb enters an inactive state.

On the other hand, NAND circuit 74 holds isolation instructing signal BLIUb at H level of the high voltage level, since sense amplifier band identifying signal BSLLa is at L level, or in a non-select state. On the other hand, since latch bank designating signal BKLTi is activated, NAND circuit 71 drives isolation instructing signal BLILa into L level when sense amplifier band identifying signal BSLUb turns H level. Responsively, bit line isolating gate BIGLa is made nonconductive. Sense amplifier SAa is isolated from bit lines BLLa and /BLLa while bit lines BLa and /BLa are connected to sense amplifier SAa.

NAND circuit 70 holds equalize instructing signal BEQLa at H level since sense amplifier band identifying signal BSLLa is at L level, or in a non-select state. Therefore, bit line precharge/equalize circuit BPEa continuously precharges and equalizes bit lines BLLa and /BLLa.

On the other hand, equalization instructing signal BEQLb is kept at H level since sense amplifier band identifying signal BSLLb is at L level. Therefore, bit lines BLb and /BLb are continuously precharged by bit line precharge/equalize circuit BPELb. Since sense amplifier band identifying signal BSLUc is at L level, isolation instructing signal BLILb is kept at H level of the high voltage level so that bit line isolating gate BIGLb is kept in a conductive state. In the same way, NAND circuit 80 holds isolation instructing signal BLIUc at H level of the high voltage level since sense amplifier band identifying signal BSLLb is at L level. Therefore, bit line isolating gate BIGUc is kept in a conductive state.

Furthermore, NAND circuit 81 holds equalization instructing signal BEQUc at H level since sense amplifier band identifying signal BSLUc is at L level. Therefore, bit lines BLRb and /BLRb are continuously precharged and equalized by bit line precharge/equalize circuit BPEUc.

In this state, sense amplifier activating signal SOEa is activated in accordance with main sense amplifier activating signal SOMi so that data is sensed, amplified and latched by sense amplifier SAa. At this time, bit line precharge/equalize circuit BPELb is kept in an active state and the voltage level of bit lines BLb and /BLb is fixed to the level of precharge voltage to function as shielding interconnection lines.

By utilizing the configuration of the row local control circuit as shown in FIG. 22, only the bit line pair sharing a sense amplifier with the bit line pair onto which memory cell data are read out, is isolated from the corresponding sense amplifier and sensing operation is performed on the memory cell.

In the configuration of the bit lines and the memory cells as shown in FIG. 22, the bit lines in the same column may be connected to the same sense amplifier, or the bit line pairs on the columns shifted from each other by one column may share the sense amplifier.

Modification Example

Figure 23:
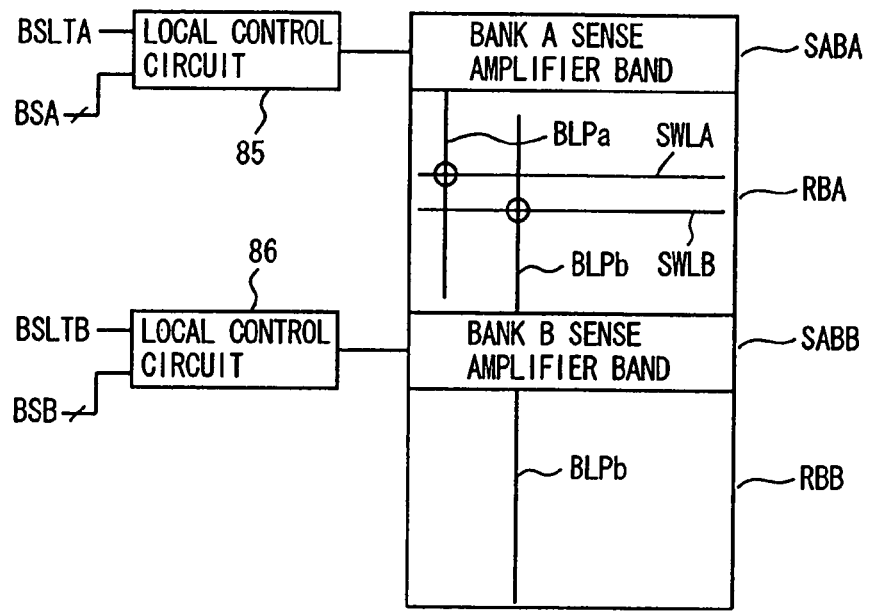
FIG. 23 is a diagram schematically showing the configuration of a modification 2 of the third embodiment of the present invention.

FIG. 23 is a diagram schematically showing the configuration of a modification of the third embodiment of the present invention. In FIG. 23, a bank A sense amplifier band SABA is arranged at one side, in the column direction, of a row block RBA, and a bank B sense amplifier SABB is arranged between row blocks RBA and RBB. Memory cells arranged at the crossing of a bit line pair BLPa and a sub word line SWLA in row block RBA are connected to a sense amplifier in bank A sense amplifier band SABA. On the other hand, in row block RBA, data in memory cells arranged corresponding to the crossing of a sub word line SWLB and a bit line pair BLPb are sensed and amplified by bank B sense amplifier band SABB.

A local control circuit 85 is provided to bank A sense amplifier band SABA, and a local control circuit 86 is provided to bank B sense amplifier band SABB. A latch bank designating signal BSLTA and a latch block selecting signal BSA specifying memory blocks sharing bank A sense amplifier band SABA are supplied to local control circuit 85. A latch bank designating signal BSLPB designating a bank B and a block selecting signal BSB specifying memory blocks sharing bank B sense amplifier band SABB are supplied to local control circuit 86.

By supplying bank designating signals BSLTA and BSLTB to local control circuits 85 and 86 as shown in FIG. 23, a single row block RBA can be divided into two banks. Thus, a semiconductor memory device of a multi-bank configuration can easily be achieved.

In this configuration of local control circuits 85 and 86, the block selecting signals are used, instead of sense amplifier band identifying signals BSLLa, BSLUb, BSLLb and BSLUc used in the configuration of the local control circuit shown in FIG. 22, to control the circuits related to sensing operation in accordance with the block selecting signals and the latch bank designating signal specifying the corresponding bank.

Even if a non-hierarchical word line configuration is used as word line configuration, the same technical advantages can be obtained.

As described above, according to the third embodiment of the present invention, each bit line pair is arranged with a bit line of another bit line pair interposed in between. Thus, data can be read out and written in a twin cell mode by selecting a word line. The number of the sense amplifiers to be activated at a time can be halved so that current consumption can be reduced.

Fourth Embodiment

Figure 24:
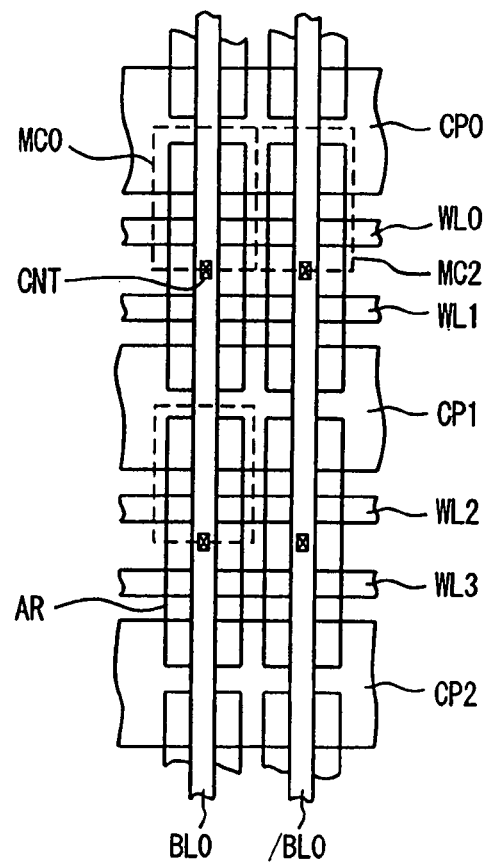
FIG. 24 is a diagram schematically showing a layout of a memory cell array according to a fourth embodiment of the present invention.

FIG. 24 is a diagram schematically showing a layout of a memory cell array according to a fourth embodiment of the present invention. In FIG. 24, active areas AR are arranged in alignment along the column direction. In each active area AR, 2-bit memory cells adjacent in the column direction are formed similarly to the third embodiment. Bit lines BL0 and /BL0 are arranged along the column direction in alignment with active areas AR. Therefore, one bit line is arranged at the pitch of the memory cells in the row direction. Thus, the pitch condition on the bit lines can be relaxed.

A memory cell MC0 is connected to a bit line BL0 through a contact CNT, and a memory cell MC2 is connected to a bit line /BL0 through a contact. When a word line WL1 is selected, data in memory cells MC0 and MC2 are read out onto bit lines BL0 and /BL0, respectively. Accordingly, in the case that data is stored in the twin cell mode, a twin cell unit is provided by memory cells MC0 and MC2.

Cell plate electrode lines CP0-CP2 are formed in the same interconnection layer as word lines WL0-WL3 similarly to the first to third embodiments.

Figure 25:
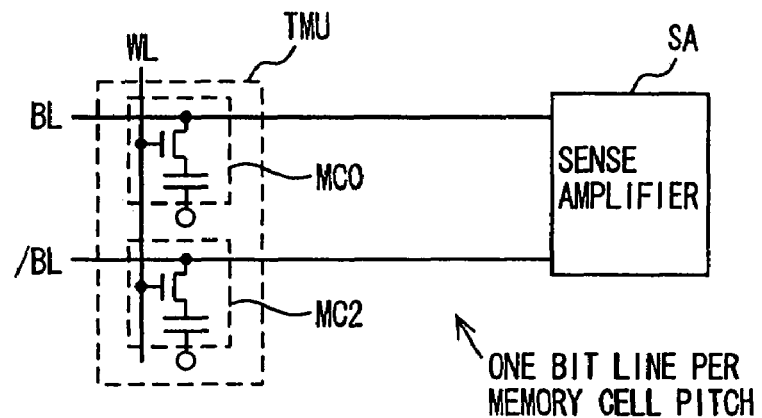
FIG. 25 is a diagram showing an electrically equivalent circuit of memory cells in the layout illustrated in FIG. 24.

FIG. 25 is a diagram representing connection between memory cells and bit lines according to the fourth embodiment of the present invention. In the case that data in the twin cell mode are stored, a twin cell unit TMU is provided by memory cells MC0 and MC2. Memory cell MC0 is connected to a bit line BL, and memory cell MC2 is connected to a bit line /BL. These bit lines BL and /BL in a pair are arranged such that a bit line is arranged at a pitch of the memory cells in the row direction. Therefore, pitch condition along the row direction on a sense amplifier SA is relaxed. As a result, sense amplifier SA can be arranged with sufficient margin.

Figure 26:
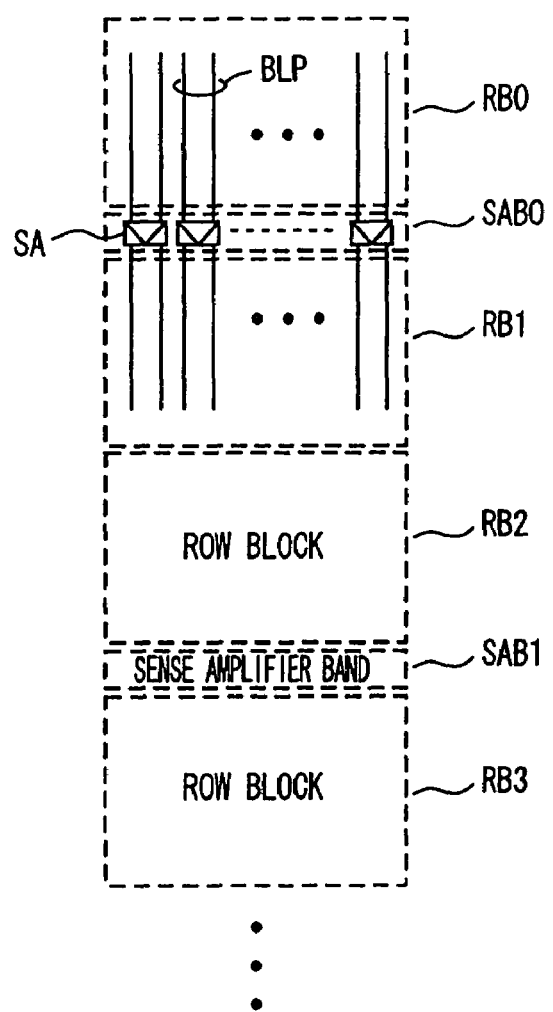
FIG. 26 is a diagram schematically showing an arrangement of a sense amplifier band in the fourth embodiment of the present invention.

FIG. 26 is a diagram schematically showing the configuration of an array section in the semiconductor memory device according to the fourth embodiment of the present invention. FIG. 26 representatively shows four row blocks RB0-RB3. A bit line pair BLP is arranged in each of row blocks RB0-RB3. The pitch condition on bit lines BL and /BL which constitute bit line pair BLP is sufficiently mitigated. Therefore, in a sense amplifier band SAB0 shared between row blocks RB0 and RB1. sense amplifiers SA are arranged corresponding to the bit line pairs BLP included in row blocks RB0 and RB1. No sense amplifier band is arranged between row blocks RB1 and RB2. A sense amplifier band SAB1 is arranged between row blocks RB2 and RB3. In this sense amplifier band SABL, sense amplifiers are arranged corresponding to bit line pairs included in row blocks RB2 and RB3.

Consequently, it is unnecessary to arrange alternately sense amplifiers at both sides of a row block as is generally seen in conventional DRAM. Thus, the number of the sense amplifiers can be halved so that array area can be reduced.

In the configuration of the memory cells according to the fourth embodiment, adjacent bit lines are arranged in a pair and all of the memory cells in one row are selected through selection of a word line.

As described above, according to the fourth embodiment of the present invention, the bit lines are arranged in alignment with the active areas so that the pitch conditions, in the row direction, of the bit lines can be mitigated. Thus, the sense amplifiers can be arranged with sufficient margin. As a result, in each of the sense amplifier bands, the sense amplifiers can be provided to all of the bit line pairs in a corresponding row block. Thus, the number of the sense amplifier bands can be reduced so that the area of the memory array can be reduced.

Fifth Embodiment

Figure 27:
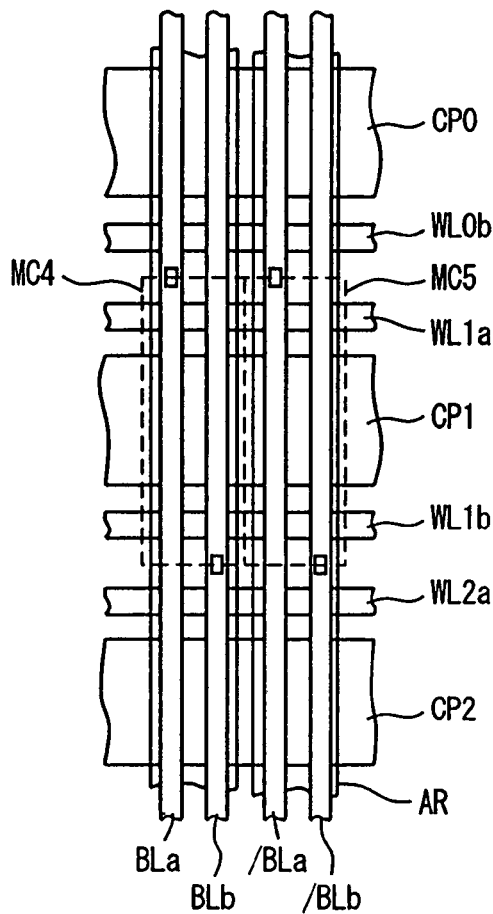
FIG. 27 is a diagram schematically showing a layout of a memory cell array according to a fifth embodiment of the present invention.

FIG. 27 is a diagram schematically showing a layout of an array section of a semiconductor memory device according to a fifth embodiment of the present invention. In FIG. 27, active areas AR are arranged extending continuously in the column direction. With two bit lines provided for each of these active areas AR, the bit lines are arranged extending in the column direction in alignment with active areas AR.

Similarly to the above-mentioned embodiments, cell plate electrode lines CP0-CP2 and word lines WL are formed in the same interconnection layer in the row direction.

In the layout illustrated in FIG. 27, active areas AR are continuously extends in the column direction, and DRAM cells sharing a cell plate electrode line share a capacitor. Thus, each of unit memory cells MC4 and MC5 is formed in an area surrounded by contacts at both sides of cell plate electrode CP1. At both sides of each of the contacts, word lines WL0b and WL1a, or word lines WL1b and WL2a are arranged corresponding to different ports. Each unit memory cell MC has a 2-transistor/1-capacitor configuration.

Adjacent bit lines are bit lines associated with different ports. In FIG. 27, bit lines BLa, BLb, /BLa, and /BLb are repeatedly and successively arranged in this order. Upon storing data in the twin cell mode, the data are stored in unit memory cells MC4 and MC5 of a 2-port twin cell unit PTMU. For example, when word line WL1a is selected, data in memory cells MC4 and MC5 are read out onto bit lines BLa and /BLa. On the other hand, when word line WL1b is selected, the memory data in memory cells MC4 and MC5 are read out onto bit lines BLb and /BLb. Therefore, by constructing a 2-port cell having a 2-transistor/1-capacitor configuration as a unit memory cell and further by using two unit memory cells to store complementary data, the data can be stored in the twin cell mode.

Figure 28:
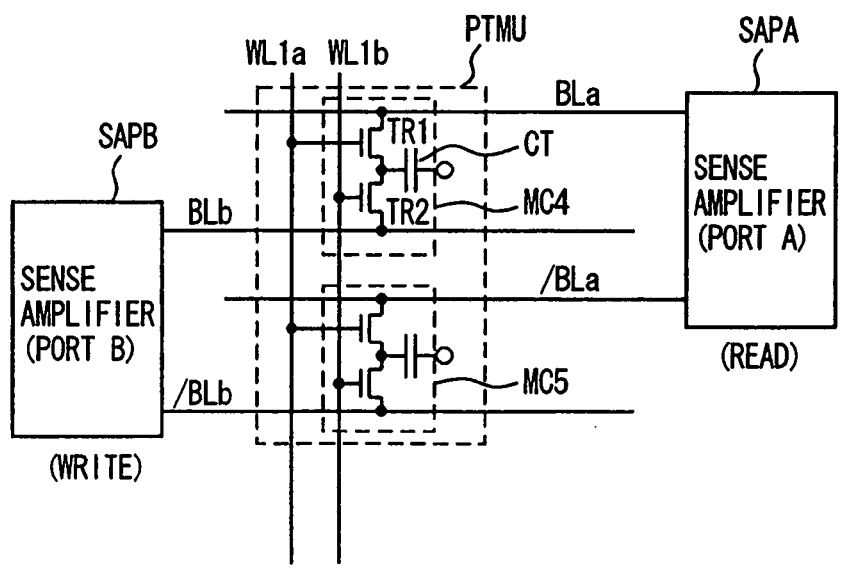
FIG. 28 is a diagram showing an electrically equivalent circuit of the memory cells illustrated in FIG. 27.

FIG. 28 is a diagram showing an electrically equivalent circuit of the layout illustrated in FIG. 27. In FIG. 28, 2-port twin cell unit PTMU is formed of two unit cells MC4 and MC5. Since unit cells MC4 and MC5 have the same configuration, reference numerals are attached to only components of unit cell MC4 in FIG. 28. Unit cell MC4 includes a capacitor CT, an access transistor TR1 for connecting capacitor CT to bit line BLa in response to a signal on word line WL1a, and an access transistor TR2 for connecting capacitor CT to bit line BLb in response to a signal on word line WL1b.

A sense amplifier SAPA for a port A is provided to bit lines BLa and /BLa, and a sense amplifier SAPB for a port B is provided to bit lines BLb and /BLb.

When word line WL1a is selected, memory data in 2-port twin cell PTMU are read out onto bit lines BLa and/BLa. The memory data are amplified and latched by sense amplifier SAPA. When word line WL1b is driven into a select state in this arrangement, the memory data in 2-port twin cell unit PTMU are read out onto bit lines BLb and /BLb, amplified and latched by sense amplifier SAPB for port B. Accordingly, sense amplifiers SAPA and SAPB can be accessed through different ports A and B.

Sense amplifier SAPA for port A is connected to a read port for reading out data, and sense amplifier SAPB for port B is connected to a write port for writing data. Thus, data can be written and read out through the different ports. In the present embodiment, therefore, access time can be made far shorter than in the configuration in which data are written and read through one port in a time division multiplexed manner.

Figure 29:
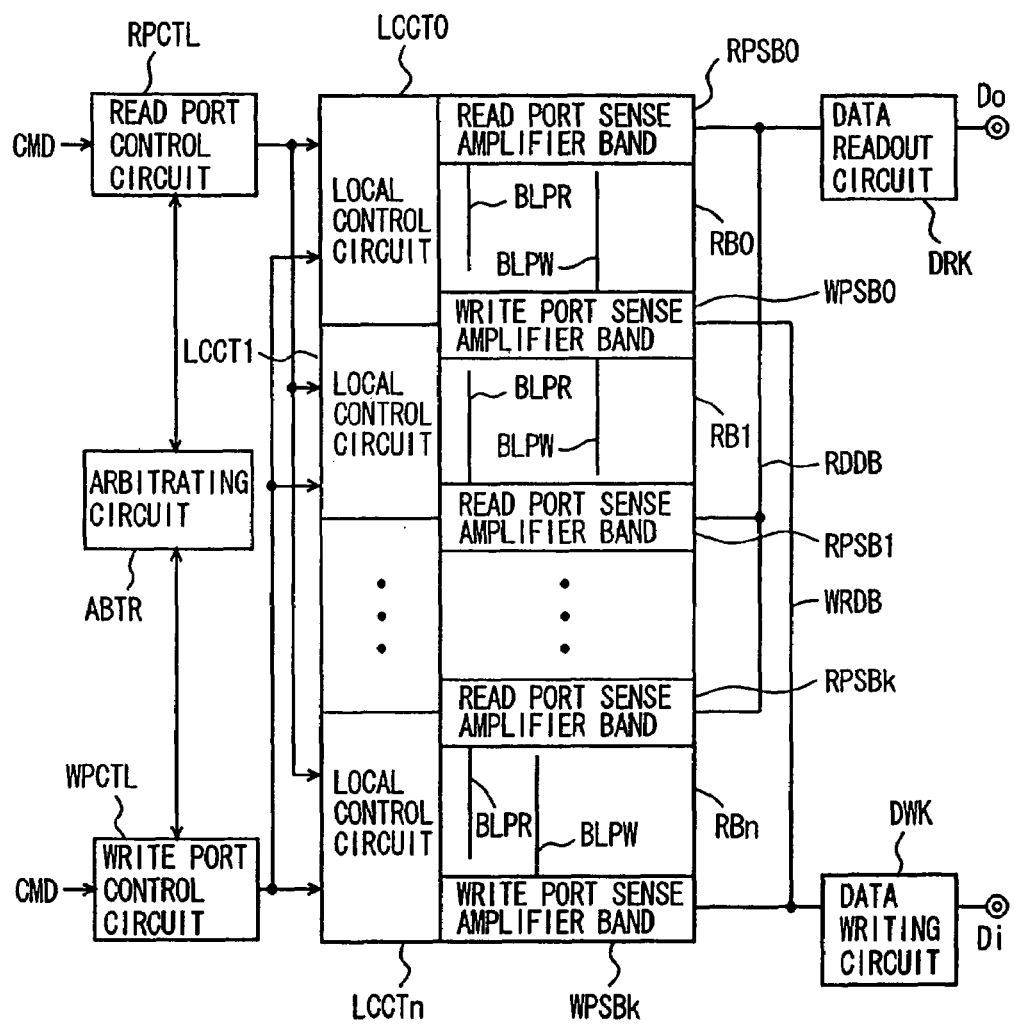
FIG. 29 is a diagram schematically showing the configuration of the whole of the semiconductor memory device in the fifth embodiment of the present invention.

FIG. 29 is a diagram schematically showing the configuration of the whole of the semiconductor memory device in the fifth embodiment of the present invention. In the configuration shown in FIG. 29, the port A is used as a data reading port and the port B is used as a data writing port.

The memory array shown in FIG. 29 is divided into row blocks RB0-RBn. Read port sense amplifier bands RPSB and write port sense amplifier bands WPSB are alternately arranged in areas between row blocks RB0-RBn and in areas outside of the memory array in the column direction. In FIG. 29, read port sense amplifier bands RPSB0-RPSBk and write port sense amplifier bands WPSB0-WPSBk are arranged, where k is n/2. With respect to each of the row blocks, the read port sense amplifier band and the write port sense amplifier band are arranged oppositely to each other.

Local control circuits LCCT0-LCCTn are arranged corresponding to row blocks RB0-RBn. Each of local control circuits LCCT0-LCCTn is selectively activated, under control by a read port control circuit RCTL and a write port control circuit WTCTL, to select a memory cell and activate the sense amplifiers in the corresponding sense amplifier band.

In order to arbitrate the conflict of data writing and data reading out on the same address, an arbitrating circuit ABTR is provided. When data writing and data reading out are simultaneously performed on the same address, arbitrating circuit ABTR carries out such an arbitration as causing the data reading out faster. When the same row is accessed by the port A and the port B and the word line in the same address is simultaneously selected, charged voltage of the capacitors in the 2-port twin cell unit are simultaneously read out onto a port A bit line and a port B bit line. Therefore, bit line readout voltage is dispersed so that the advantages of the twin cell mode may be damaged. Accordingly, it is necessary to prohibit simultaneous access by the different ports to the same row. The simultaneous access to the same row address is arbitrated by arbitrating circuit ABTR.

In the arbitration of the access conflict, the timing of internal operation is controlled such that writing operation from the write port is started after sensing operation of the sense amplifiers in the read port completes. This timing control is achieved, for example, by making valid a sense operation completion indicating signal (corresponding to a column lock signal in a standard DRAM) of the read port at the time of detecting the access conflict and then delaying an access of the write port.

Read port sense amplifier bands RPSB0-RPSBk are connected to a data readout circuit DRH through a read out data bus RDDB, and write port sense amplifier bands WPSB0-WPSBk are connected to a data write circuit DWK through a write data bus WRDB. Read port sense amplifier bands RPSB0-RPSBk are connected to read bit line pairs BLPR in the corresponding row blocks, and write port sense amplifier bands WPSB0-WPSBk are connected to write bit line pairs BLPW in the corresponding row blocks. In row blocks RB0-RBn, therefore, read port sense amplifier bands RPSB0-RPSBk have a shared sense amplifier configuration, in which read bit line pairs BLPR in adjacent row blocks share the sense amplifier band, and the write port sense amplifier bands WPSB0-WPSBk-1 also have a shared sense amplifier configuration, in which write bit line pairs BLPW in adjacent row blocks share the sense amplifier band.

Therefore, each of local control circuits LCCT0-LCCTn performs the same control for connection of a bit line pair and a sense amplifier as done in the conventional shared sense amplifier configuration. Specifically, when read port control circuit RPCTL controls data readout operation in accordance with a command instructing an operation mode, under the control of the read port local control circuit included in local control circuits LCCT0-LCCTn, read bit line pairs BLPR in a selected row block are connected to the corresponding read port sense amplifier band RPSB and the read bit line pairs in the row block sharing the sense amplifier band with this selected row block is isolated from the corresponding read port sense amplifier band. In the other row blocks, they are not selected, and all of their read bit line pairs are kept in a precharged state. After the isolation of the bit lines is completed, a read port row decoder provided for the selected row block is activated to select a row.

Consequently, as the configuration of the local control circuits, the same configuration as that shown in FIG. 22 can be used even in such a 2-port configuration. It is sufficient merely to control the connection of the sense amplifier band and the row block and the activation of the sense amplifier band in accordance with block selecting signals (including port information) generated under the control of read port control circuit RPCTL and write port control circuit WPCTL, instead of sense amplifier band identifying signals BSLL and BSLU.

Upon word line selection, a read port row decoder and a write port row decoder are provided for the row blocks and the row decoder corresponding to a selected port is activated through the control by read port control circuit RPCTL and write port control circuit WPCTL. Thus, a desired word line can be selected.

Arbitrating circuit ABTR merely performs arbitration for preventing data from being destructed by write data before reading out the data, and can be constructed by ordinary arbitrating circuit.

The sequence of the access to the 2-port memory may be decided by a specification. The arbitration upon occurrence of access conflict may be performed by an external controller.

In the case that read access and write access are alternately or selectively performed in the configuration in FIG. 29, the write port bit line pair arranged between the read port bit line pairs is kept at a predetermined voltage level by the corresponding bit line precharge/equalize circuit when the read port is accessed. When the write port is accessed, the read port bit line pair between the bit line pairs for this write port is kept at the predetermined precharge voltage level by the corresponding precharge/equalize circuit.

When both of a read port word line and a write port word line are kept in a selected state, the read port word line is first driven into a select state and subsequently the write port word line is driven into a select state, or vice versa. The voltage levels of the bit lines of the port accessing earlier are latched by the corresponding sense amplifiers. In this case, the bit lines having the voltage levels latched function as shielding interconnection lines for the bit lines for the other port selected later.

In either case, therefore, the bit lines adjacent to each other function as shielding bit lines. Thus, using the memory cells having the CUB configuration that memory cell capacitors are formed under the bit lines, an array configuration having an immunity against bit line noise is equivalent to that of memory cells having a COB configuration can be achieved.

The active areas for forming memory transistors are linearly and continuously extended in the column direction, and are not projected in the row direction. Thus, the active areas can be arranged at a high density in the row direction.

In the configuration shown in FIG. 29, port A is used as a read port and port B is used as a write port. Each of ports A and B may be used as a port for inputting and outputting data. By writing and reading out data through different ports, the data writing and the data reading can be performed in parallel so that data access can be made at higher speed.

Figure 30:
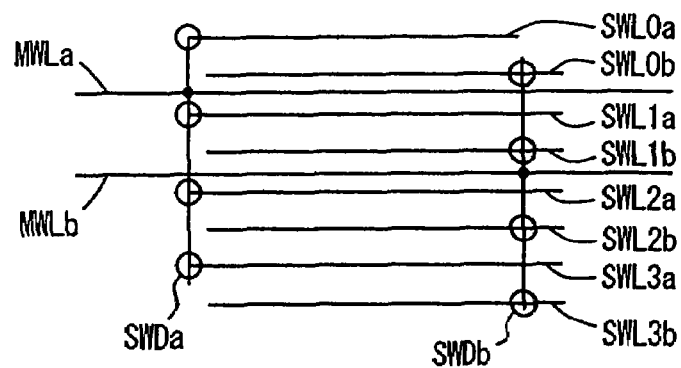
FIG. 30 is a diagram schematically showing connection between main word lines and substantial word lines in the fifth embodiment of the present invention.

FIG. 30 is a diagram schematically showing an example of the arrangement of word lines in the fifth embodiment of the present invention. In FIG. 30, Port A sub word lines SWL0a-SWL3a are provided to a port A main word line MWLa, and port B sub word lines SWL0b-SWL3b are provided to a port B main word line MWLb. Therefore, a 4-way hierarchical word line configuration is employed for each of ports A and B. Port A sub word lines SWL0a-SWL3a and port B sub word lines SWL0b-SWL3b are alternately arranged in the column direction. A sub word driver SWDa is provided for each of read port sub word lines SWL0a-SWL3b, and a sub word driver SWDb is provided for each of B port sub word lines SWL0b-SWL3b.

These sub word drivers SWDa and SWDb are alternately arranged in a sub word driver band. Therefore, even if the interval between the sub word lines is small, sub word drivers SWDa and SWDb can be arranged with sufficient margin.

In this configuration, the word lines may be an 8-way hierarchical word line configuration, and may be a non-hierarchical word line configuration in which eight sub word lines are provided for a main word line.

As described above, according to the fifth embodiment of the present invention, the active areas are linearly extended and the cell plate electrodes and the word lines are formed in the same interconnection layer. Thus, 2-port memory which operate in the twin cell mode can easily be achieved. Between each bit line pair, a bit line for a different port is arranged so that the bit line interposed in between can be used as a shielding bit line. As a result, a memory array configuration which is superior in noise immunity can be achieved.

Sixth Embodiment

Figure 31A:
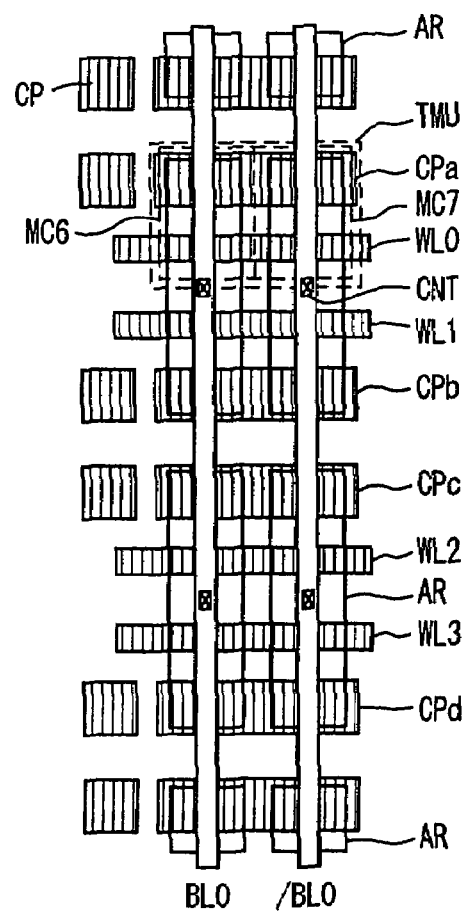
FIG. 31A is a diagram schematically showing a layout of a memory cell array according to a sixth embodiment of the present invention.

FIG. 31A is a diagram schematically showing a layout of a memory cell array according to a sixth embodiment of the present invention. In FIG. 31A, active areas AR for making 2-bit DRAM cells arranged in alignment in the column direction are arranged in alignment in the column direction. Bit lines BT (BL0, /BL0) are arranged at a pitch of memory cells in the row direction. Word lines WL (WL0-WL3) and cell plate electrode lines CP are formed in the same interconnecting layer. In the sixth embodiment, the cell plate electrode lines are divided for each twin cell unit TMU, which is a memory unit in the twin cell mode. That is, a cell plate electrode line CPa is provided in common to memory cells (DRAM cells) MC6 and MC7 in FIG. 31A. This cell plate electrode line CPa is isolated from cell plate electrodes CP of DRAM cells in the other twin cell units. This relation holds for the other cell plate electrode lines CPb-CPd. Additionally, these cell plate electrode lines CPa-CPd, and CP are kept in an electrically floating state.

Figure 31B:
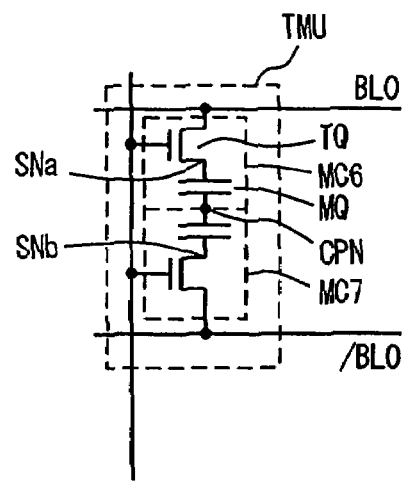
FIG. 31B is a diagram showing a circuit that is electrically equivalent to the layout illustrated in FIG. 31A.
Figure 32:
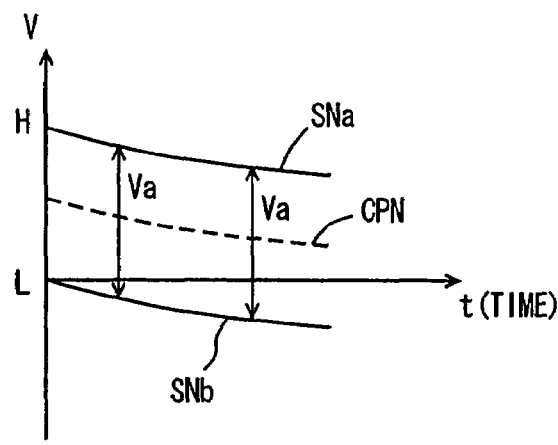
FIG. 32 is a graph showing time dependent change of the voltages of a storage node and a cell plate node of the memory cell illustrated in FIGS. 31A and 31B.

FIG. 31B is a diagram showing an electrically equivalent circuit of twin cell unit TMU shown in FIG. 31A. In FIG. 31B, a DRAM cell (memory cell) MC6 includes a capacitor MQ and an access transistor TQ. The capacitors of memory cells MC6 and MC7 are connected in series between storage nodes SNa and SNb of memory cells MC6 and MC7. Therefore, a cell plate node CPN is kept at a voltage level obtained by capacitance division of the voltages of storage nodes SNa and SNb.

It is assumed that an H level data is written in storage node SNa and an L level data is written in storage node SNb, as shown in 32. In this case, cell plate node CPN is at a voltage level of the intermediate voltage level (VCCS/2). When the voltage level of storage node SNa is lowered with the passage of time by storage node to substrate leakage current, the voltage drop of storage node SNa is transmitted to cell plate node CPN through capacitive coupling. Then, the voltage drop is transmitted to storage node SNb. Consequently, the voltage level of storage node SNb is also lowered with the voltage drop of storage node SNa.

Thus, a difference Va between the voltages of storage nodes SNa and SNb is constant even if time passes. Accordingly, a voltage difference caused between bit lines BL0 and /BL0 upon selecting twin cell unit TMU is constant even if leakage current is generated. As a result, the voltage difference (read-out voltage) caused between bit lines BL0 and /BL0 can be constant. In principle, data can be stably stored and can be read out for sensing operation until the storage node SNb and the substrate region are forward biased. Even if the voltage levels of storage nodes SNa and SNb are lowered by leakage current, the voltage levels of storage nodes SNa and SNb can be recovered to original H level and L level by selecting twin cell unit TMU and operating the corresponding sense amplifier.

Therefore, by dividing the cell plate electrode lines for each twin cell unit and keeping the cell plate lines in an electrically floating state, a semiconductor memory device with excellent data retention characteristics can be achieved.

Seventh Embodiment

Figure 33:
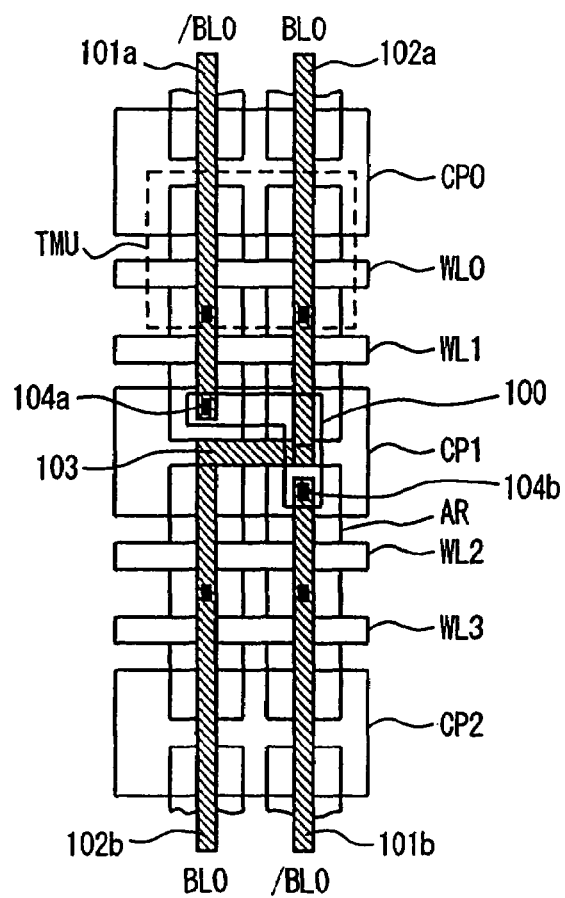
FIG. 33 is a diagram schematically showing a layout of a memory cell array according to a seventh embodiment of the present invention.

FIG. 33 is a diagram schematically showing a layout of a memory cell array according to a seventh embodiment of the present invention. In the layout illustrated in FIG. 33, active areas AR for making 2-bit DRAM cells are arranged in alignment in the column direction and are isolated from each other. Cell plate electrode lines CP0-CP2 and word lines WL0-WL3 are formed in the same interconnection layer. Cell plate electrode lines CP0-CP3 may be a formed into a division configuration or may be arranged extending in the row direction.

Conductive lines 101a, 102a, 102b and 101b are arranged in alignment with active areas AR. Conductive lines 101a and 102b are arranged in alignment with in the column direction, and conductive lines 102a and 101b are arranged in alignment in the column direction.

In a region above a cell plate electrode line CP1, for example, by means of a second level metal interconnection layer 100, conductive line 101a is connected to conductive line 101b through via holes 104a and 104b. In a region above cell plate electrode line CP1, by means of a interconnection line 103 which is at the same layer as conductive lines 102a and 102b, conductive line 102a is interconnected to conductive line 102b so as to cross the second level metal interconnection layer (crossing interconnection line) 100. Conductive lines 101a and 101b constitute bit line /BL0, and conductive lines 102a and 102b constitute the bit line BL0.

Bit lines BL0 and /BL0 have a cross section on cell plate electrode line CP1, and the positions thereof are exchanged. The configuration in which the positions of these bit lines are exchanged in the cross section is called a so-called "twisted bit line" configuration, and makes it possible to reduce the capacitive coupling between the bit lines. Moreover, by superimposing the common phase noise onto the bit lines adjacent to each other, the bit line to bit line coupling noise can be reduced.

Cell plate electrode lines CP0-CP2 are interconnection lines which are wide in the column direction, and the bit line cross sections can be made, with sufficient margin, in the areas on the cell plate electrode lines.

Cell plate electrode lines CP may have a division configuration to constitute a 2-port twin cell unit. In the case of the 2-port twin cell unit configuration, different row addresses may be substantially simultaneously accessed and sensing operation is performed. In such a case, capacitive coupling noises are reduced by the twisted bit line configuration so that sensing operation can stably be performed.

Figure 34:
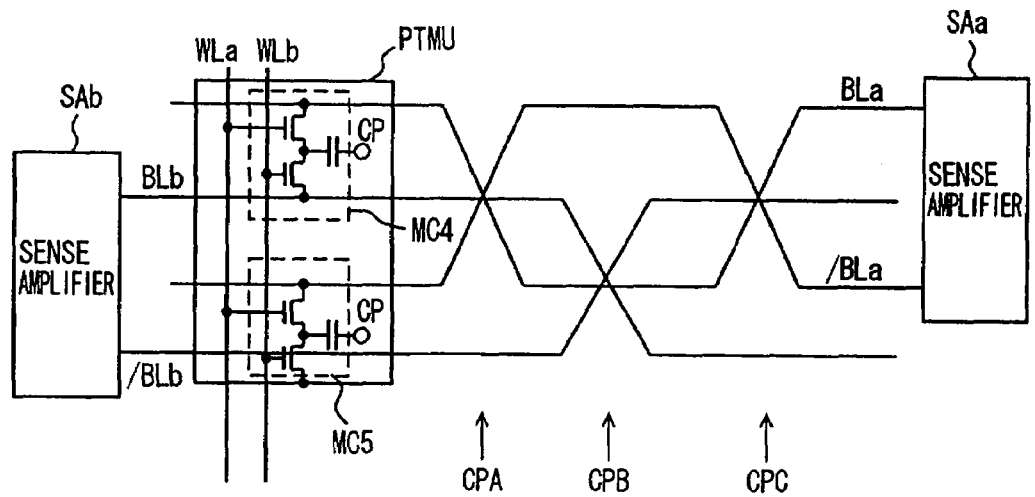
FIG. 34 is a diagram showing an electrically equivalent circuit of the layout illustrated in FIG. 33.

FIG. 34 is a diagram showing an electrically equivalent circuit of the memory array according to the seventh embodiment of the present invention. FIG. 34 shows the twisted bit line configuration in which a bit line of a bit line pair is arranged between the bit line of another bit line pair. A unit memory cell in the twin cell unit may be a 2-port memory cell, or may be of the memory cell configuration in the third embodiment. FIG. 34 shows, as an example, the twisted bit line configuration for a 2-port twin cell unit PTMU.

In FIG. 34, bit lines BLa and /BLa and bit lines BLb and /BLb are provided to 2-port twin cell unit PTMU. Bit lines BLa and /BLa are connected to a sense amplifier SAa for a port A, and bit lines BLb and /BLb are connected to a sense amplifier SAb for a port B. On a cell plate electrode interconnecting area CPA, bit lines BLa and /BLa have a crossing section. On a cell plate electrode interconnection area CPB, bit lines BLb and /BLb have a crossing section. Furthermore, on a cell plate electrode interconnecting area CPC, bit lines BLa and /BLa have a crossing section.

In bit lines BLa and /BLa for port A and bit lines BLb and /BLb for port B, the crossing sections are alternately disposed. Therefore, in the case that a capacitive coupling noise is generated between bit lines BLa and /BLa and bit lines BLb and /BLb, in bit lines BLb and /BLb or bit lines BLa and /BLa the noises of the common phase are superimposed on the two bit lines. Thus, the noises can be cancelled out upon sensing operation. Therefore, even if in the 2-port memory, the two ports access different row addresses simultaneously and sense amplifiers SAa and SAb perform sense operation at substantially the same timing, the sensing operation can be performed stably.

As described above, according to the seventh embodiment of the present invention, the bit lines have the crossing section on the cell plate electrode. As a result, it is unnecessary to provided the areas exclusively for providing the crossing sections. Moreover, a bit line configuration which is highly resistant against bit line noises can be achieved without any area penalty.

Eighth Embodiment

Figure 35:
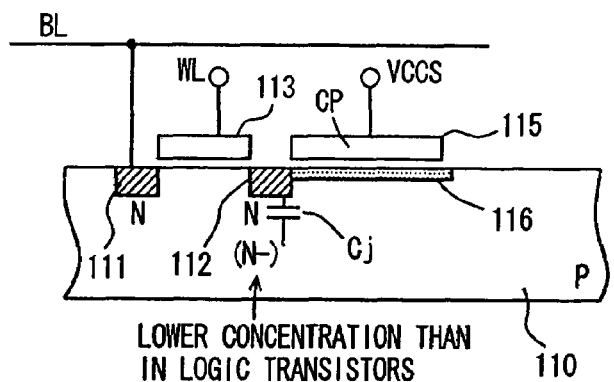
FIG. 35 is a diagram schematically showing a cross sectional structure of a memory cell according to an eighth embodiment of the present invention.

FIG. 35 is a diagram schematically showing a cross sectional structure of a memory cell according to an eighth embodiment of the present invention. FIG. 35 shows the cross sectional structure of DRAM cells constituting a twin cell unit. In FIG. 35, the DRAM cell includes impurity regions 111 and 112 formed apart from each other on a surface of a P type semiconductor substrate region 110, a conductive line 113 formed, on a not shown insulated gate insulating film, on the surface of the substrate area between impurity regions 111 and 112, and a conductive line 115 formed, in the same layer as conductive line 113, on a not shown capacitor insulating film formed on the surface of substrate area 110 adjacent to impurity region 112. The portion facing to conductive line 115 on the surface of semiconductor substrate region 110 is an inversion layer forming region 116, and may be an impurity region having the same conduction type as impurity regions 111 and 112 but having a low impurity concentration. The inversion layer forming region may be the impurity region having the impurity concentration adjusted, or may be merely a region having the impurity concentration of the surface of the semiconductor substrate area 110 adjusted.

Conductive layer 113 constitutes a word line WL and conductive line 115 constitutes a cell plate electrode CP of a memory cell capacitor. An array power supply voltage VCCS is applied to conductive line 115. Impurity region 111 is connected to a bit line BL. A memory cell transistor composed of conductive line 113 and impurity regions 111 and 112 is made of a logic transistor having a low threshold voltage. In the same way, conductive line 115 constitutes a cell plate transistor having a low threshold voltage in a surface region of substrate area 110, wherein the concentration of the impurity is adjusted. Array power supply voltage VCCS is applied to cell plate electrode CP.

Therefore, both of the memory transistor and cell plate transistor are formed through the same process for manufacturing the logic transistor that has a low threshold voltage and is a component of the logic.

Figure 36:
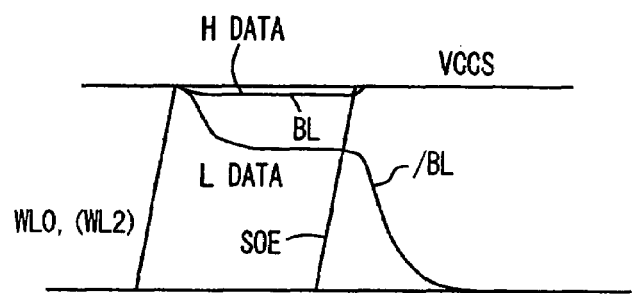
FIG. 36 is a diagram showing signal waveforms upon reading out data of the memory cells illustrated in FIG. 35.

FIG. 36 is a diagram representing signal waveforms upon reading out data of the memory cell shown in FIG. 35. It is assumed that a single word line WL0 is selected or two word lines WL0 and WL2 are simultaneously selected to read out complementary data on bit lines BL and /BL, as shown in FIG. 36. The selected word line(s) WL is/are driven up to array power supply voltage level VCCS. When an L level data is written, bit line BL is driven into a ground voltage level. The memory cell transistor enters a sufficiently deep ON state. A channel is formed between impurity regions 111 and 112. The L level data is transmitted to impurity region 112. When impurity region 112 receives the L level data, inversion layer 116 is formed in an inversion layer forming region (diffusion layer) in the substrate surface just under conductive line (cell plate electrode) 115 when the L level data is transmitted to a diffusion region (impurity region for adjusting the threshold voltage) in a cell plate transistor (that is, a transistor composed of conductive layer 115 and the capacitor insulating film and substrate surface area under the capacitor insulating film). This is because array power supply voltage VCCS is applied to conductive line 115. As a result, the L level data is stored in inversion layer 116.

On the other hand, upon writing an H level data, a signal at array power supply voltage level VSCC is transmitted to impurity region 111 through bit line BL. The selected word line(s) WL is/are driven into array power supply voltage level VCCS. In the memory cell transistor, the voltage level of impurity region 111 attains the voltage level equal to that of the gate electrode of the memory cell transistor. Thus, the inversion layer is not sufficiently formed in the channel region. Therefore, the voltage level of voltage VCCS-Vth at most is transmitted to impurity region 112, where Vth is the threshold voltage of the memory cell transistor.

In the cell plate transistor, a depletion layer is expanded from impurity region 112 to the region just under electrode interconnection line 115 by the H level data (voltage VCCS-Vth) of impurity region 112. Thus, inversion layer 116 is not sufficiently formed in the inversion layer forming region (a MOS capacitor is not formed.) Thus, inversion layer 116 is insufficiently formed, and therefore, electric charges are not sufficiently supplied in the diffusion region 116 for forming inversion (inversion forming region). As a result, the H level data cannot be stored and held by this cell plate transistor (MOS capacitor).

When the H level data is written, charges corresponding to the H level data are accumulated in a junction capacitance Cj between impurity region 112 and semiconductor substrate region 110.

Now, it is supposed that data in this memory cell (DRAM cell) are read out as shown in FIG. 36. Selected word line (sub word line) WL0 only is driven or word lines (sub word lines) WL0 and WL2 are simultaneously driven into a select state. The precharge voltage of bit line BL is at array power supply voltage level VCCS. When selected word line(s) WL (WL0 and/or WL2) is/are driven to array power supply voltage level VCCS, impurity region 112 serves as a source in the memory cell (DRAM cell) storing the L level data. Therefore, the memory cell transistor turns sufficiently into an ON state. Since inversion layer 116 is sufficiently formed, charges accumulated in the memory cell capacitor and junction capacitance Cj are read out onto the corresponding bit line BL. Thus, the voltage of this bit line significantly drops. FIG. 36 shows the signal waveform in the case that the L level data is read out onto complementary bit line /BL.

On the other hand, in the memory cell (DRAM cell) storing the H level data, the precharge voltage level of bit line BL is array power supply voltage level VCCS and is equal to the gate electrode voltage thereof. The voltage level of the impurity region 112 is also H level. Furthermore, no cell plate transistor (MOS capacitor) is formed (Inversion layer 116 is not sufficiently formed). Therefore, only the voltage of the junction capacitance Cj of impurity region 112 can be seen from the side of bit line BL. Even if the voltage of the storage node of the memory cell storing the H level data drops during the data holding period, the amount of outflow electric charges is sufficiently small if the capacitance of junction capacitance Cj is sufficiently small. Even if the voltage level of the storage node of the memory cell storing the H level data drops during holding data, the ratio of junction capacitance Cj to bit line capacitance is small when data are read out on the bit line, and a drop in the voltage of the bit line can be made sufficiently small.

As shown in FIG. 36, therefore, a voltage difference between the H level data and the L level data can be made sufficiently large so that data can be read out in the twin cell mode. Thus, a semiconductor memory device superior in data retention characteristics can be achieved.

In order to make the capacitance value of junction capacitance Cj sufficiently small, in the step of implanting impurities into sources/drains in the manufacturing process, a mask or the like is used to perform only low-concentration N (N-type) ion-implantation, in which the implantation amount of the impurity is small, to impurity region 112 in the memory array area. In this way, the capacitance value of junction capacitance Cj between impurity region 112 and substrate region 110 can be made sufficiently small.

In this case, ion implantation is performed in the surface of substrate region 110 facing to cell plate electrode conductive line 115, so as to produce a low-concentration P type (P-type) impurity region in the same way as in logic transistors. Thus, the threshold voltage of the cell plate transistor MOS capacitor) can be made small. The impurity concentration in this inversion layer forming region is made substantially equal to that of the impurity concentration in the channel region of the memory transistor. As a result, both of the memory cell transistor and the cell plate transistor are made into a MOS transistor having a low threshold voltage substantially equal to that of the logic transistors. The memory transistor and the cell plate transistor are manufactured by the same process for manufacturing the logic transistors except the ion implantation in impurity region 112 in the storage node. By the same process for manufacturing the logic transistors, transistors of peripheral circuitry are also manufactured. Therefore, the impurity concentration in impurity region 112 is made lower than that in the peripheral transistors of the peripheral circuitry.

According to the eighth embodiment, the voltage level of the selected word line (sub word line) is array power supply voltage VCCS, and a boosted word line boosting scheme for turning the memory cell transistors sufficiently into an ON state is not used. Therefore, similarly to the capacitor insulating film under cell plate electrode line 115, the gate insulating film under the memory cell transistor can be formed with the insulating film of a CMOS logic transistor having a thin gate insulating film. Thus, the memory cell array can be formed by the same manufacturing process for manufacturing the merged logic.

In the eighth embodiment of the present invention, a word line voltage non-boosting scheme is used so that no circuit for boosting a selected word lines is necessary. Thus, current consumption can be reduced.

Ninth Embodiment

Figure 37:
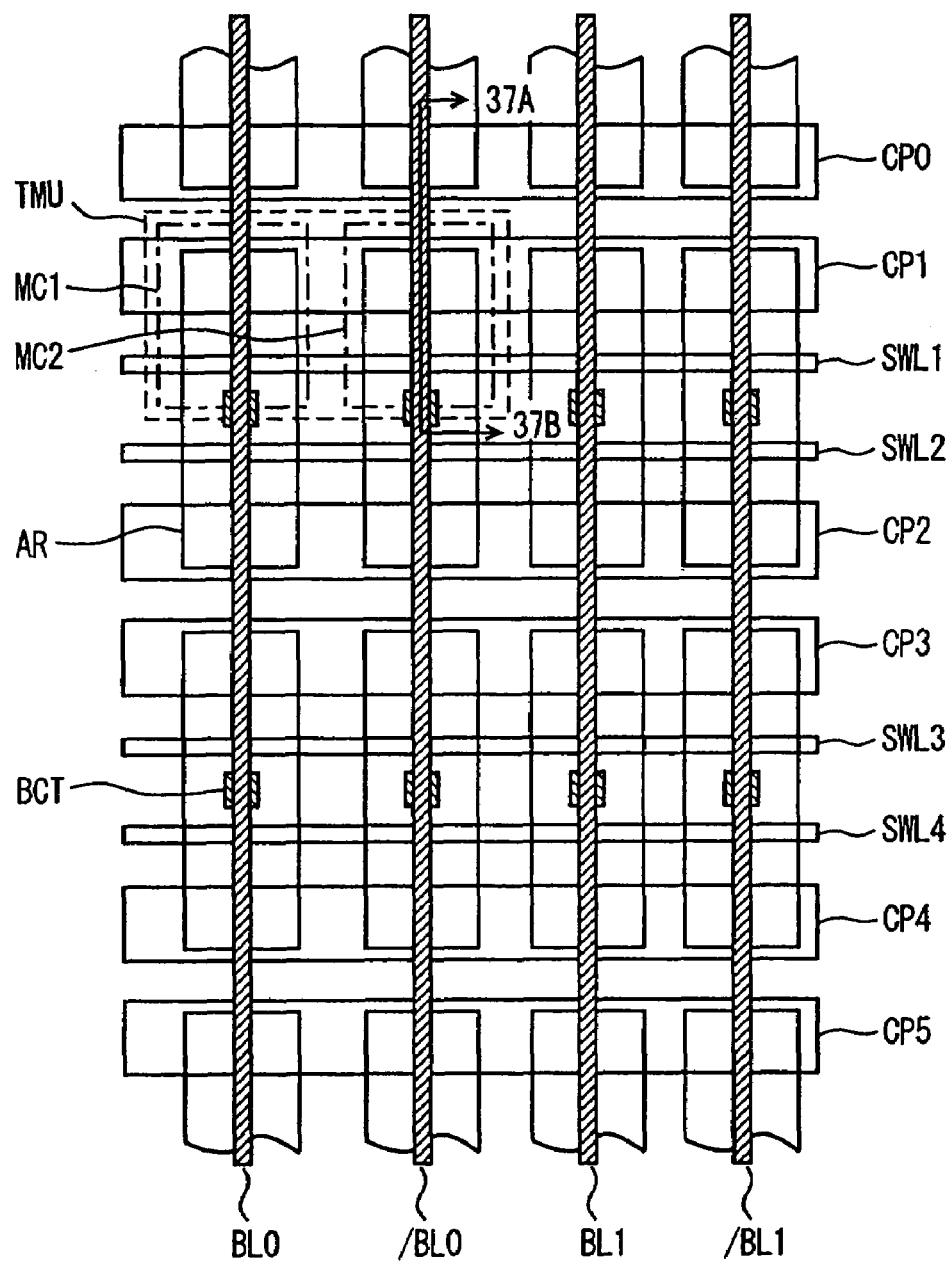
FIG. 37 is a diagram schematically showing the configuration of an array section of a semiconductor memory device according to a ninth embodiment of the present invention.

FIG. 37 is a diagram schematically showing a layout of an array section of a semiconductor memory device according to a ninth embodiment of the present invention. In the layout shown in FIG. 37, active areas AR are arranged in alignment in the column direction. In each active area AR, two memory cells adjacent in the column direction are formed.

Bit lines BL0, /BL0, BL1 and /BL1 are arranged corresponding to the areas AR arranged in alignment in the column direction. Each of bit lines BL0, /BL0, BL1 and /BL1 is connected to active area AR arranged in the corresponding column through a bit line contact BCT.

Two sub word lines SWL are arranged sandwiching bit line contacts BCT arranged in alignment in the row direction. In FIG. 37, sub word lines SW1 and SW2 are arranged sandwiching bit line contacts BCT in alignment in the row direction. Sub word lines SW3 and SW4 are arranged sandwiching bit line contacts BCT in alignment in the row direction. Therefore, two sub word lines SWL are arranged between the bit line contacts for the active areas AR adjacent in the column direction.

Cell plate electrode lines CP1, CP2, CP3 and CP4 are arranged extending in the row direction, corresponding to the respective sub word lines SWL1, SWL2, SWL3 and SWL4. The cell plate electrodes adjacent in the column. direction are isolated from each other. Cell plate electrodes CP0 and CP5 are arranged corresponding to not shown sub word lines.

The voltages of cell plate electrodes CP0-CP5 are individually controlled, as will be described later in detail. Even if the voltage level of the cell plate electrode CP arranged to a selected memory cell is changed so that bit line read out voltages are different between an L level data and an H level data in a non-boosted word line scheme, a sufficient voltage difference between the bit lines is ensured.

A twin cell unit TMU is composed of two memory cells MC1 and MC2 adjacent in the row direction to store a 1-bit data. In the case of the layout shown in FIG. 37, bit lines and BL and /BL are alternately arranged corresponding to the columns of active areas AR. One bit line is arranged at the pitch of the memory cells, and bit line contact BCT can be formed just under bit lines BL and /BL. The shown layout is "closest packing cell arrangement" similarly to the layout illustrated in FIG. 24. Therefore, the memory cells can be arranged in high density. By arranging bit lines BL and /BL adjacently to each other, a folded bit line configuration can be achieved.

In the ninth embodiment, cell plate electrodes CP are divided and arranged, corresponding to respective sub word lines SWL. Cell plate electrodes CP0-CP5 and sub word lines SWL1-SWL4 are made of the interconnection lines of the same interconnecting layer, and made of a silicon-containing material, for example, polysilicon having an impurity doped (doped polysilicon), polysilicide such as WSix and CoSix, or salicide. The interconnection lines formed in the same layer as cell plate electrodes CP0-CP5 and sub word lines SWL1-SWL4 are also used as gate electrode interconnection lines for the transistors in a CMOS logic process for forming the logic integrated with the semiconductor memory device on the same semiconductor chip. Therefore, sub word lines SW and cell plate electrodes CP are formed by the same manufacturing process for manufacturing gate electrodes of transistors of the logic integrated on the same semiconductor chip.

Figure 38:
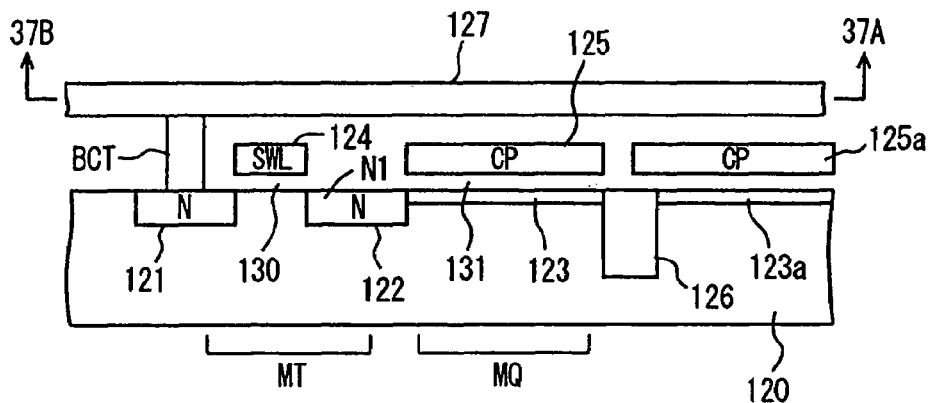
FIG. 38 is a diagram schematically showing a cross sectional structure taken along line 37A-37B in FIG. 37.

FIG. 38 is a diagram schematically showing a cross sectional configuration taken along line 37A-37B in FIG. 37. In FIG. 38, memory cells are formed in the surface of a semiconductor substrate region 120. A memory transistor MT includes impurity regions (diffusion layers) 121 and 122 formed apart from each other in the surface of semiconductor substrate region 120, and a gate electrode layer 124 formed, with a gate insulating film 130 laid under, on the surface of substrate area 120 between diffusion layers 121 and 122. Gate electrode layer 124 constitutes a sub word line SWL.

A memory capacitor MQ includes a storage node electrode layer 123 formed on the surface of semiconductor substrate region 120, and a conductive layer 125 arranged facing to storage node electrode layer 123 with a capacitor insulating film 131 interposed. A storage node electrode layer 123a of an adjacent memory cell and storage electrode layer 123 are insolated from each other by a cell isolation region 126. Cell isolation region 126 may have a trench type isolation configuration. Alternatively, a cell isolation oxide film may be formed, and the surface thereof is made flat by CMP process or the like. A conductive layer 125 and a conductive layer 125a for the cell plate electrode CP of an adjacent memory cell are isolated from each other.

The conductivity type of impurity regions 121 and 122 and the conductivity type of semiconductor substrate region 120 are appropriately determined dependently on whether memory cell transistor MT is formed of an N channel transistor or a P channel transistor. FIG. 38 shows, by way of example, the structure in which the memory cell is formed of an N channel MOS transistor and the conductivity type of impurity regions 121 and 122 is an N type.

Impurity region 121 is connected to a conductive layer 127 which is formed of, for example, a first level metal interconnection layer and constitutes a bit line, through bit line contact BCT.

First level metal interconnection line 127 constituting the bit line is formed above conductive layers 124 and 125 constituting sub word line SWL and cell plate electrode CP. Accordingly, in this memory cell array, the so-called CUB configuration is achieved. Memory cell capacitor MQ is comprised of storage node electrode layer 123 formed in the surface of semiconductor substrate area 120 and conductive layer 125 arranged facing to this storage node electrode layer 123, and has a planar capacitor configuration. Storage node electrode layer 123 may be constructed by an impurity diffusion layer formed in the surface of semiconductor substrate region 120, or may be merely constructed of substrate region 120 (the inversion layer in the surface of the substrate area serves as a capacitor electrode).

When a sub word line SWL is selected, a channel is formed between impurity regions 121 and 122. Storage node electrode layer 123 connected to impurity region 122 is electrically connected to bit line BL (conductive layer 125) through bit line contact BCT.

If the dual gate oxide film process is used to make the gate insulating film 130 just under sub word lines SWL different in thickness from capacitor insulating film 131 just under cell plate electrodes CP, it is necessary to use a mask to apply selective etching process. Thus, it is necessary to consider mask tolerance. In addition, a resist film has to be correctly exposed by an exposing ray while preventing diffused reflection upon patterning of the film. Therefore, the interval between conductive layer 124 constituting sub word lines SWL and conductive layer 125 constituting cell plate electrodes CP has to be made large. Therefore, in the case that the dual gate oxide film process is used for making gate insulating film 130 different in thickness from capacitor insulating film 131, the memory cell size increases. For this reason, gate insulating film 130 formed just under sub word lines SWL is made the same in thickness as capacitor insulating film 131 just under cell plate electrode layer CP, and the two insulating films are made by the same manufacturing process.

By using isolating region 126 having the surface height is made equal to that of semiconductor substrate region 120 to isolate the memory cells, it is possible to reduce portions projected from the surface of semiconductor substrate region 120 upwardly, to lower the height of conductive layers 125 and 125a constituting cell plate electrode layer CP, for making a step relative to the peripheral circuitry section small.

As shown in FIG. 38, therefore, it is unnecessary to add a new interconnection layer for cell plate electrode layer CP and the storage node. Since the planar capacitor configuration is used for memory cell capacitors to construct cell plate electrodes CP and sub word lines (word lines) SWL with interconnection lines on the same interconnection layer, any step between the memory array section and the peripheral circuitry section is not produced. Thus, it is unnecessary to introduce flattening (planarization) processes, such as CMP, for relaxing the step due to the capacitor electrode. The memory cell array can be formed through CMOS logic process.

Each cell plate electrode CP is arranged in pairs with sub word line SWL, and the voltages of the cell plate electrodes are changed in a unit of memory cell row.

For example, when a row active command is applied to select a row of memory cells and then a sub word line is selected, the capacitors of the two memory cells are simultaneously connected to the bit lines arranged in a pair. For example, when sub word line SWL1 is selected in FIG. 37, the storage nodes of memory cells MC1 and MC2 are connected to bit lines BL0 and /BL0, respectively, so that memory data in memory cells MC1 and MC2 are read out onto the corresponding bit lines BL0 and /BL0. Memory cells MC1 and MC2 constitute twin cell unit TMU. The H level data is stored in one of the cells, and the L level data is stored in the other.

Sense amplifier connected to the pair of bit lines BL and /BL differentially amplifies a voltage difference $\Delta Vb1$ between the corresponding bit lines BL0 and /BL0 or BL1 and /BL1. The voltage difference $\Delta Vb1$ is represented by the following expression:

$$\Delta Vb1 = Cs \cdot (V(SN,H) - V(SN,L))/(Cs+Cb),$$

where Cs represents the capacitance of memory cell capacitor MQ, Cb represents the parasitic capacitance of each of bit lines BL and /BL, V(SN, H) represents the voltage of the storage node storing the H level data, and V(SN, L) represents the voltage of the storage node storing the L level data, By the sense operation of this sense amplifier, the bit line connected to the memory cell storing the H level data is driven to array power supply voltage level VCCS and the bit line connected to the memory cell storing the L level data is driven to the ground voltage level (0 V).

As shown in FIG. 38, the planar capacitor is a MOS capacitor having a gate electrode thereof serving as cell plate electrode CP. By forming an inversion layer in the surface of this semiconductor substrate region (Si: silicon), a desired capacitance can be ensured. Capacitor insulating film 131 is a thin insulating film which is identical to gate insulating film 130 of the memory cell transistor. From the viewpoint of the reliability of capacitor insulating film 131, it is desired that a voltage VCP applied to cell plate electrode CP does not exceed the array power supply voltage VCCS. Here, the memory transistor is formed of a logic transistor manufactured through the same process for manufacturing the transistors of the logic and a non-boosted word line scheme is employed. The voltage of the sub word line is at the level of the array power supply voltage when selected.

In order to form an inversion layer easily in storage node electrode layer 123, it can be considered that "capacitor dope" process may be adopted, in which an N type impurity and a P type impurity are counter-doped to the inversion forming region for an NMOS type memory cell and for a PMOS type memory cell, respectively. The NMOS type memory cell is a memory cell having an access transistor formed of an N channel MOS transistor, and its semiconductor substrate region is a P type semiconductor substrate region. As for the PMOS type memory cell, the conductivity types thereof are reversed with respect to PMOS memory cell.

When a MOS capacitor is used in the logic integrated with the semiconductor memory device on the same semiconductor chip, the impurity regions are interconnected to a predetermined voltage source (the power supply voltage or the ground level) dependently on the voltage level of the gate electrode. The gate to source voltage of MOS capacitor in the logic is a logic power supply voltage level in absolute value, and an inversion layer can easily be formed. Therefore, standard CMOS logic process for forming such logic does not particularly include the step of performing "capacitor dope" process for forming the inversion layer. Consequently, if such "capacitor dope" process is applied to memory cell capacitors in the manufacturing process for forming the logic and semiconductor memory cells on the same semiconductor chip, it is necessary to additionally perform the "capacitor dope" process which is not included in the CMOS logic process for forming the logic. Thus, a problem that the cost for wafer process increases arises.

When such "capacitor dope" process is performed, it is required, for the following reasons, to make the distance between conductive layer 124 constituting the sub word line and conductive layer 125 constituting the cell plate electrode longer than a predetermined value.

Figure 39:
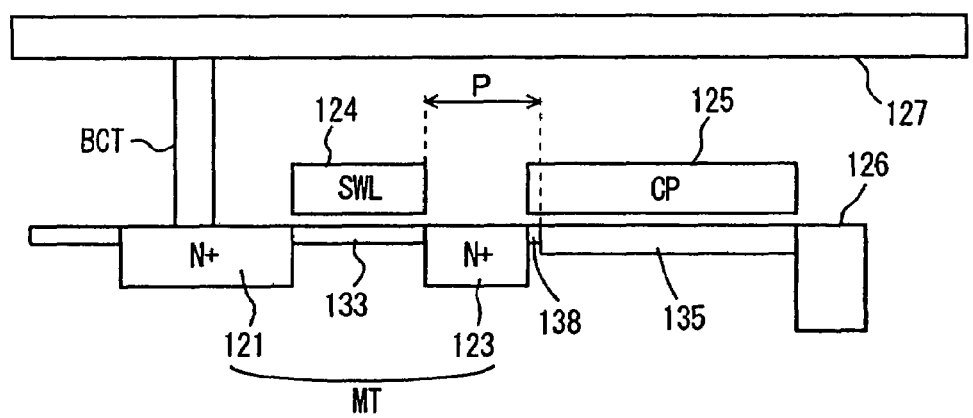
FIG. 39 is a diagram schematically showing relationship between an inversion layer forming area and the interval between a sub word line and a cell plate electrode.

FIG. 39 is a diagram schematically showing the impurity implanting region in the capacitor dope process. In FIG. 39, the same reference numerals are attached to the components corresponding to those of the memory cells shown in FIG. 38, and detail description thereof is omitted.

In the case of an NMOS type memory cell MT, the channel dope process for adjusting the threshold voltage of the access transistor of the memory cell is performed on the entire surface of the memory cell array.

However, it is necessary to perform the capacitor dope process not on the channel region of the memory cell transistor but on the storage node region thereof. There is a restriction that it is necessary to prevent any effect on the characteristics of NMOS memory cell transistor MT. It is therefore necessary that the distance P between conductive layer 124 constituting sub word line WL and conductive layer 125 constituting cell plate electrode CP is kept a predetermined value or more. In ion implantation onto this storage node region, the following has to be prevented: the implanted impurity diffuses through a channel region 133 in the lateral direction in heat treatment or annealing process, to vary the impurity concentration profile in the channel region 133 to lead to the variation of the characteristics of access transistor MT.

As shown in FIG. 39, if the capacitor dope process is performed under the sate that the distance between conductive layer 124 constituting sub word line SWL and conductive layer 125 constituting cell plate electrode CP is made smaller than the predetermined value P, there exists the region 138 where the capacitor dope is not performed in the storage node region, because the impurity implantation is performed while this distance P is kept. Therefore, this storage node region includes the region where an inversion layer is formed by counter-doping (capacitor dope region) 135 and the region 138 where no counter-doping is performed so that an inversion layer is not easily formed. Thus, such a problem arises that the capacitance of the MOS capacitor cannot be sufficiently made high.

Even if capacitor dope region 135 is not formed, the voltage of a node N1 (impurity region 123) is the ground voltage (0 V) with respect to the memory cell where an L level data is written in the twin cell mode of storing 1-bit data by two memory cells. The gate to source voltage of the MOS capacitor constituting this memory cell capacitor is at a level of a cell plate voltage VCP (array power supply voltage level). As a result, an inversion layer is formed in the semiconductor substrate region and a capacitor having a desired capacitance is ensured for the memory cell capacitor.

On the other hand, in the memory cell where an H level data is written, the voltage level of node N1 is at a level of VCCS−ΔV, where ΔV indicates the voltage drop due to the threshold voltage loss of the access transistor by non-boosting of sub word line SWL.

Figure 40:
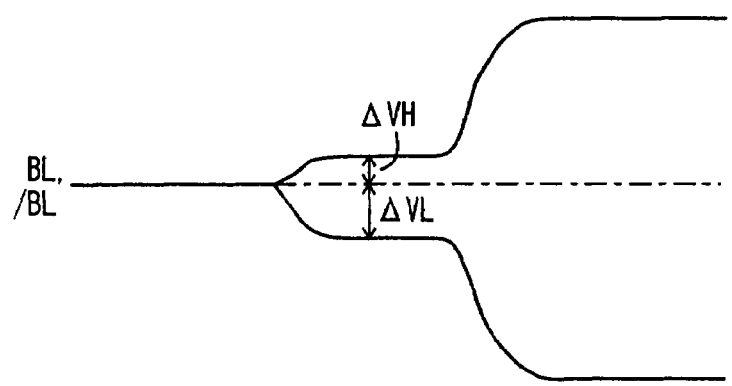
FIG. 40 is a diagram schematically showing bit line read out voltage in the configuration illustrated in FIG. 39.

In this case, the gate to source voltage of the MOS capacitor constituting the memory cell capacitor assumes VCP−(VCCS−ΔV). Thus, in storage node region 123, an inversion layer cannot be sufficiently formed and therefore, a desired capacitance of the memory cell capacitor cannot be ensured. Accordingly, in the case that the H level data is stored, a sufficient amount of charges cannot be accumulated in the storage node. As shown in FIG. 40, a read out voltage ΔVH on the bit line when the H level data is read out is smaller than a read out voltage ΔVL when the L level data is read out. Read out voltages ΔVH and ΔVL when the H level data and the L level data are read out are represented by the following expressions, respectively:

$$\Delta VH = Csh \cdot (V(SN,H) - (VCCS)/2)(Csh + Cb), \quad (1)$$

$$\Delta VL = Csl \cdot (VCCS/2 - V(SN,L))/(Csl + Cb), \quad (2)$$

where Csh and Csl represent the capacitance values of the memory cell capacitor in reading out the H level data and the L level data, respectively. The precharge voltage of the bit lines is ½ of array power supply voltage VCCS.

At the time of reading out memory cell data, therefore, the effective readout voltage ΔVH+ΔVL for the sense amplifier becomes smaller than the read out voltage difference expected in the twin cell mode. In the ninth embodiment, as a configuration for ensuring a sufficient read out voltage difference in the non-boosted sub word line scheme, the cell plate voltage is changed for each selected row to change the voltage level of the storage node. Now, the configuration for controlling the cell plate voltage according to the ninth embodiment will be described in the following.

Figure 41:
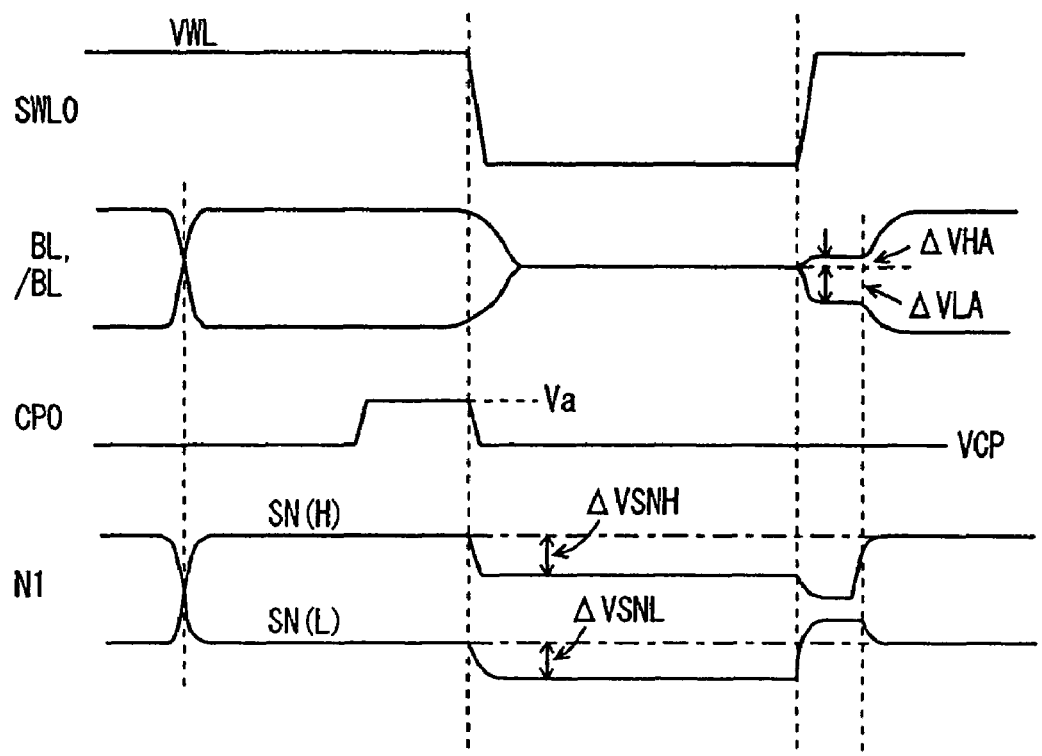
FIG. 41 is a waveform diagram representing an operation of a semiconductor memory device according to the ninth embodiment of the present invention.

FIG. 41 is a waveform diagram representing the operation in controlling the cell plate voltage in the ninth embodiment of the present invention. Sub word line SWL0 is selected. The voltage of the selected sub word line SWL0 is driven to a voltage level VWL. Data in the memory cell connected to sub word line SWL0 are read out onto bit lines BL and /BL, and then sensing operation is performed. When the data are written subsequently, the voltage level of storage node N1 of this memory cell changes dependently on the written data. Storage node N1 storing the H level data attains a voltage level SN(H) while storage node N1 of the memory cell storing the L level data attains a voltage level SN(L).

After the completion of this writing of the data, or after the completion of data-readout in the operation of reading out the data, the voltage level of cell plate electrode CP0, which is paired with selected sub word line SWL0, is raised from the prescribed voltage VCP to a predetermined voltage level Va. In the state that the voltage of cell plate electrode CP0 is raised, the corresponding memory cell is connected to the sense amplifier through the bit line and the voltage level of storage node N1 does not change.

When sub word line SWL0 is driven into a non-select state, for example, at the ground level after the access cycle is completed, the voltage of cell plate electrode CP0 is recovered to voltage level VCP, which is the original prescribed voltage. In the memory cell, sub word line SWL0 attains the ground voltage level and the access transistor thereof is in a non-conductive state. Therefore, storage node N1 is in an electrically floating state. In response to the voltage drop of cell plate electrode CP0, the voltage level of storage node N1 drops through capacitance coupling. In FIG. 41, the voltage level of storage node N1 storing the H level data drops by $\Delta$VSNH, and the voltage level of storage node N1 storing the L level data drops by $\Delta$VSN.

When sub word line SWL0 is selected, read out voltages $\Delta$VHA and $\Delta$VLA appearing on bit lines BL and /BL are represented by the following expressions:

$$\Delta VHA = \Delta VH - Csh \cdot \Delta VSNH/(Csh+Cb), \text{ and}$$

$$\Delta VLA = \Delta VL - Csl \cdot \Delta VSNL/(Csl+Cb),$$

where $\Delta$VH and $\Delta$VL are the read out voltages represented by the above-mentioned expressions (1) and (2), respectively.

Consequently, the effective read out voltage $\Delta$VHA+$\Delta$VLA for the sense amplifier changes by the amount represented by the following expression:

$$Csl \cdot \Delta VSNL/(Csl+Cb) - Csl \cdot \Delta VSNH/(Csh+Cb).$$

Because of Csl>> Csh, the second term of this read out voltage difference can be neglected. Thus, a read out voltage $\Delta$V can be substantially represented by the following expression:

$$\Delta V = \Delta VH + \Delta VL + \Delta VSNL/(Csl+Cb).$$

Therefore, the read out voltage can be increased substantially by Csl·$\Delta$VSNL/(Csl+Cb).

Therefore, even when a non-doped planar capacitor is used as the memory cell capacitor, reduction in effective utilization efficiency of this memory cell capacitor can be prevented so that a sufficiently large read out voltage difference can be ensured.

In the operation waveform shown in FIG. 41, data writing operation to a selected memory cell is shown. However, this is also true for the memory cell from which data are read out. Storage node N1 of the memory cell constituting a twin cell unit is set to voltage SN(H) or SN(L), dependently on the storage data.

Figure 42:
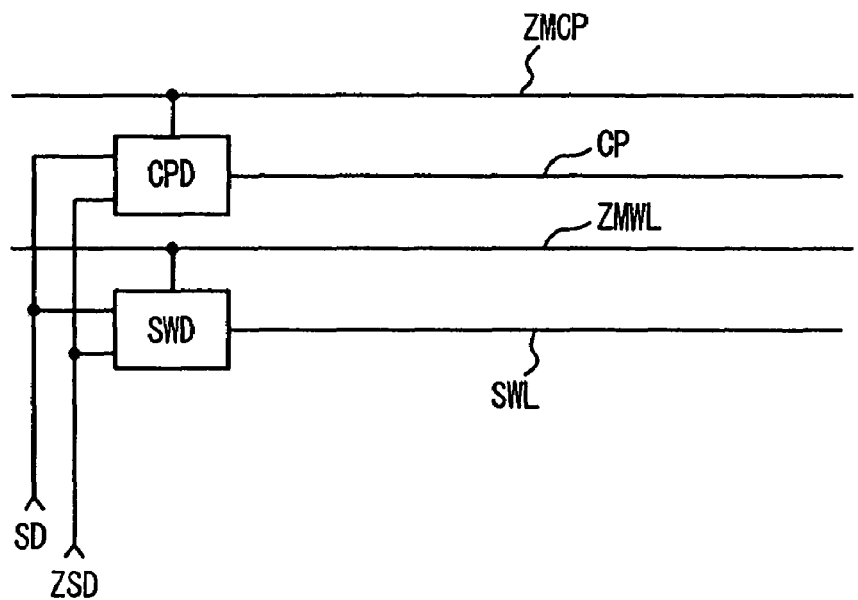
FIG. 42 is a diagram schematically showing a configuration of a main portion of the semiconductor memory device according to the ninth embodiment of the present invention.

FIG. 42 is a diagram schematically showing the configuration of a section for driving the cell plate electrodes and the sub word lines. In FIG. 42, a sub word driver SWD is provided to sub word line SWL, and a cell plate electrode driver CPD is provided to cell plate electrode CP. Sub word driver SWD drives sub word line SWL into a select state in accordance with sub decode signals SD and ZSD and a signal on a corresponding main word line ZMWL. On the other hand, cell plate electrode driver CPD changes the voltage level of cell plate electrode CP in accordance with a signal on the corresponding main cell plate line ZMCP and sub decode signals SD and ZSD. The amplitudes of sub decode signals SD and ZSD are at the level of the peripheral power supply voltage or the array power supply voltage and is not boosted to high voltage VPP level. In other words, as the manner for driving sub word line SWL, a non-boosted word line driving scheme is used.

Single main word line ZMWL is provided for sub word lines of plural rows, and single main cell plate line ZMCP is provided for cell plate electrodes CP of plural rows. Main word line ZMWL and main cell plate line ZMCP are arranged corresponding to each other, for example, in the same interconnection layer. On the other hand, sub word lines SWL are formed in the same interconnection layer as cell plate electrodes CP.

When main word line ZMWL is driven into a select state and sub word line SWL is driven into a select state in accordance with sub decode signals SD and ZSD, main cell plate line ZMCP is driven into a select state with delay of a certain time so that cell plate electrode driver CPD changes the voltage level of the corresponding cell plate electrode CP. When main word line ZMWL is driven into a non-selected state, main cell plate line ZMCP is also driven into a non-selected state so that cell plate electrode driver CPD transmits the prescribed voltage VCP to the corresponding cell plate electrode CP. After selected sub word line SWL is driven into the non-selected state, the voltage level of cell plate electrode CP returns to the original voltage level. Consequently, the voltage of storage node N1 drops through capacitance coupling.

In the case that the memory cell transistor is formed of a P channel MOS transistor, the semiconductor substrate region is an N type substrate region. Thus, the direction along which cell plate voltage VCP is driven is reversed with respect to that for the N channel MOS memory cell transistor.

Figure 43:
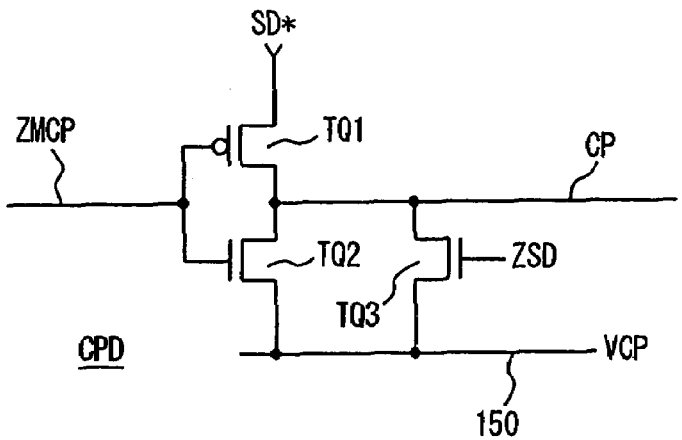
FIG. 43 is a diagram showing an example of the configuration of a cell plate driver showing in FIG. 42.

FIG. 43 is a diagram showing an example of the configuration of cell plate driver CPD shown in FIG. 42. In FIG. 43, cell plate electrode driver CPD includes a P channel MOS transistor TQ1 for transmitting, to cell plate electrode CP, a sub decode signal SD* obtained by level-converting sub decode signal SD into the voltage level Va in accordance with a signal on main cell plate line ZMCP, an N channel MOS transistor TQ2 for transmitting, to cell plate electrode CP, cell plate voltage VCP on a cell plate voltage transmitting line 150 in response to a signal voltage on main cell plate line ZMCP, and an N channel MOS transistor TQ3 for connecting cell plate voltage transmitting line 150 to cell plate electrode CP in accordance with complementary sub decode signal ZSD.

Cell plate voltage VCP of a predetermined voltage level generated from VCP generating circuit shown in FIG. 1 is transmitted to cell plate voltage transmitting line 150.

When the corresponding sub word line is driven into a selected state, sub decode signal SD is at H level and complementary sub decode signal ZSD is at L level. When main cell plate line ZMCP is driven into L level of a selected state in this state, P channel MOS transistor TQ1 turns on so that level converted sub decode signal SD* is transmitted to cell plate electrode CP. At this time, MOS transistors TQ2 and TQ3 are in nonconductive states and cell plate electrode CP provided to the memory cells in the selected row is isolated from cell plate voltage transmitting line 150. In the configuration in which cell plate voltage transmitting line 150 transmits cell plate voltage VCP in common to the memory cells connected to the non-selected sub word lines in the memory array as well, a voltage at the peripheral power supply voltage level can be transmitted to cell plate electrode CP without causing any adverse effect on cell plate voltage VCP.

When main cell plate line ZMCP attains H level, MOS transistor TQ 1 turns into a nonconductive state and MOS transistor TQ2 turns into a conductive state. Thus, cell plate voltage VCP on cell plate voltage transmitting line 150 is transmitted to cell plate electrode CP.

When main cell plate line ZMCP is in the non-selected state of H level and the level converted sub decode signal SD* is at L level, complementary sub decode signal ZSD is at H level so that cell plate voltage transmitting line 150 is connected to cell plate electrode CP. Accordingly, cell plate voltage VCP is reliably transmitted from cell plate voltage transmitting line 150 to the cell plate electrodes CP provided for the memory cells in the non-selected rows.

In the configuration of cell plate electrode driver CPD shown in FIG. 43, cell plate voltage VCP is assumed to be at the voltage level of a half of array power supply voltage level VCCS. Therefore, even if complementary sub decode signal ZSD is at H level of the peripheral power supply voltage level, cell plate voltage VCP can reliably be transmitted to cell plate electrode CP.

Even if cell plate voltage VCP is array power supply voltage level VCCS, array power supply voltage VCCS can reliably transmitted to cell plate electrode CP with the following conditions: sub decode signals SD and ZSD are signals each having the amplitude of peripheral power supply voltage VCCP, and a voltage difference between array power supply voltage VCCS and peripheral power supply voltage VDDP is greater than the absolute values of the threshold voltages of MOS transistors TQ2 and TQ3.

In the block division configuration of the memory array, sub decode signals SD* and ZSD are driven by a sub decode driver arranged at the crossing section (cross band) between the sense amplifier band where the sense amplifiers are arranged and the sub word driver band where the sub word drivers are arranged. It is therefore necessary that level converted sub decode signal SD* drives both of the sub word line and the cell plate electrode, and it is necessary to make the driving power of the sub word driver large. However, by making large the driving capability of the sub decode driver arranged at the cross band and having a level conversion function, the voltage level of cell plate electrode CP arranged corresponding to a selected row can also be changed dependently on the selected sub word line. Particularly, because no memory cell is connected to cell plate electrode CP, the capacitance thereof can be made small and a large driving power is not required for the sub decode driver.

If the non-boosted word line scheme is employed, the sub decode signal at the array power supply voltage or the peripheral power supply voltage is transmitted. In this configuration, a level converter for level converting the sub decode signal SD is provided for driving the cell plate electrode, and the sub decoder for generating the sub decode signal is not required to drive the sub word line and the cell plate electrode. Such level converter can be arranged at the cross band.

For a main cell plate line driver for driving main cell plate line ZMCP, the same configuration as that of the main word driver for driving main word line ZMWL can be used. Only by making different the driving timing of the main cell plate line driver from the activating timing of the main word driver for driving the main word line, main cell plate line ZMCP can be driven into a selected state in the same manner as main word line ZMWL. By using the delay signal of a main word driver activating signal as an activating signal for the main cell plate line driver, the main cell plate line can easily be driven into a select state at a desired timing.

Figure 44:
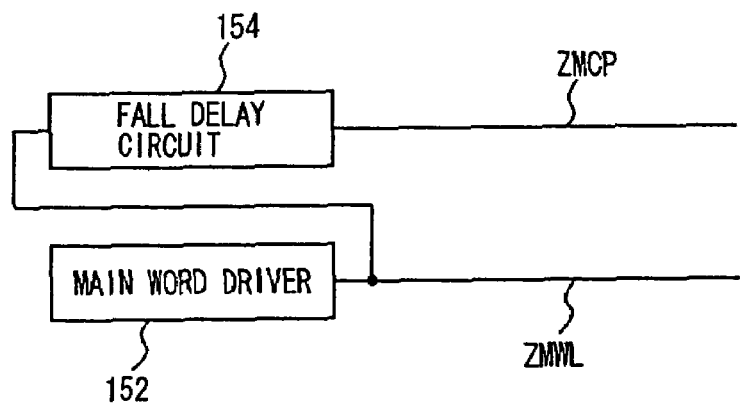
FIG. 44 is a diagram schematically showing an example of the configuration of a circuit for driving main cell plate lines illustrated in FIGS. 42 and 43.

FIG. 44 is a diagram showing another configuration of the main cell plate line driver. In FIG. 44, main word line ZMWL is driven by a main word driver 152. On the other hand, main cell plate ZMCP is driven by a fall delay circuit 154 that receives output signals of main word driver 152.

Main word driver 152 drives a corresponding main word line ZMWL into the level of the ground voltage when the corresponding main word line ZMWL is in a selected state. Therefore, by using fall delay circuit 154, main cell plate line ZMCP is driven into a selected state after a predetermined time passes from the time when main word line ZMWL is driven into a selected state. Although it is necessary to increase the output driving power of main word driver 152, it is unnecessary to provide a decoding circuit for selecting main cell plate line ZMCP separately from a main row decoder for decoding the main word line address. Thus, circuit occupancy area can be reduced.

The voltage level of cell plate electrode CP is changed after the access transistor of the memory cell turns into a nonconductive state. The voltage level of the storage node is then changed through capacitance coupling. Consequently, sub decode signals SD* and ZSD to main cell plate line ZMCP and the cell plate electrode are driven into a non-selected state at a slightly later timing than signals for the sub word lines. This can easily realized by using appropriate interconnection delay or gate delay.

Figure 45:
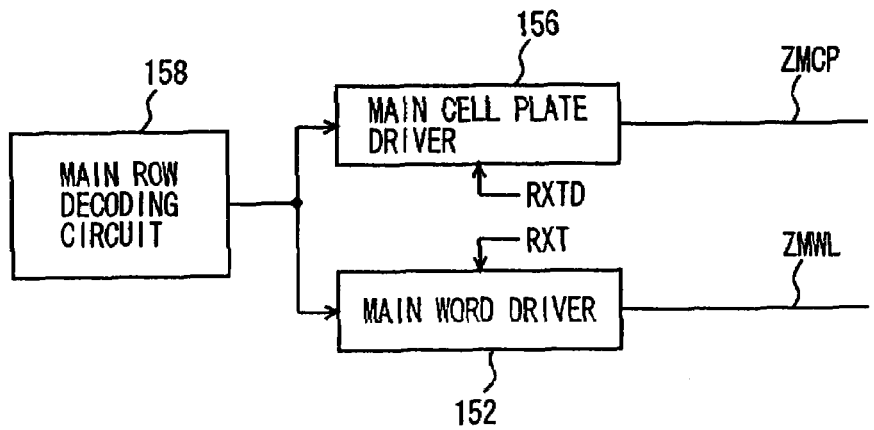
FIG. 45 is a diagram schematically showing a modification of the main cell plate driving section.

FIG. 45 is a diagram showing a further configuration of the main cell plate line selecting circuit. In the configuration shown in FIG. 45, main cell word line ZMWL is driven by main word driver 152, and main cell plate line ZMCP is driven by main cell plate driver 156. Main word driver 152 drives the corresponding main word line ZMWL into a selected state in response to the activation of a main word line driving timing signal RXT while a main cell plate driver 156 drives the corresponding main cell plate line ZMCP into a selected state in accordance with a cell plate line driving timing signal RXTD.

A main row decoding circuit 158 is provided in common to main word driver 152 and main cell plate driver 156. A main word line designating signal from main row decoding circuit 158 is applied in common to main word driver 152 and main cell plate driver 156.

The activating timing of main cell plate driving timing signal RXTD is made later than that of main word line driving timing signal RXT. In this way, main cell plate line ZMCP can be driven into a selected state only in a predetermined time period at a precise timing. Since main word driver 152 is required only to drive main word line ZMWL, main word line ZMWL can be driven into a selected state at a high speed.

Figure 46:
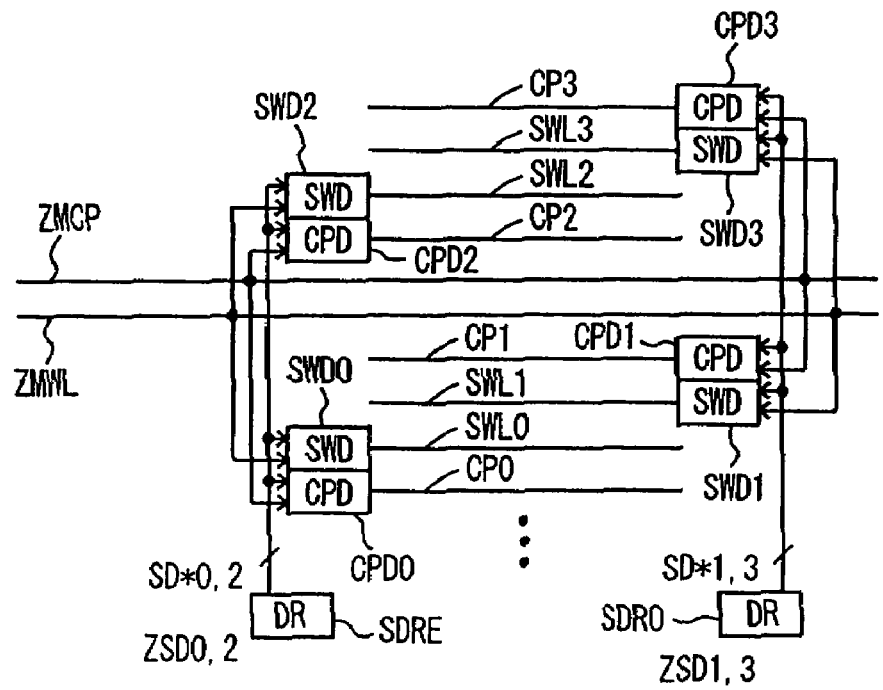
FIG. 46 is a diagram schematically showing the configuration of a sub word driver band of the semiconductor memory device according to the ninth embodiment of the present invention.

FIG. 46 is a diagram schematically showing an example of the arrangement of the sub word lines and the cell plate electrodes. In FIG. 46, main word line ZMWL and main cell plate line ZMCP are arranged extending in the row direction. Sub word lines SWL0-SWL3 are arranged corresponding to main word line ZMWL, and cell plate electrodes CP0-CP3 are arranged corresponding to main cell plate line ZMCP. Sub word drivers SWD0-SWD3 are arranged corresponding to sub word lines SWL0-SWL3, and cell plate electrode drivers are arranged corresponding to cell plate electrodes CP0-CP3. Adjacently to the cell plate electrode and the sub word line arranged in a pair, corresponding drivers SWD and CPD are arranged.

In a not shown sense amplifier band, sub decode drivers SDRE and SDRO are arranged corresponding to sub word driver bands. Sub decode driver SDRE generates sub decode signals SD*0, SD*2, ZSD0 and ZSD2, and sub decode driver SDRO generates sub decode signals SD*1, SD*3, ZSD1, and ZSD3.

In the arrangement shown in FIG. 46, therefore, it is merely required that cell plate driver CPD is arranged at the crossing section of the sub word driver band and the sense amplifier band. Thus, cell plate electrode driver CPD can easily be arranged without changing the layout.

Cell plate voltage transmitting line 150 for transmitting cell plate voltage VCP may be arranged in the same interconnecting layer as main word line ZMWL and main cell plate line ZMCP. In the arrangement of this cell plate voltage transmitting line, it is merely required that the array power supply voltage line for transmitting power supply voltage to the sense amplifiers in the sense amplifier does not butt with the interconnection line for the cell plate voltage.

In the arrangement shown in FIG. 46, the sub decode drivers SDRE and SDRO generate the level converted sub decode signals SD*. However, the non-boosted word line scheme is employed, the sub decode drivers SDRE and SDRO are required to generate the non-boosted sub decode signal SD and the level converted sub decode signal SD* for the sub word line and for the cell plate line, respectively.

Modification 1

Figure 47:
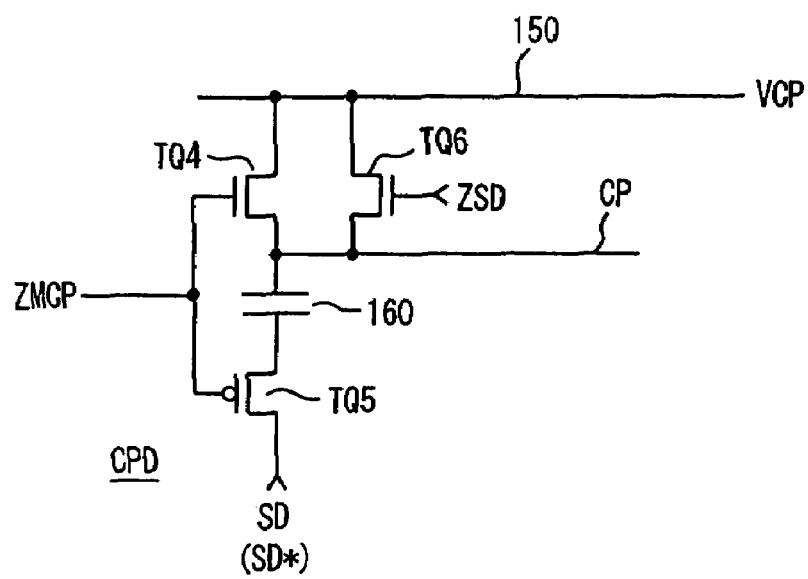
FIG. 47 is a diagram showing a modification of the cell plate driver.

FIG. 47 is a diagram showing the configuration of a modification 1 of the cell plate electrode driver. In FIG. 47, cell plate electrode driver CPD includes an N channel transistor TQ4 rendered conductive, when a signal on main cell plate line ZMCP is at H level, for connecting cell plate electrode line CP electrically to cell plate voltage transmitting line 150, a capacitance element 160 connected to cell plate electrode CP, a P channel transistor TQ5 rendered conductive, when a signal on main cell plate line ZMCP is at L level, for transmitting a level converted sub decode signal SD* to capacitance element 160 when made conducive, and an N channel MOS transistor TQ6 rendered conductive, when complementary sub decode signal ZSD is at H level, for connecting cell plate electrode CP to cell plate voltage transmitting line 150.

Cell plate electrode CP is arranged corresponding to the memory cells in one row in a corresponding memory block. However, cell plate electrode CP is an electrode layer facing to the storage node of the memory cell capacitor, and has no gate capacitance connected thereto, but only an interconnection parasitic capacitance is present thereon. Therefore, by setting the capacitance of capacitance element 160 to an appropriate value, the voltage level of cell plate electrode line CP can be raised by charge pumping operation of capacitance element 160 when level converted sub decode signal SD* attains H level.

In other words, in the configuration of cell plate electrode driver CPD shown in FIG. 47, when a signal on main cell plate line ZMCP is at H level, MOS transistor TQ4 is rendered conductive and cell plate voltage transmitting line 150 is electrically connected to cell plate electrode CP so that cell plate electrode CP is kept at the predetermined level of cell plate voltage VCP. At this state, MOS transistor TQ5 is in a nonconductive state, and level converted sub decode signal SD* causes no effect on cell plate voltage CP.

On the other hand, when the signal on main cell plate line ZMCP turns L level, MOS transistor TQ5 enters a conductive state and MOS transistor TQ4 enters a nonconductive state. When sub decode signal SD turns H level in this state, complementary sub decode signal ZSD is at L level and MOS transistor TQ6 enters a nonconductive state. The voltage level of cell plate electrode CP rises up through the charge pumping operation of capacitance element 160. When sub decode signal SD* turns L level, cell plate electrode CP returns to the original voltage level through the charge pumping operation of capacitance element 160. If the timing of the deactivation of level converted sub decode signal SD* is set such that the deactivation is subsequent to the deactivation of the main word line, the voltage level of the storage node can be lowered after the memory transistor in a selected memory cell turns nonconductive. In this case, however, it is required that main cell plate line ZMCP is in a selected state. It is sufficient for achieving such control of the deactivation that main cell plate ZMCP is driven into a non-selected state at a timing later than main word line ZMWL is driven into a non-selected state.

On the other hand, when a signal on main cell plate line ZMCP is at L level and sub decode signal SD is at L level, complementary sub decode signal ZSD is at H level and MOS transistor TQ6 turns conductive. Therefore, even if MOS transistor TQ5 is in a nonconductive state in this state, cell plate electrode CP is electrically connected to cell plate voltage transmitting line 150 and the cell plate electrode CP is kept at cell plate voltage level VCP.

In the case that the configuration shown in FIG. 47 is used, the voltage of cell plate electrode CP can be raised to a desired level dependently on the relationship between the capacitance value of capacitance element 160 and the interconnection capacitance of cell plate electrode CP. Although the level converted sub decode signal SD* is used, sub decode signal SD before the level conversion may be used. The voltage level of the sub decode signal should be set dependently on the capacitance of cell plate electrode CP and the capacitance of capacitance element 160.

In the above-mentioned configuration shown in FIG. 47, the cell plate electrode is arranged corresponding to the sub word line. Each of cell plate electrode driver CPD changes the voltage of the cell plate electrode. for each memory cells on a selected row. The voltages of the storage nodes of the necessary minimum memory cells are changed so that current consumption can be reduced. Because the selected memory cells store valid data and therefore, the voltages of the storage nodes of only the selected memory cells are changed. Non-accessed memory cells do not store valid data. Even if the voltages level of the data in these non-accessed memory cells are changed, the stored data are invalid data. Thus, only useless power is consumed. In order to reduce such power consumption, the cell plate voltage is changed for each memory cells on a selected row.

However, in the case of a block division configuration in which the memory array is divided into plural blocks and driving into a selected/non-selected state is performed in a unit of a memory block, the cell plate electrode may be changed in a unit of a memory block. In this case, power consumption increases. However, the access transistors of the memory cells connected to a non-selected row are in a non-conductive state. Therefore, even if cell plate voltage VCP changes so that the voltage level of the corresponding storage node SN (node N1) rises, the voltage of the storage node returns to the original voltage level when the voltage of the cell plate electrode returns again to the original voltage level. As a result, the amount of charges accumulated in the storage node-of a non-selected memory cell does not change.

Therefore, even if the cell plate electrode is driven for each memory block, no problems are caused except for issues associated with power consumption and response speed. In the case that the cell plate electrode is driven in a unit of a memory block, it is merely required that the cell plate electrode driver is arranged for each memory block. The cell plate voltage can be controlled in accordance with a block selecting signal for specifying a memory block. Thus, the circuit configuration for controlling the cell plate voltages is made simple and circuit occupancy area can be reduced.

As described above, according to the ninth embodiment, the cell plate voltages of the memory cells are changed. Therefore, even with a non-boosted sub word line scheme, a sufficient read out voltage difference can be produced between the corresponding bit lines even if the capacitance of the capacitor in the memory cell having a planar capacitor configuration is effectively reduced.

Tenth Embodiment

Figure 48:
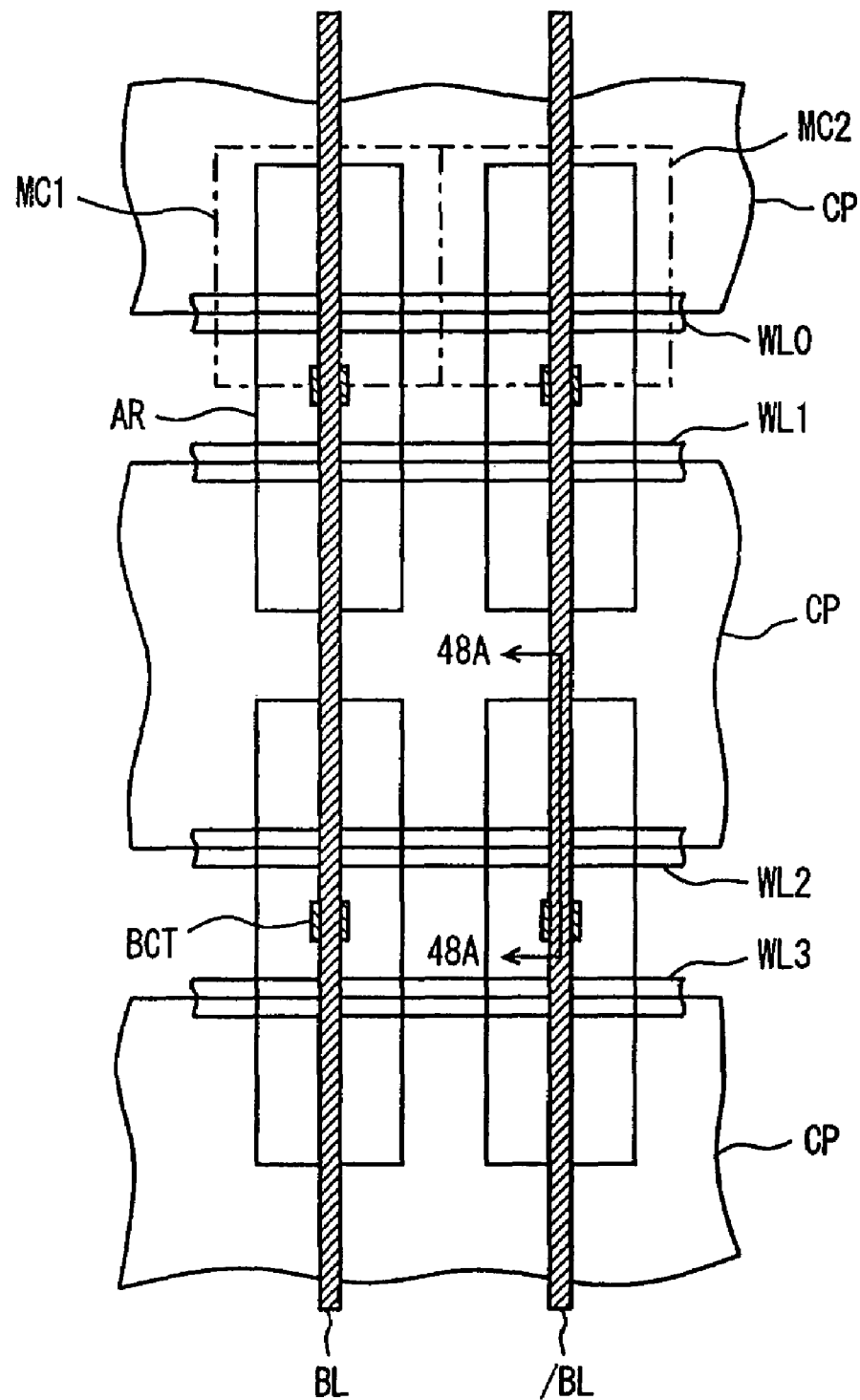
FIG. 48 is a diagram schematically showing a layout of a memory cell array of a semiconductor memory device according to a tenth embodiment of the present invention.

FIG. 48 is a diagram schematically showing the configuration of an array section of a semiconductor memory device according to a tenth embodiment of the present invention. In FIG. 48, active areas AR for forming 2-bit memory cells that are adjacent and in alignment in the column direction are arranged in alignment in the column direction. Each of bit lines BL and /BL is arranged corresponding to each column of active areas AR. Each of bit lines BL and /BL is electrically connected to the active areas in the corresponding column through bit line contacts BCT. The active areas adjacent in the column direction are isolated from each other by a cell isolation region.

Two word lines are arranged in a pair to sandwich bit line contacts BCT arranged in alignment in the row direction. In FIG. 48, word line WL0 and WL1 are arranged sandwiching bit line contacts BCT aligned in the row direction, and word lines WL2 and WL3 are arranged sandwiching bit line contacts BCT aligned in the row direction and extending in the row direction. Word lines WL (WL0-WL3) are formed of interconnection lines of a first level polysilicon interconnection layer.

Cell plate electrodes CP are formed of interconnection lines of a second level polysilicon interconnection layer. Cell plate electrodes CP constitute one-side electrodes of planar capacitors of memory cell capacitors, which will be described later.

Cell plate electrodes CP are formed into a division configuration in which they are separated from each other in the column direction in the memory cell array. However, cell plate electrodes CP are formed of interconnection lines of the interconnection layer different from the interconnection layer for word lines WL (WL0-WL3) and therefore, each cell plate electrode CP is formed overlapping partially with a corresponding word line WL. By forming cell plate electrodes CP so as to overlap partially with the corresponding word lines WL, the areas of storage node regions facing to cell plate electrodes CP can be made as large as possible. Moreover, the interval between each cell plate electrode CP and the corresponding sub word line SWL (word line WL) can be made short. It is also unnecessary to consider boundaries of the sub word lines at upon patterning of the cell plate electrodes, to make the patterning easy.

A twin cell unit is composed of memory cells MC1 and MC2 adjacent in the row direction, and a 1-bit data is stored by these two memory cells MC1 and MC2.

Figure 49:
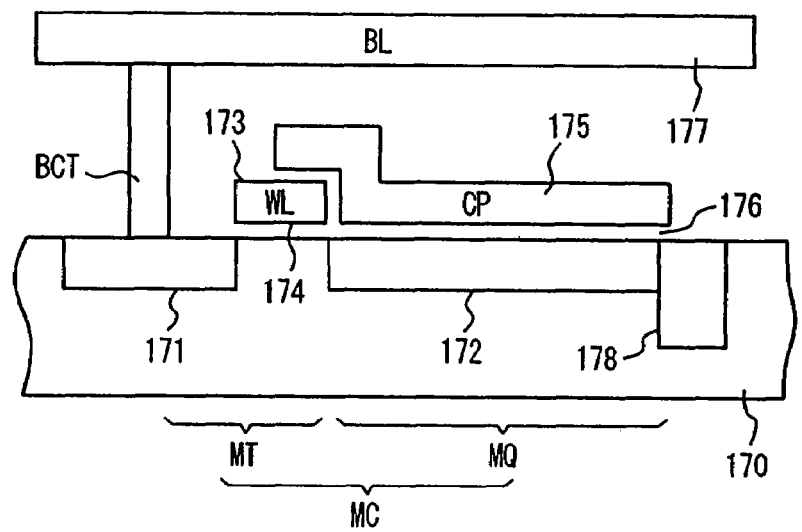
FIG. 49 is a diagram schematically showing a cross sectional structure taken along line 48A-48A in FIG. 48.

FIG. 49 is a diagram schematically showing a cross sectional structure taken along line 48A-48A in FIG. 48. In FIG. 49, a memory cell MC includes impurity regions 171 and 172 formed apart from each other in the surface of a semiconductor substrate area 170, a conductive layer 173 formed, with a gate insulating film 174 laid thereunder, on the channel region between impurity regions 171 and 172, and a conductive layer 175 formed, with a capacitor insulating film 176 laid thereunder, on impurity region 172.

Conductive layer 173 is composed of an interconnection line of the first level polysilicon interconnection layer, and constitutes word line WL. On the other hand, conductive layer 175 is composed of an interconnection line of the second level polysilicon interconnection layer, and constitutes cell plate electrode CP. These conductive layers 173 and 175 are formed in different production process steps. Therefore, cell plate electrode CP can be formed extending onto word line WL.

Impurity region 171 is connected to a conductive layer 177 of a first level metal interconnection layer through bit line contact BCT. Conductive layer 177 constitutes bit line BL (or /BL). Impurity region 172 is isolated from other memory cells by a cell isolation region 178.

In the configuration of memory cell MC shown in FIG. 49, a memory cell transistor MT is composed of impurity region 171, conductive layer 173, and gate insulating film 174. A memory cell capacitor MQ is formed of capacitor insulating film 176 between impurity region 172 and conductive layer 175.

When memory cell MC shown in FIG. 49 is formed, the first level polysilicon interconnection layer provides conductive layer 173 to be a word line WL. Next, impurities are, in self-alignment with the word line, implanted, to form impurity regions 171 and 172, which in turn constitute the source/drain region and the storage node region of the memory cell transistor. In the case that the access transistor of the memory cell is an N channel MOS transistor, impurity regions 171 and 172 are N type impurity regions. The memory cell transistor may be formed of a P channel MOS transistor.

After impurity regions 171 and 172 are formed, the second level polysilicon interconnection layer is patterned to form cell plate electrode CP. In the case of the configuration as shown in FIG. 49, therefore, word line WL and cell plate electrode CP are formed of interconnection lines of the different interconnection layers, and are formed in different manufacturing process steps. As a result, the interval between word line WL and cell plate electrode CP can be made sufficiently small. Impurity region 122 shown in FIG. 38 can be removed, and the size of the memory can be reduced. Just under cell plate electrode CP, impurity region 172 is formed. Thus, regardless of the logic level of memory data, the utilization efficiency of memory cell capacitor MQ can be made 100%, and the capacitance thereof can be decided dependently on the facing area of conductive layer 175 constituting cell plate electrode CP and impurity region 172.

Conductive layer 173 constituting the gate electrode of memory cell transistor MT is formed through dual polysilicon gate process for the first level polysilicon interconnection layer in CMOS logic process. In the case that the transistor gate is formed by this dual polysilicon gate process, for an N channel MOS transistor, an N type impurity is implanted into its channel region. At this time, impurity ions are implanted into the channel region through the gate electrode of the transistor and therefore, the gate electrode of the memory cell transistor is formed of an N type polysilicon interconnection line. On the other hand, for a P channel MOS transistor, a P type impurity is implanted into its channel region through the gate electrode in order to make the absolute value of its threshold voltage small and therefore, the gate electrode of the memory cell transistor is formed of a P type polysilicon interconnection line.

In the case that cell plate electrode CP is made of the polysilicon of the same interconnection layer constituting transistor gate electrode serving as (sub) word line WL, cell plate electrode CP is also formed of the impurity-implanted polysilicon interconnection line. In this case, however, it can be considered that by a depletion layer (gate depleting) generated in the polysilicon, a cell plate voltage VCP applied to cell plate electrode CP is divided by the capacitance of the depletion layer so that the effective film thickness of the capacitor insulating film becomes thick and thus the effective capacitance thereof is reduced.

As shown in FIG. 49, however, conductive layer 175 constituting cell plate electrode CP is formed by a process different from a process for forming conductive layer 173 constituting word line WL. Accordingly, conductive layer 175 constituting cell plate electrode CP can be formed of doped polysilicon doped with a high-concentration N type impurity or P type impurity, independently of conductive layer 173 constituting word line WL. As a result, no gate depleting is caused in the doped polysilicon, into which the high-concentration impurity is implanted and thus, a reduction in the effective capacitance of memory cell capacitor MQ can be prevented so that a desired capacitance of the memory cell capacitor can be ensured.

Capacitor insulating film 176 formed just under cell plate electrode CP is manufactured by a process different from a process for manufacturing gate insulating film 174 just under word line WL and therefore, capacitor insulating film 176 can be made of a highly dielectric film such as Ta2O3 film. By using such a highly dielectric film as capacitor insulating film 176, the area of memory cell capacitor MQ can be reduced so that the size of the memory cell can be made very small.

In the case of using this highly dielectric film, a highly dielectric film is also formed in the region where conductive layer 173 constituting word line WL and conductive layer 175 constituting cell plate electrode CP overlap with each other. As a result, a capacitance is present between word line WL and cell plate electrode CP. It can be therefore considered that the parasitic capacitance of word line WL would become large so that word line WL could not be driven into a select state at a high speed. Thus, in the region where word line WL and cell plate electrode CP overlap with each other, the thickness of the interlayer dielectric film is made as large as possible. In this way, the parasitic capacitance of word line WL is reduced.

In the case that this highly dielectric film is used as capacitor insulating film 176, a capacitor can be composed of conductive layer 173 constituting word line WL and conductive layer 175 constituting cell plate electrode CP. Accordingly, the manufacturing step of a poly to poly capacitor, which is used in an analogue circuit included in the system LSI, can be used as the manufacturing step of forming conductive layer 173, capacitor insulating film 176 and conductive layer 175. In this case, the thickness of the insulating film between word line WL and cell plate electrode CP is made as large as possible to reduce the parasitic capacitance of word line WL. Preferably, dual capacitor insulating film process is used to make the thickness of capacitor insulating film 176 in the region where cell plate electrode CP and impurity region 172 are facing to each other different from the thickness of the interlayer dielectric film in the region where word line WL and cell plate electrode CP overlap with each other.

Word line WL is discussed in the foregoing description. However, word line WL may be a word line of a non-hierarchical configuration, or may be a sub word line SWL in the hierarchical word line configuration.

Modification 1

Figure 50:
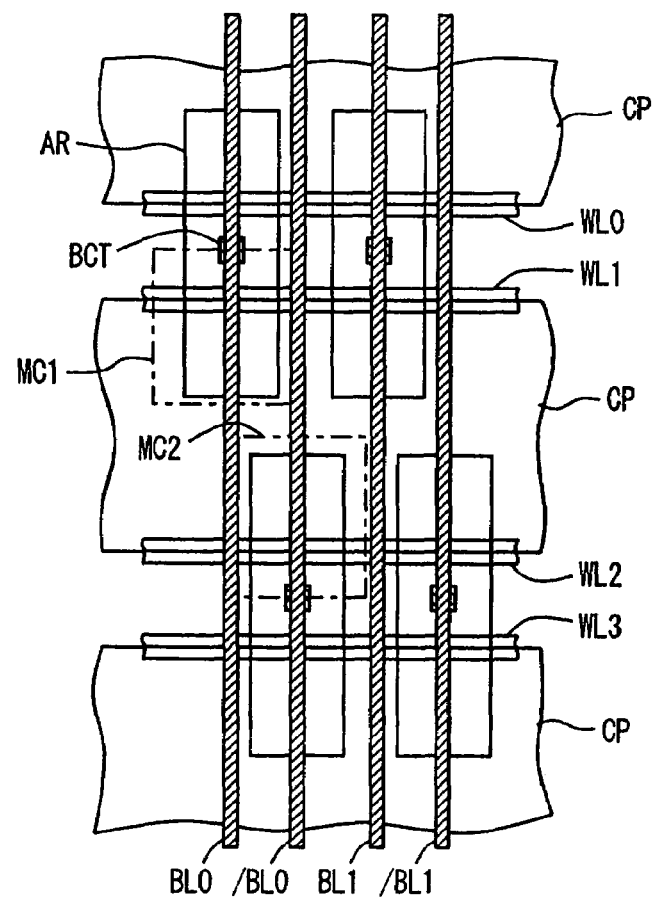
FIG. 50 is a diagram schematically showing a layout of a modification 1 of the tenth embodiment of the present invention.

FIG. 50 is a diagram schematically showing a layout of a modification 1 of the tenth embodiment of the present invention. In FIG. 50, active areas AR are arranged in the column direction such that active areas AR in the adjacent rows are shifted by ½ pitch of memory cells in the row direction. Bit lines are arranged corresponding to active areas AR in alignment in the column direction. In FIG. 50, bit lines BL0, /BL0, BL1 and /BL1 are representatively shown.

Word lines WL1-WL3 are arranged extending in the row direction, and are formed of, for example, the first level polysilicon interconnection layer. Cell plate electrodes CP are arranged in parallel to word lines Wl1-WL3. A part of each of cell plate electrodes CP is located so as to overlap with the corresponding word line WL. Cell plate electrodes CP are formed of, for example, the second level polysilicon interconnection layer. A cell plate electrode CP is provided in common to memory cells arranged in two rows. Cell plate electrodes CP adjacent in the column direction are separated from each other.

In the layout shown in FIG. 50, two bit lines are arranged in the pitch of the memory cells in the row direction. Bit lines contacts BCT are arranged corresponding to alternate bit lines in the row direction.

Upon selecting a memory cell, the word lines arranged oppositely to each other with respect to cell plate electrode CP are simultaneously driven into select states. For example, word lines WL1 and WL2 are simultaneously driven into the select state. In this case, memory cell MC1 is connected to bit line BL0 through bit line contact BCT, and memory data in memory cell MC2 are read out onto bit line /BL0. In the same way, memory cell data are simultaneously read out onto bit lines BL1 and /BL1. A twin cell unit is therefore composed of two memory cells MC1 and Mc2 arranged in the different rows.

In this layout of the memory cells, by using interconnection lines formed by different manufacturing processes for cell plate electrodes CP and word lines WL, the size of the memory cells can be significantly reduced. Since the impurity region is used as the storage node, memory cell capacitors can be regularly formed regardless of a logic level of storage therein. Thus, the utilization efficiency of the capacitors can be improved so that memory cell capacitors having a small occupancy area and a desired capacitance can be achieved.

Modification 2

Figure 51:
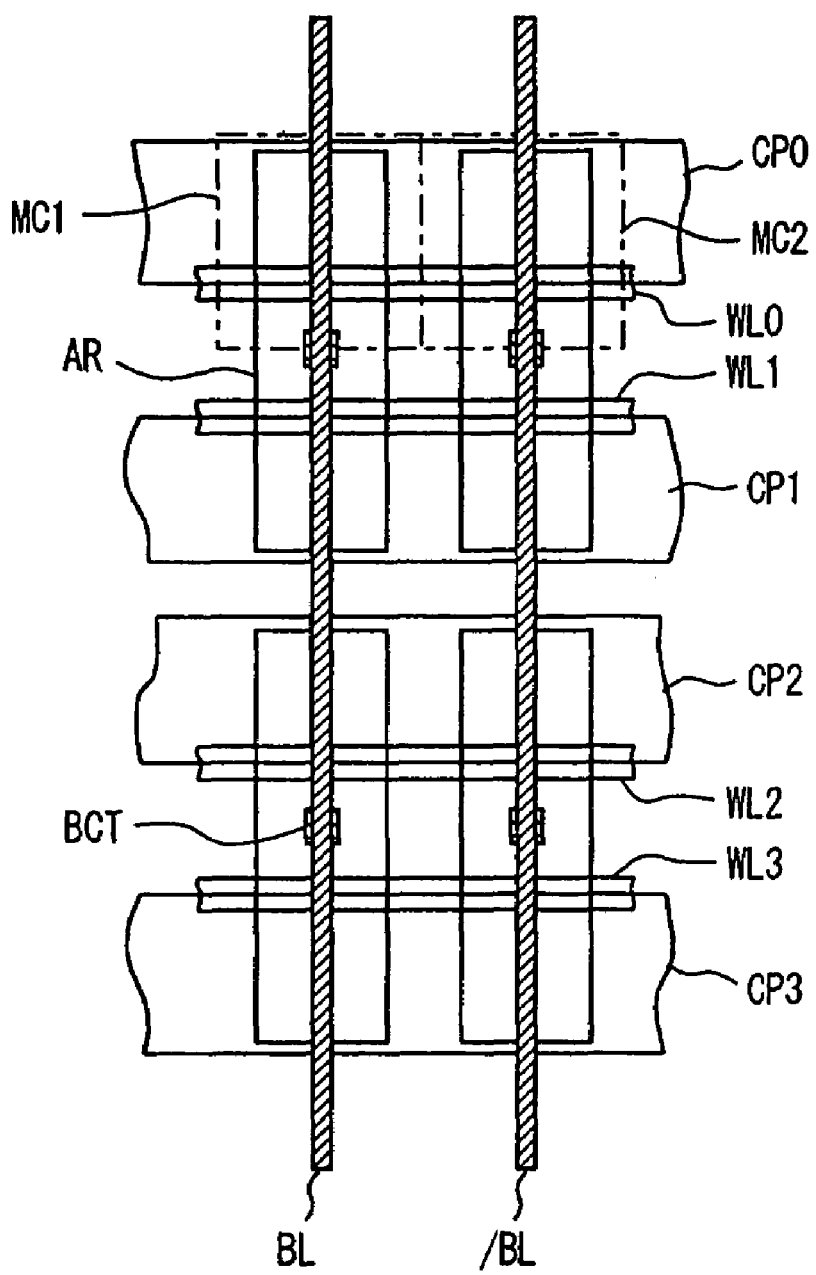
FIG. 51 is a diagram schematically showing a layout of a memory cell array according to a modification 2 of the tenth embodiment of the present invention.

FIG. 51 is a diagram schematically showing the configuration of a memory cell section of a modification 2 of the tenth embodiment of the present invention. In the layout shown in FIG. 51, rectangular active areas AR for forming 2-bit memory cells are arranged in alignment in the column direction. Bit lines BL and /BL are alternately arranged corresponding to the columns of active areas AR. Each of active areas AR is connected to the corresponding bit line BL or /BL through bit line contact BCT.

A pair of two word lines is arranged sandwiching bit line contact BCT and extending in the row direction.

Cell plate electrodes CP0-CP3 are arranged corresponding to word lines WL0-WL3, respectively. The voltage level of each of cell plate electrodes CP0-CP3 can be set independently on each other (see the ninth embodiment). Cell plate electrodes CP0-CP3 and word lines WL0-WL3 are formed by different manufacturing processes. Word lines WL0-WL3 are formed of the first level polysilicon interconnection layer, and cell plate electrode lines CP0-CP3 are formed of the second level polysilicon interconnection layer. Cell plate electrodes CP0-CP3 are arranged overlapping partially with the corresponding word lines WL0-WL3, respectively.

In the configuration shown in FIG. 51 as well, the size of the memory cells can be reduced in the same way. Even if a boosted voltage higher than the array power supply voltage is not transmitted to a selected word line WL, a sufficiently large readout voltage difference can be generated between bit lines BL and /BL. Since the electrodes of memory cell capacitor MQ are composed of the cell plate electrode and the impurity region formed in the surface of the semiconductor substrate region, the memory cell capacitor can reliably be formed regardless of the logic level of storage data. Thus, charges corresponding to the storage data can be accumulated correctly.

As described above, according to the tenth embodiment of the present invention, word lines and cell plate electrodes are formed of interconnection lines of different interconnection layers and the distance between the word line and the cell plate electrode can be made short so that the size of the memory cells can be reduced. Moreover, the impurity region can be formed in the substrate surface and facing to the cell plate electrode, and the cell plate electrode can be formed of doped polysilicon so that the utilization efficiency of the capacitor can be improved.

By forming the impurity region, as the storage node, in the surface of the substrate region, the memory cell capacitor can be formed regardless of storage data and the utilization efficiency of the capacitor is improved. Thus, electric charges can reliably be accumulated in accordance with the storage data.

Eleventh Embodiment

Figure 52:
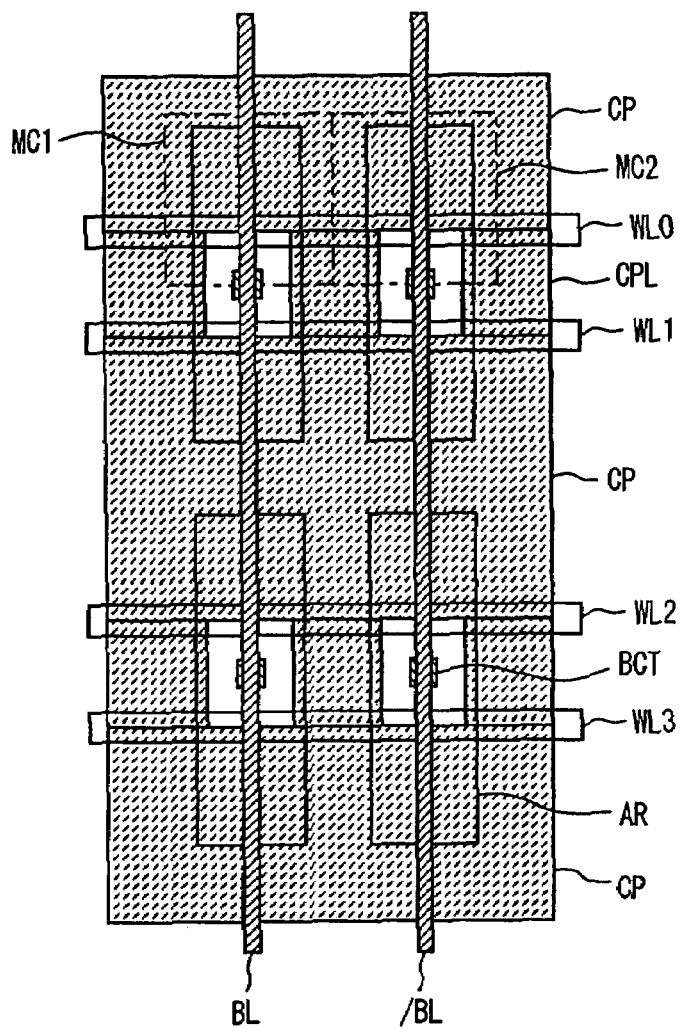
FIG. 52 is a diagram schematically showing the configuration of an array section of a semiconductor memory device according to an eleventh embodiment of the present invention.

FIG. 52 is a diagram schematically showing the configuration of an array section of a semiconductor memory device according to an eleventh embodiment of the present invention. FIG. 52 schematically shows the layout of memory cells arranged in 2 rows and 2 columns. In the configuration in FIG. 52, word lines WL0-WL3 and cell plate electrodes CP are composed of different interconnecting layers. Cell plate electrodes CP are interconnected to each other through a second level polysilicon interconnection line CPL. Therefore, the cell plate electrodes are arranged in a meshed shape to be extended over a region of the memory cell array except regions where bit line contacts BCT are formed.

The remaining configuration is the same as that shown in FIG. 48. Two memory cells MC1 and MC2 adjacent in the row direction constitute a twin cell unit. By selecting one word line WL, data of two memory cells are read out onto bit lines BL and /BL in a pair.

As shown in FIG. 52, by interconnecting cell plate electrodes CP arranged extending over the region except the regions where bit line contacts BCT are formed, the cell plate electrodes are arranged in a meshed shape inside the predetermined region. Therefore, only by supplying a cell plate voltage VCP to several portions of the cell plate electrodes, cell plate voltage VCP can stably be supplied to the cell plate electrodes of the memory cells in the predetermined region. In addition, it is not required to supply cell plate voltage VCP to the cell plate electrode CP in correspondence with each row. The occupancy area of the circuit for supplying cell plate voltage VCP can be reduced.

Figure 53:
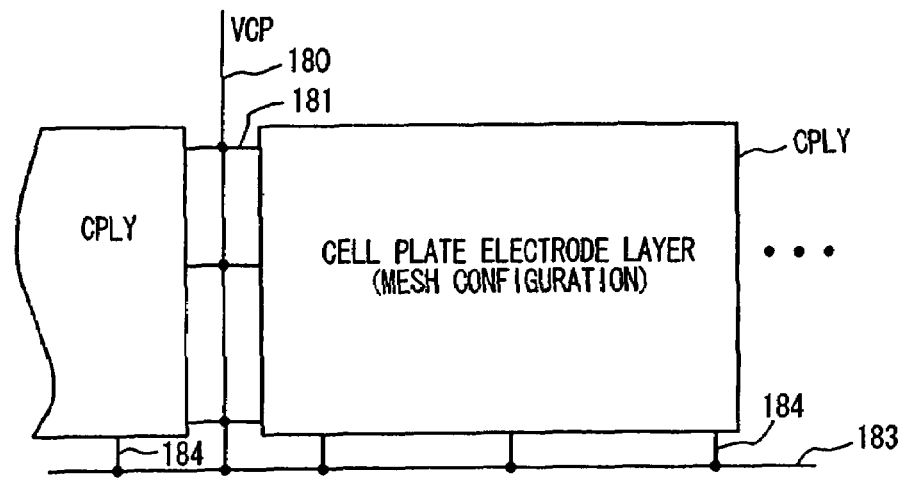
FIG. 53 is a diagram schematically showing the arrangement of a cell plate electrode according to the eleventh embodiment of the present invention.

FIG. 53 is a diagram showing the manner of distribution of cell plate voltage VCP. In FIG. 53, cell plate electrodes CP are interconnected together so that cell plate electrode layer CPLY substantially having a meshed shape is formed. In cell plate electrode layer CPLY, holes are formed in the regions corresponding to bit line contacts BCT. For example, a cell plate voltage transmitting line 180 for transmitting cell plate voltage VCP is arranged in a sub word driver band, and cell plate electrode layer CPLY is connected to cell plate voltage transmitting line 180 through cell plate voltage distributing lines 181.

In the same way, a cell plate voltage transmitting line 183 is arranged in a sense amplifier band, and cell plate electrode layer CPLY is connected to cell plate voltage transmitting line 183 through cell plate voltage distributing lines 184. Cell plate voltage transmitting lines 181 and 183 for transmitting cell plate voltage VCP are composed of, for example, a metal second interconnecting layer. From the second level metal interconnecting layer, cell plate voltage VCP is transmitted through cell plate voltage distributing lines 181 and 184 and cell plate electrode layer CPLY formed of the second level polysilicon interconnection layer. Therefore, it is unnecessary to supply cell plate voltage VCP to each of the cell plate electrodes (layers) formed into a piled or shunt configuration. Thus, only by arranging several cell plate voltage distributing lines in the sense amplifier band and/or the sub word driver band, the occupancy area of the circuit for supplying cell plate voltage VCP can be reduced.

In the configuration in FIG. 53, cell plate electrode layer CPLY is arranged in common to the memory cells of memory sub arrays divided by the sub word driver bands. Cell plate electrode layer CPLY can be arranged without causing any adverse effect on the layout of the sub word drivers in the sub word driver bands.

Additionally, cell plate electrode layer CPLY can be arranged without causing adverse effect on the sense amplifier circuits and bit line peripheral circuits arranged in the sense amplifier bands.

Cell plate electrode layer CPLY may be arranged, in common to the memory sub arrays in a memory block, so as to extend in the row direction in the same way as the main word lines. In the case that the cell plate voltage transmitting lines are formed in an interconnection layer below the main word line, holes are formed in the cell plate voltage transmitting lines to shun the contacts for the main word lines and the sub word lines in a region where the contacts are formed. Since the contact for a main word line and a sub word line is formed in a sub word driver band, the cell plate electrodes are interconnected to each other and cell plate connecting lines CPL are arranged shunning the sub word drivers in the sub word driver band.

Cell plate electrode layers CPLY may be interconnected bridging over a sense amplifier band. In the region where neither sense amplifier circuit nor bit line peripheral circuit are present, the cell plate electrode layers adjacent in the column direction are interconnected together through the second level polysilicon interconnecting layer.

Therefore, cell plate electrode layer CPLY is merely required to be formed into a meshed shape. In the memory sub array, a hole is formed at a region of bit line contact BCT in cell plate electrode layer CPLY. Cell plate electrode layers CPLY may be interconnected together through the second level polysilicon interconnection layer without causing adverse influence on the layout of the sense amplifiers, the bit line peripheral circuits and the sub word drivers.

As described above, according to the eleventh embodiment of the present invention, the cell plate electrode is formed into a meshed shape and cell plate voltage VCP is not required to be supplied for each cell plate electrode arranged corresponding to each respective memory cell row. Thus, the area of the circuit layout for transmitting cell plate voltage VCP can be reduced.

Twelfth Embodiment

Figure 54:
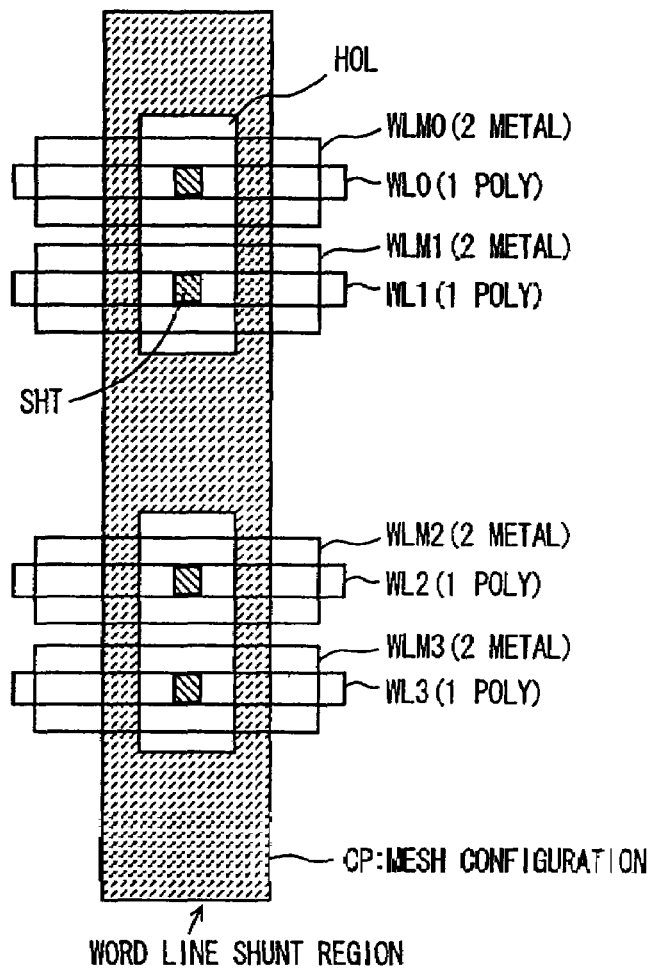
FIG. 54 is a diagram schematically showing a layout of an array section of a semiconductor memory device according to a twelfth embodiment of the present invention.

FIG. 54 is a diagram schematically showing the configuration of a memory array of a semiconductor memory device according to a twelfth embodiment of the present invention. In FIG. 54, each word line is composed of a low-resistance conductive layer made of, for example, a second level metal interconnection layer, and a word line made of a first level polysilicon interconnection layer. In this word line configuration, low-resistance metal word line WLM in an upper layer and polysilicon word line WL of a relatively high resistance in a lower layer are electrically connected to each other through a contact SHT in a word line shunt region. FIG. 54 shows word lines WL0-WL3 formed of the first polysilicon (1-poy), and metal word lines WLM0-WLM3 formed of, for example, the second level metal interconnection layer arranged in parallel to word lines WL0-WL3.

In the word line shunt region, each metal word line WLM is electrically connected to the corresponding word line WL through contact SHT. By arranging the low resistive metal word line in parallel to the word line of a relatively high resistance polysilicon, transmitting a word line selecting signal onto metal word line. WLM, and connecting metal word line WLM electrically to polysilicon word line WL at predetermined positions, the resistance value of polysilicon word line WL is effectively made small and the word line is driven into a select state at a high speed.

Such a configuration, in which polysilicon word line WL and metal interconnection line WLM are interconnected together at predetermined intervals, is called word line shunt configuration.

In such a word line shunt configuration, a cell plate electrodes CP are arranged in a meshed shape in the same way as in the eleventh embodiment. Contact SHT for word line shunt is extended from the second level metal interconnection layer to the first level polysilicon interconnection layer. In this region of the shunt contacts, a hole HOL is made in cell plate electrode CP. Cell plate electrode CP formed of the second level polysilicon interconnection layer can be arranged extending over a predetermined region of the memory cell array without causing an adverse effect on the word line shunt configuration. In this case, a hole is also made to cell plate electrode CP in the bit line contact region, although not shown dearly in the FIG. 54.

Accordingly, holes are made in the word line shunt portions and the bit line contact portions to the cell plate electrode, and the cell plate electrode is arranged continuously extending in the remaining region and has a meshed configuration. In a non-hierarchical word line configuration, therefore, the cell plate voltage is not required to be supplied for each memory cell row by forming the cell plate electrodes into a meshed shape. Thus, the layout area for supplying the cell plate voltage can be reduced.

As described above, according to the twelfth embodiment, the hole is made in the word line shunt region to cell plate electrode CP and cell plate electrode CP formed of the second level polysilicon interconnection layer is arranged in a meshed shape on the memory cell array without causing an adverse effect on the word line shunt configuration so that cell plate voltage VCP can stably be supplied. Moreover, the interconnection layout area for supplying the cell plate voltage can be reduced.

Thirteenth Embodiment

Figure 55:
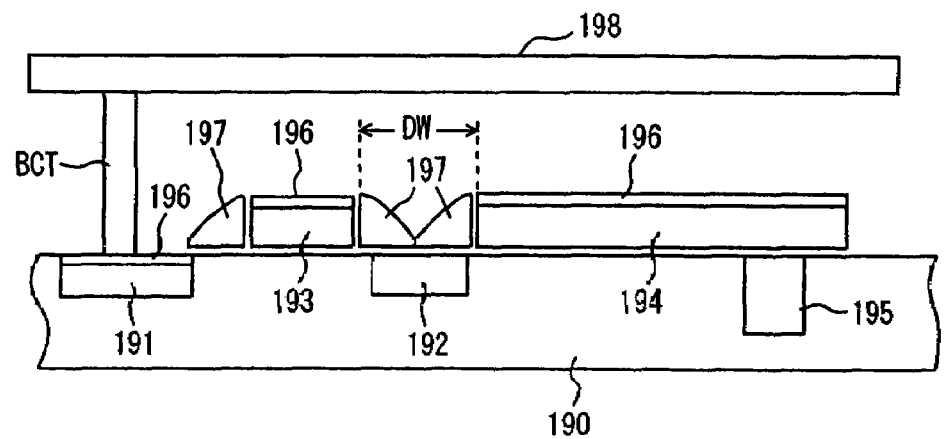
FIG. 55 is a diagram schematically showing a cross sectional structure of a memory cell according to a thirteenth embodiment of the present invention.

FIG. 55 is a diagram schematically showing a cross sectional configuration of a memory cell according to a thirteenth embodiment of the present invention. In FIG. 55, the memory cell includes impurity regions 191 and 192 formed apart from each other in the surface of a semiconductor substrate area 190, a gate electrode 193 formed, with not shown gate insulating film laid thereunder, on the region between impurity regions 191 and 192, and a capacitor electrode 194 formed, with a not shown capacitor insulating film laid thereunder, on a storage node region adjacent to an impurity region 194. This storage node region is isolated from other adjacent memory cells by a cell isolation region 195.

A salicide 196 is formed on the surface of impurity region 191 and salicide 196 is also formed on the surface of gate electrode 193. Moreover, a salicide 196 is formed on the surface of gate electrode 194. The salicide is a self-aligned polysilicide, and is a silicide layer formed of CoSi or the like and is formed in self-alignment in the surface of polysilicon. The formation of the salicide reduces the resistance of polysilicon interconnection line and the impurity regions as well.

Salicide 196 on impurity region 191 is electrically connected to bit line contact BCT, and this bit line contact BCT is connected to a bit line 198.

When the transistor of the memory cell is formed, impurity regions 191 and 192 are formed in self-alignment. In general, a side wall insulating film 197 is formed on the side of gate electrode 193. Side wall insulating film 197 is formed of an insulating film of SiN, SiO, or the like.

Side wall insulating film 197 is formed on the surface of impurity region 192, and the surface of impurity region 192 is entirely covered with side wall insulating film 197. Gate electrode 193 and cell plate electrode 194 are formed of polysilicon in the same interconnection layer. By setting the interval DW between gate electrode 193 and cell plate electrode 194 to a value two or less times larger than the width of side wall insulating film 197 upon formation of the polysilicon, the surface of impurity region 192 can be entirely covered with side wall insulating film 197 upon formation of this side wall insulating film.

In order to lower gate electrode interconnection resistance and diffusion layer (impurity layer) resistance, salicide process for forming silicide in self-alignment on the surface of silicon is introduced in standard CMOS logic process. In the case that memory cells are formed through CMOS logic process, salicide 196 is formed on the surface of impurity region 191, gate electrode 193 and cell plate electrode 194 as well. In the case that salicide 196 is formed on the surface of impurity region 192, the resistance of impurity region 192 is reduced, but junction leakage current increases.

Impurity region 192 is adjacent to the storage node electrode and therefore, in-the case that the salicide is formed on the surface of impurity region 192, storage data may be lost out by the junction leakage current. Thus, by covering the surface of impurity region 192 with side wall insulating film 197, no salicide is formed on the surface of impurity region 192 even in the salicide process. Thus, it is possible to suppress reduction in data retention characteristics.

It is suppressed that side wall insulating film 197 is formed before this salicide is formed or that salicide is formed on the sides of gate electrode 193 and cell plate electrode 194. This side wall insulating film is formed through anisotropic etching of an insulating film. In the anisotropic etching, the width of the side wall insulating film is determined. Accordingly, the width of the side wall insulating film can be known in advance dependently on the anisotropic etching. Dependently on this width, the interval between the gate electrode and the cell plate electrode can be decided.

As described above, according to the thirteenth embodiment of the present invention, in the case that the cell plate electrode and the gate electrode are formed in the same manufacturing step, the interval between gate electrode 193 and cell plate electrode 190 is set to a value 2 or less times than the width of the side wall insulating film. Thus, even if the impurity region is formed in the surface of the substrate area between the gate electrode and the cell plate electrode, in subsequent formation of the side wall insulating film, the surface of the impurity region connected to the storage node can be covered with the side wall insulating film. Therefore, it is possible to prevent the formation of salicide in this impurity region in salicide process, to suppress junction leakage current. Consequently, electric charges accumulated in the storage node are prevented from being lost by leakage current, and the deterioration of data retention characteristics can be suppressed.

In FIG. 55, the memory cell transistors may be formed of P channel MOS transistors or N channel MOS transistors. In either case, the manufacturing process for forming salicide is carried out.

Fourteenth Embodiment

Figure 56:
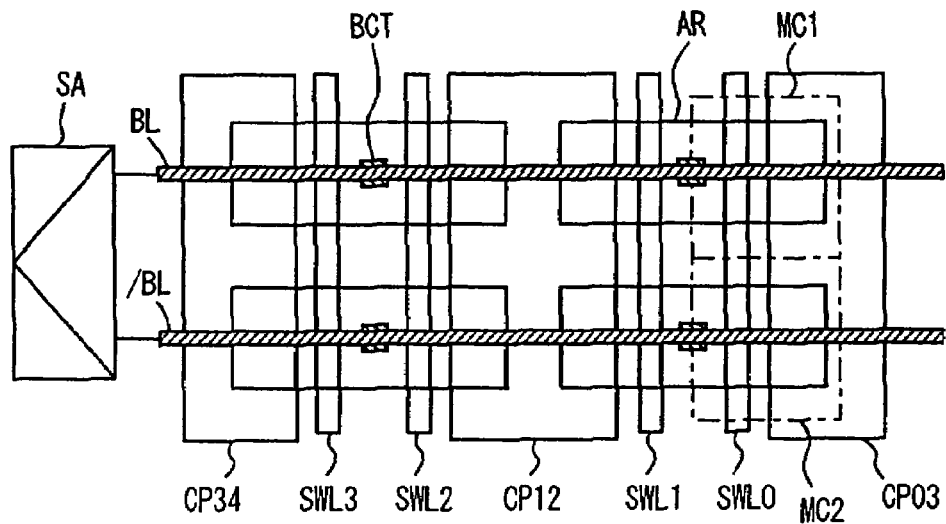
FIG. 56 is a diagram schematically showing the configuration of a memory cell array according to a fourteenth embodiment of the present invention.

FIG. 56 is a diagram schematically showing the configuration of a memory array section according to a fourteenth embodiment of the present invention. In FIG. 56, cell plate electrodes CP are arranged corresponding to sub word lines SWL. Each cell plate electrode CP is arranged corresponding to the sub word lines at both sides of the cell plate electrode. In other words, each cell plate electrode CP is arranged in common to memory cells in two rows. Specifically, in FIG. 56, a cell plate electrode CP 12 is arranged corresponding to sub word lines SWL1 and SWl2, and a cell plate line CP03 is arranged corresponding to a sub word line SWL0 and a not shown sub word line SWL3. A cell plate electrode CP 34 is arranged corresponding to a sub word line SWL3 and a not shown sub word line SWL4.

Rectangular active areas AR are arranged in alignment in the column direction. Bit lines BL and /BL are arranged corresponding to and in alignment with active areas AR, extending in the column direction. Each active area AR has 2-bit memory cells adjacent in the column direction formed therein and is electrically connected to the corresponding bit line BL or /BL through a bit line contact BCT. In the configuration shown in FIG. 56, a twin cell unit for storing 1-bit data is composed of two memory cells MC1 and MC2 adjacent in the row direction. In selecting a memory cell, one sub word line is driven into a select state. Bit lines BL and /BL are connected to a sense amplifier SA.

In the configuration shown in FIG. 56, cell plate electrodes CP and sub word lines SWL are formed of interconnection lines of the same interconnection layer. The sub word lines and the cell plate electrodes are formed of a material containing silicon, such as polysilicon having an impurity introduced therein (doped polysilicon), polysilicide such as WSix or CoSix, and salicide. Accordingly, cell plate electrodes CP and sub word lines SWL are formed in the same step for forming gate electrodes of logic transistors. In the same way as in the ninth embodiment, the cell plate electrodes are arranged facing to inversion layer forming regions in order to implement a planar capacitor configuration. No impurity regions are formed in the inversion layer forming regions. The voltage level of each cell plate electrode CP is changed dependently on the selection/non-selection of the corresponding memory cell.

Figure 57:
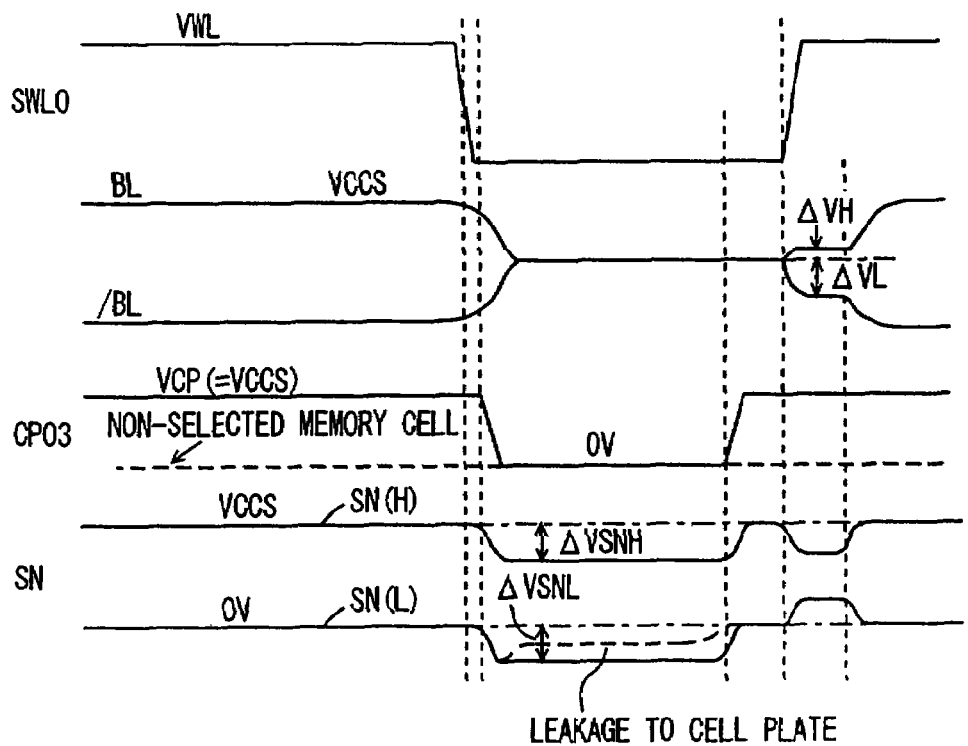
FIG. 57 is a waveform diagram representing the operation of the semiconductor memory device according to the fourteenth embodiment of the present invention.

FIG. 57 is a diagram showing operation waveforms of the fourteenth embodiment of the present invention in driving one cell plate electrode. Referring to FIGS. 56 and 57, description is made of the operation of the semiconductor memory device according to the fourteenth embodiment of the present invention.

Now, it is supposed that sub word line SWL 0 is selected. In this state, sub word line SWL0 is at a voltage level VWL and bit lines BL and /BL are at an array power supply voltage level VCCS and the ground level (0 level), respectively, through sensing operation of sense amplifier SA. In this state, the voltage level of cell plate electrode CP03 arranged corresponding to sub word line SWL0 is driven into, for example, array power supply voltage level VCCS. On the other hand, the non-selected cell plate electrodes are kept at the ground voltage level. Concerning the voltage levels of storage nodes SN, dependently on storage data, storage nodes SN(H) storing an H level data and storage nodes SN(L) storing an L level data are at array power supply voltage level VCCS and at the ground level, respectively.

When one access cycle for writing and reading out data in memory cells is completed, sub word line SWL0 in the select state is driven into a non-select state and the voltage level thereof is lowered to the ground voltage level. Sense amplifier SA is deactivated so that bit lines BL and /BL are precharged and equalized to an intermediate voltage level through a not shown precharging/equalizing circuit.

When sub word line SWL0 is driven into the non-select state and the access transistor of the memory cell turns non-conductive, cell plate electrode CP03 is subsequently driven into the ground voltage level. In this way, the voltage level of storage node SN(H) storing the H level data lowers by a voltage $\Delta$VSNH by capacitance coupling between this cell plate electrode and the corresponding storage node (inversion layer). In the same way, the voltage level of storage node SN(L) storing the L level data lowers by a voltage $\Delta$VSNL. By setting the coupling efficiency of the coupling capacitance to an appropriate value, voltage variations $\Delta$VSNL and $\Delta$VSNH of these storage nodes can be made smaller than a voltage variation of cell plate electrode CP03 ($\Delta$VSNL<<VCCS).

In this state, cell plate electrode CP is at the ground voltage level, and storage node SN(L) storing the L level data is at a voltage level of $-\Delta$VSNL. The gate to source voltage of the planar capacitor constituting this memory cell capacitor is $\Delta$VSNL and is far smaller than array power supply voltage VCCS. In this state, therefore, an inversion layer is merely weakly formed in the semiconductor substrate region just under the cell plate electrode in the case that the semiconductor substrate region is of a P type substrate and is biased to a negative voltage VBB level. Since the impurity region constituting the storage node is kept at a negative voltage level, the potential of the impurity region constituting this storage node becomes higher than that of the inversion layer. Thus, a potential barrier is formed between this inversion layer and the impurity region constituting the storage node.

Therefore, electrons hardly flow out from the impurity region of the storage node into the substrate region just under the cell plate electrode. Thus, it is possible to prevent electrons from flowing out from the impurity region of this storage node to the cell plate electrode through the capacitor insulating film. As a result, the voltage level of storage node SN(L) storing the L level data can be kept at a voltage level of about $-\Delta$VSNL.

When sub word line SWL0 is again selected, the voltage level of cell plate electrode CP03 kept at the ground voltage level is first driven into array power supply voltage VCCS and by capacitance coupling, the voltage levels of storage nodes SN(H) and SN(L) are returned to the original voltages VCCS and 0 volt level, respectively.

Subsequently, sub word line SWL0 is driven into a select state, and storage nodes SN(H) and SN(L) are connected to the corresponding bit lines BL and /BL and then sensing operation is performed.

The read out voltages are $\Delta$VH and $\Delta$VL, and a read out voltage difference is $\Delta$VH+$\Delta$VL. Thus, the read out voltage equivalent to that in the ninth embodiment can be realized in a non-boosted word line scheme. Therefore, in the case that a cell plate electrode is formed by CMOS logic process similarly to the gate electrode of a memory cell transistor, the thickness of a capacitor insulating film is thin similarly to the gate insulating film, a cell plate electrode VCP cannot be easily boosted above the array power supply voltage. According to the instant cell plate electrode control scheme, a sufficiently large read out voltage difference can be generated in a pair of bit lines. It is also possible to prevent electrons from flowing out to the cell plate electrode through the capacitor insulating film, and to prevent data retention characteristics from deteriorating.

Each cell plate electrodes CP provided for the memory cells connected to the other non-selected sub word pairs are kept at the ground voltage level. When one of the sub word lines in a pair is selected, the cell plate voltage of the memory cells connected to the non-selected sub word line in this sub word line pair also changes. Since the memory cell transistor in this non-selected memory cell is in a nonconductive state, the storage node voltage thereof merely rises or falls through capacitance coupling. The voltage variations of the storage nodes are the same between the rise and the fall in the capacitive coupling. An access period is short in general. Even if electrons leak to the cell plate electrode through the capacitor insulating film during this access period, the amount of the leakage charges is very slight. As a result, the leakage causes no adverse effect on storage data in the non-selected memory cells.

Figure 58:
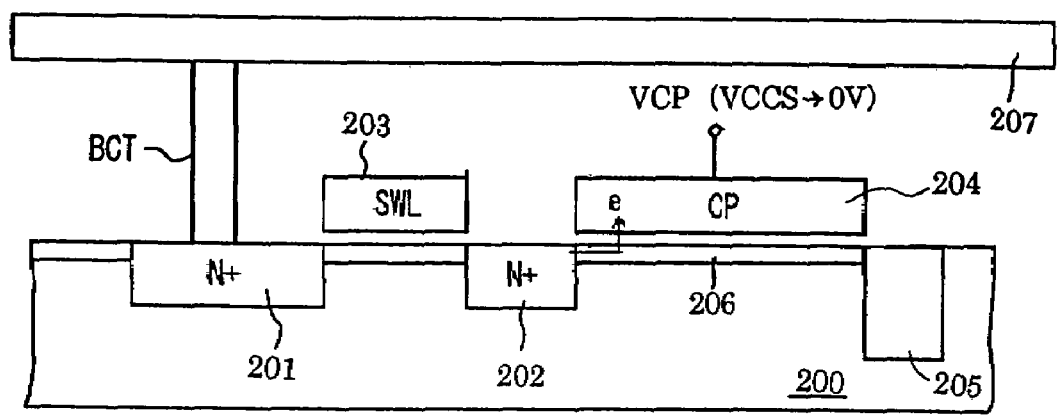
FIG. 58 is a diagram schematically showing a cross sectional structure of the memory cell according to the fourteenth embodiment of the present invention.

FIG. 58 is a diagram schematically showing a cross sectional structure of the memory cell according to the fourteenth embodiment of the present invention. In FIG. 58, a memory cell includes impurity regions 201 and 202 formed apart from each other in the surface of a semiconductor substrate area 200, a gate electrode 203 formed, with a not shown gate insulating film laid thereunder, on the region between impurity regions 201 and 202, and a cell plate electrode 204 formed, with a not shown capacitor insulating film laid thereunder, on an inversion layer forming region 206. Inversion layer forming region 206 is isolated from other inversion layer forming regions by a cell isolation region 205.

Impurity region 201 is connected to a bit line 207 through a bit line contact BCT.

In order to form an inversion layer sufficiently in inversion layer forming region 206, array power supply voltage VCCS is applied, as cell plate voltage VCP, through cell plate electrode 204. Even in a non-selected state (standby state) in this state, the inversion layer is formed in inversion layer forming region 206 when array power supply voltage VCCS is applied as cell plate voltage VCP. When impurity region 202 is a storage node SN(L) storing an L level data, electrons accumulated in impurity region 202 are transmitted to the inversion layer formed in inversion layer forming region 206 so that the electrons flow into cell plate electrode line 204 through the capacitor insulating film. In this case, therefore, accumulated charges (electrons) are lost in impurity region 202 so that the voltage level of storage node SN(L) storing the L level data rises as shown by a broken line in FIG. 57.

By keeping cell plate voltage VCP at the ground voltage level in this non-selected state (standby state), a change in cell plate voltage VCP causes the voltage level of storage node SN(L) storing the L level data to be a negative voltage of $-\Delta VSNL$ on the basis of capacitance coupling. Although a voltage difference between the gate and source of the MOS capacitor is $\Delta VSNL$ in this case, the value of the voltage difference is by far smaller than array power supply voltage VCCS. Thus, no inversion layer is substantially formed in the inversion formation region, but a potential barrier is formed in a boundary region 210 between impurity region 202 and inversion layer forming region 206. In other words, the potential of inversion layer forming region 206 becomes lower than that of storage node SN(L) storing the L level data to prevent electrons from flowing into inversion layer forming region 206 (Potential $\phi$ becomes higher as the amount of accumulated electrons becomes larger).

Therefore, by driving the cell plate voltage VCP of this cell plate electrode CP in the same way as the voltage level of the corresponding sub word line, the voltage level of storage node SN(L) storing the L level data can be kept at a negative voltage level in the standby state. Thus, it is possible to prevent electrons from flowing into cell plate electrode 204.

Concerning the storage node storing the H level data, the voltage level of the cell plate electrode is the ground voltage level and is lower than the voltage level of the storage node. Therefore, no inversion layer is formed. In the same way, the PN junction between the impurity region and the substrate-region is in a reverse-biased state so that no electrons flow out.

When this memory cell is again selected, cell plate voltage VCP is again driven into array power supply voltage VCCS so that an inversion layer is formed in inversion layer forming region 206. Furthermore, by capacitance coupling, the voltage level of storage node SN(L) is returned to the original voltage level (ground voltage level).

During this standby period, the voltage level of storage node SN(L) is a negative voltage level. Thus, it may be considered that leakage current through the channel region just under word line WL increases, that is, a so-called disturb refresh immunity becomes weak. In this case, therefore, reduction in disturb refresh immunity can be prevented by setting the voltage of the selected sub word line SWL into a negative voltage level in the standby state.

Figure 59:
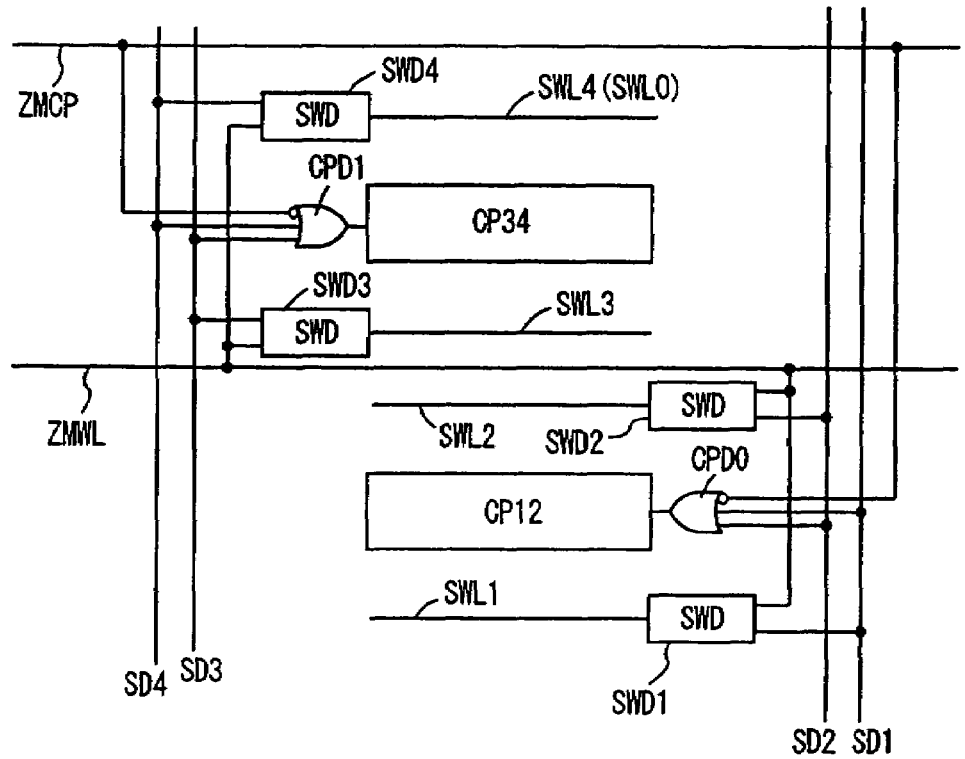
FIG. 59 is a diagram schematically showing the configuration of a cell plate electrode driving section in the fourteenth embodiment of the present invention.

FIG. 59 is a diagram schematically showing the configuration of a section for driving the cell plate electrode. In FIG. 59, a main word line ZMWL is arranged corresponding to sub word lines SWL1-SWL4. Cell plate electrode CP12 is arranged between sub word lines SWL1 and SWL2. Cell plate electrode CP34 is arranged between sub word lines SWL3 and SW14.

Sub word drivers SWD1-SWD4 are arranged corresponding to sub wordlines SWL1-SWL4, respectively. Sub word drivers SWD1 and SWD 2 are arranged in one of the sub word driver bands arranged at both sides in the row direction of this memory cell sub array. Sub word drivers SWD3 and SWD4 are arranged at the other side of these sub word driver bands at the both sides. Sub word drivers SWD1-SWD4 receive sub decode signals SD1-SD4, respectively. When main word line ZMWL is in a selected state and the corresponding sub decode signal SD is driven into H level or into a selected state, the corresponding sub word line SWL is driven into H level of a selected state. Complementary sub decode signals ZSD1-ZSD4, not shown in FIG. 59 for the simplicity of the figure, are applied to sub word drivers SWD1-SWD4, respectively.

A cell plate driver CPDO is arranged corresponding to cell plate electrode CP12, and a cell plate driver CPD1 is arranged corresponding to cell plate electrode CP34. Cell plate driver CPD0 is arranged adjacently to sub word drivers SDW1 and SWD2 and receives a signal on main cell plate line ZMCP and sub decode signals SD1 and SD2. Cell plate driver CPD1 is arranged adjacently to sub word drivers SDW3 and SWD4 and receives a signal on main cell plate line ZMCP and sub decode signals SD3 and SD4.

When the signal on main cell plate line ZMCP is at L level and sub decode signals SD1 or SD2 is in a selected state, cell plate driver CPD0 drives the corresponding cell plate electrode CP12 into a level of, for example, array power supply voltage VCCS. When the signal on main cell plate line ZMCP is at L level and sub decode signal SD3 or SD4 is in a selected state, cell plate driver CPD1 drives the corresponding cell plate electrode CP34 into the level of array power supply voltage VCCS.

For the configuration of the section for driving main cell plate line ZMCP and main word line ZMWL, the configuration shown in FIG. 45 can be employed.

Figure 60:
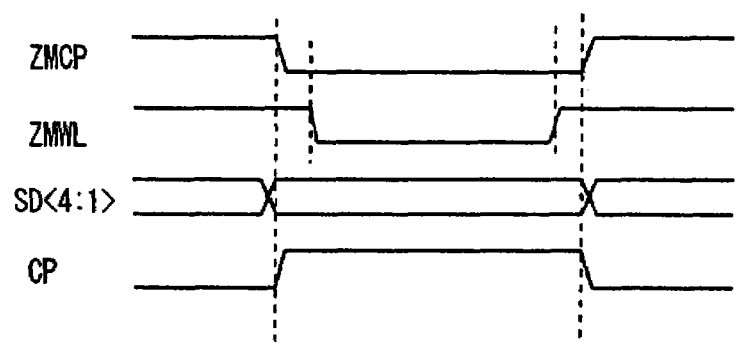
FIG. 60 is a waveform diagram representing the operation of a cell plate electrode driver shown in FIG. 59.

In the configuration shown in FIG. 59, main cell plate line ZMCP is first driven into a select state, as represented by signal waveforms in FIG. 60. After main cell plate line ZMCP is driven into the selected state, the voltage level of the cell plate electrode corresponding to the selected sub word line rises in accordance with sub decode signals SD<4:1> generated concurrently. As a result, the voltage levels of the storage nodes of the memory cells corresponding to an addressed row rise the capacitance coupling. Then, main word line ZMWL is driven into a selected state, and in accordance with sub decode signals SD<4:1>, a sub word line SWL corresponding to a addressed row is driven into a selected state. At this time, the voltage levels of the storage nodes restore to the ground voltage level and the array power supply voltage level, respectively. Read out voltages ΔVH and ΔVL are transmitted onto the corresponding bit line pair.

After the access cycle is completed, main word line ZMVL is first driven into a non-selected state and the sub word line is driven into non-selected state. Then, main cell plate line ZMCP is driven into a non-selected state of H level. In response to the driving of main cell plate line ZMCP into the non-selected state, the output signal of the cell plate driver CPD in the selected state attains to L level of the ground voltage level. The sub word line is in the non-selected state, and the access transistors of the selected memory cells are already in nonconductive states, and therefore, the voltage levels of the storage nodes drop through capacitance coupling.

Consequently, by setting the active period of main cell plate line ZMCP longer than that of main word line ZMWL, the voltage levels of the storage nodes of the selected memory cells can be changed through capacitance coupling, when cell plate voltage VCP is changed while the memory cell transistors are kept in the nonconductive state.

Cell plate drivers CPD0 and CPD1 may be composed of an OR circuit that receives sub decode signals SD1 and SD2 or SD3 and SD4, and an AND circuit that receives an inversion signal of a signal on main cell plate line ZMCP and an output signal of this OR circuit.

[Modification]

Figure 61:
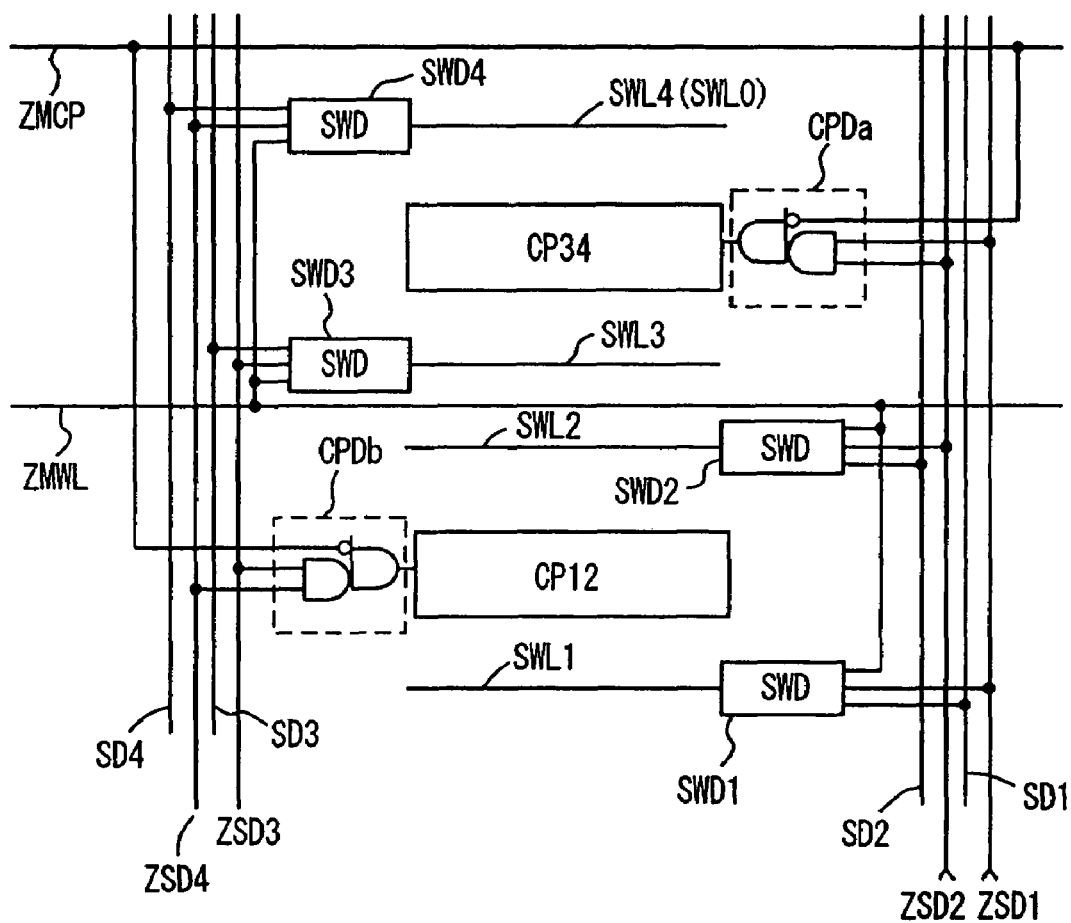
FIG. 61 is a diagram schematically showing a modification of the fourteenth embodiment of the present invention.

FIG. 61 is a diagram schematically showing a modification of the fourteenth embodiment of the present invention. In the configuration shown in FIG. 61, main word line ZMWL is arranged corresponding to sub word lines SWL1-SVWL4, and main cell plate line ZMCP is provided for cell plate electrodes CP12 and CP34. Complementary sub decode signals are applied to sub word drivers SWD1-SDW4 arranged corresponding to sub word lines SWL1-SWL4, respectively, in a conventional art. That is, sub decode signals SD1 and ZSD1 are applied to sub word driver SWD1, and sub decode signals SD2 and ZSD2 are applied to sub word driver SWD2. Sub decode signals SD3 and ZSD3 are applied to sub word driver SWD3, and sub decode signals SD4 and ZSD4 are applied to sub word driver SWD4.

A cell plate driver CPDb, which receives a signal on main cell plate line ZMCP and complementary sub decode signals ZSD3 and ZSD4, is provided to cell plate electrode CP12. A cell plate driver CPDa, which receives a signal on main cell plate line ZMCP and complementary sub decode signals ZSD1 and ZSD2, is provided to cell plate electrode CP34. Sub word drivers SWD1 and SWD2 and cell plate driver CPDb are arranged oppositely with respect to the memory sub array section, in sub word driver bands. Sub word drivers SWD3 and SWD3 and cell plate driver CPDa are arranged oppositely with respect to the memory sub array section.

Each of cell plate drivers CPDb and CPDa is composed of a composite gate. Cell plate drivers CPDa and CPDb receive the corresponding sub decode signals ZSD1 and ZSD2 or ZSD3 and ZSD4, respectively, and further receive a signal on main cell plate line ZMCP. The composite gate constituting cell plate driver CPDb (CPDa) includes an AND gate which receives the corresponding complementary sub decode signals ZSD3 and ZSD4 (ZSD1 and ZSD2), and a gate circuit which receives an output signal of this AND circuit and a signal on main cell plate line ZMCP. The gate circuit outputs a signal of H level when the signal on main cell plate line ZMCP is at L level and the output signal of the AND circuit is at H level, so as to drive the corresponding cell plate electrode CP12 or CP34 into the array power supply voltage level.

For example, when sub word line SWL3 or SWL4 is selected, both of sub decode signals ZSD1 and ZSD2 are at H level and sub decode signals SD1 and SP2 are at L level. One of sub decode signals SD3 and SD4 is at H level and the other is at L level. Therefore, when sub decode signal SWL3 or SWL4 is selected, the output signal of cell plate driver CPDb is at L level and the output signal of cell plate driver CPDa turns H level.

When sub decode signal SWL1 or SWL2 is selected, one of complementary sub decode signals ZSD1 and ZSD2 turns L level and both of sub decode signals ZSD3 and ZSD4 are at H level. In this case, therefore, the output signal of cell plate driver CPDb turns H level and the output signal of cell plate driver CPDa is kept at L level. As a result, even if the configuration shown in FIG. 61 is used, the voltage level of the cell plate electrode arranged corresponding to a selected sub word line can be kept at H level in an active cycle and can be kept at L level in a standby state.

Upon transition to the standby state, all of sub decode signals ZSD1-ZSD4 are at H level, but the signal on main cell plate line ZMCP turns H level and the output signals of cell plate drivers CPDb and CPDa turn L level.

According to the configuration as shown in FIG. 61, cell plate drivers CPDa and CPDb and sub word drivers SWD1 to SWD4 can be alternately arranged at both sides of the memory sub array along the row direction. Thus, the layout can be made easy.

For the configuration of sub word drivers SWD1-SWD4, the configuration of sub word drivers in the prior art can be used.

In the case that the memory cell transistor is formed of a P channel MOS transistor, the driving direction of the cell plate voltage is reversed to the above operation. Specifically, the cell plate voltage is kept at the array power supply voltage level in the standby, and the cell plate voltage is kept at the ground voltage level in the access cycle.

In the above-mentioned configuration, cell plate electrode CP is arranged corresponding to two sub word lines and in common thereto. As shown in FIG. 46, however, cell plate electrodes CP1-CP4 may be arranged corresponding to sub word lines SWL1-SWL4, respectively. In this case, as cell plate drivers with the configuration equivalent to that of the sub word drivers, can be used. During the active cycle period, the cell plate electrode arranged corresponding to a selected sub word line can be driven into the array power supply voltage or a predetermined voltage level merely by making the activating timing of main word line ZMWL different from that of main cell plate line ZMCP.

For the configuration in which cell plate electrodes are arranged in a meshed shape, such a configuration may be employed that the cell plate electrode layer is driven in a unit of memory blocks including the memory sub arrays aligned in the row direction and a cell plate electrode interconnection line provided to a memory block including a selected word line is driven by a cell plate driver, for example, in accordance with a memory block selecting signal. In this memory block, a main word line is arranged extending in the row direction, and a main cell plate line is also arranged extending in the row direction.

In the configuration of a hierarchical word line configuration, 4 sub word lines are connected to one main word line. However, an 8-way hierarchical word line configuration may be employed in which 8 sub word lines are provided to one main word line.

A negative logic signal is transmitted on the main cell plate line. However, a positive logic signal may be transmitted on the main cell plate line for providing the timing for driving the cell plate electrode.

As the word line configuration, a non-hierarchical word line configuration may be used. In the case of this non-hierarchical word line configuration, a cell plate driver having the same configuration as the word driver is used to drive the corresponding cell plate electrode. However, in the case that the cell plate electrode is provided to two word lines, the cell plate driver drives the corresponding cell plate electrode into a selected state in accordance with the signals for selecting the corresponding two word lines. As the configuration for such arrangement, an OR circuit may be employed that receives word line selecting signals for selecting the corresponding two word lines.

As described above, according to the fourteenth embodiment of the present invention, in a standby state, the voltage of the storage node storing an L level data is kept at a negative voltage level and upon start of an active cycle, this storage node voltage is returned to the original voltage level. A potential barrier is formed between the storage node and the inversion layer forming region to prevent outflow of electrons. As a result, it is possible to prevent the voltage of the storage node storing the L level data from rising. Thus, a sufficiently large read out voltage can be read out onto the corresponding bit line. Thus, data retention characteristics can be significantly improved in the semiconductor memory device of a non-boosted word line scheme.

Fifteenth Embodiment

Figure 62:
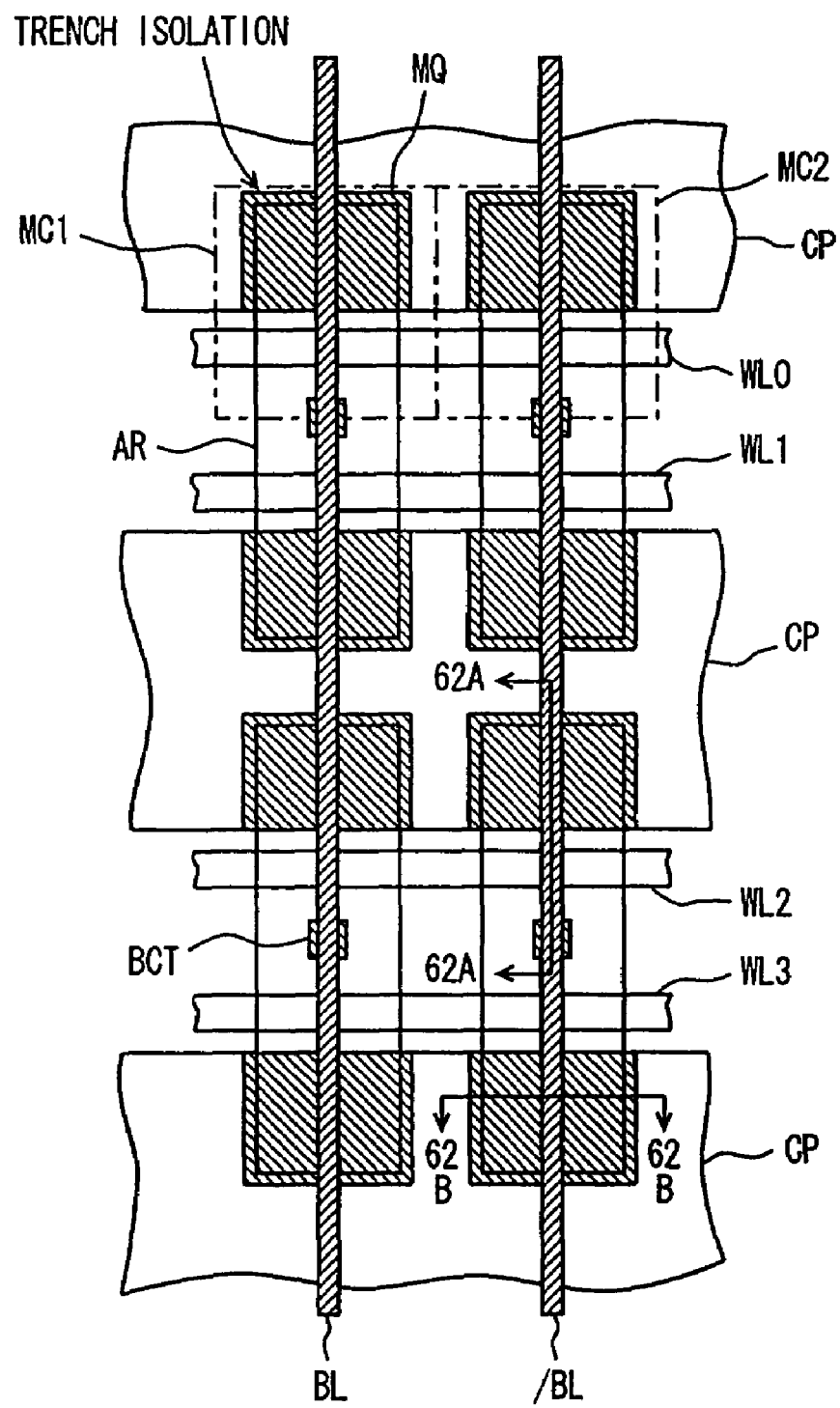
FIG. 62 is a diagram schematically showing a layout of memory cells according to a fifteenth embodiment of the present invention.

FIG. 62 is a diagram schematically showing a layout of a memory cell array according to a fifteenth embodiment of the present invention. FIG. 62 representatively shows the layout of memory cells arranged in 4 rows and 2 columns. In the layout of the memory cells shown in FIG. 62, a cell plate electrode CP is arranged commonly to memory cells MC arranged in two rows in the same way as in the layout shown in FIG. 48.

Active areas AR are arranged in alignment in the column direction. Each active area AR has a 2-bit DRAM cells formed therein.

A bit line BL or /BL is arranged corresponding to active areas AR aligned in the column direction. Bit lines BL and /BL are electrically connected to the corresponding active areas through bit line contacts BCT. These bit line contacts BCT are arranged in alignment in the row direction.

Word lines WL are arranged to be opposite to each other with respect to bit line contacts BCT arranged in alignment in the row direction. Word lines WL0 and WL1 are arranged oppositely to each other with respect to the bit line contacts BCT. Word lines WL2 and WL3 are arranged oppositely to each other with respect to bit line contacts BCT.

In the layout shown in FIG. 62, memory cells MC1 and MC2 arranged adjacently to each other in the row direction store 1-bit data. That is, complimentary data are stored in memory cells MC1 and MC2, and the storage data in these memory cells MC1 and MC2 are read out onto bit lines BL and /BL simultaneously.

Each memory cell MC (active area AR) is isolated from the adjacent memory cell (active area AR) by a buried insulating film formed in a trench region. Cell plate electrode CP constitutes a capacitor with a diffusion layer formed in a side wall of this isolating trench. Therefore, an effective capacitor region MQ is wider than active area AR.

Figure 63:
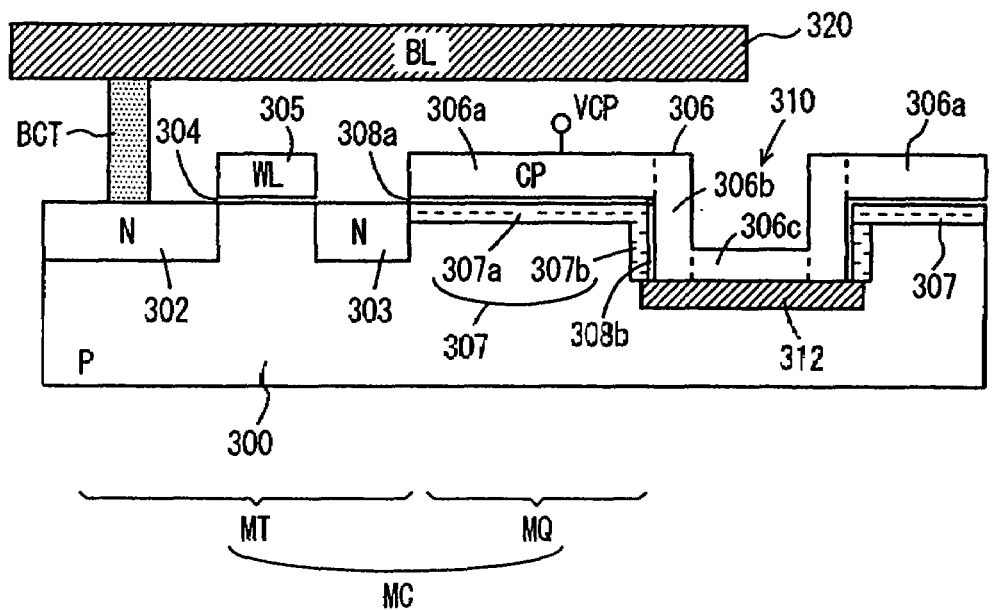
FIG. 63 is a diagram schematically showing a cross sectional structure taken along line 62A-62A in FIG. 62.

FIG. 63 is a diagram schematically showing a cross sectional structure taken along line 62A-62A in FIG. 62. In FIG. 63, memory cell MC is formed on a P-type semiconductor substrate region 300. A memory cell transistor MT includes N-type impurity regions 302 and 303 formed apart from each other on the surface of this P-type semiconductor substrate area 300; and a conductive layer 305 formed, with a gate insulating film laid thereunder, on a region between impurity regions 302 and 303. This conductive layer 305 constitutes word line (sub word line) WL, and is made of a silicon-containing material, such as polycrystal silicon into which an impurity is introduced (ion-implanted polysilicon or doped polysilicon), polycide such as WSix or CoSix, or salicide.

In effective capacitor region MQ, a side wall of a trench region 310 for isolating this memory cell is utilized to constitute a capacitor. Trench region 310 isolates adjacent memory cells (active areas) by means of buried insulating film 312 formed in the bottom of the trench.

A conductive layer 306 constituting cell plate electrode CP is formed with capacitor insulating films 308 (308a and 308b) laid thereunder on this semiconductor substrate area 300 and the bottoms and the side walls of trench regions 310. Conductive layer 306 is made of the same material as conductive layer 305 constituting word line WL, and is formed in the same interconnection layer. That is, cell plate electrodes CP and word lines WL are formed in the same manufacturing process. A cell plate voltage VCP is applied to conductive layer 306.

Conductive layer 306 includes a conductive layer 306a arranged facing, through capacitor insulating film 308a, to a storage node (inversion layer) 307a formed on the surface of semiconductor substrate area 300; a conductive layer 306b arranged facing, through a storage node (inversion layer) 307b and capacitor insulating film 308b, to the side wall of trench region 310; and a conductive layer 306c formed on buried insulating film 312 and at the bottom of the trench region. These conductive layers 306a, 306b and 306c are continuously extended in the row direction, and arranged commonly to the memory cells arranged in alignment in two rows.

The storage nodes of the memory cells adjacent to each other in the row direction and in the column direction are isolated from each other by this buried insulating film 312. Storage node 307 is formed of an inversion layer. However, an impurity may be introduced into storage node 307.

The area of the capacitor can be effectively made large by means of conductive layer 306b facing to storage node 307b formed on the side wall of trench region 310. By isolating the memory cells (active area) by means of buried insulating film 312 formed in the bottom of trench region 310, the so-called isolation merged type capacitor configuration can be achieved and the isolation region can also be used as a region for forming a memory cell capacitor. Thus, the capacitance of the memory cell capacitor can be made larger without increasing the array area.

Gate insulating film 304 beneath conductive layer 305, and capacitor insulating films 308 (308a, and 308b) on the bottom and side of conductive layer 306 may be made of the same insulating film material in the same thickness. Alternatively, by dual gate insulating film process, they may be formed to have a different film thickness from each other.

Impurity region 302 is electrically connected to conductive layer 320 formed of, for example, a first level metal interconnection layer through bit line contact BCT. The conductive layer 320 is formed of a metal interconnection layer made of Cu, Al or the like, to constitute bit line BL. Thus, a CUB configuration in which cell plate electrodes CP are present below bit lines BL is achieved.

Figure 64:
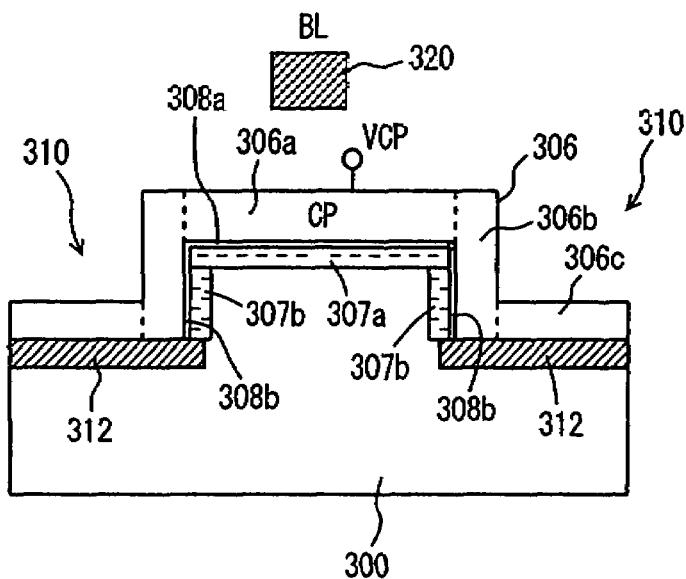
FIG. 64 is a diagram schematically showing a cross sectional structure taken along line 62B-62B in FIG. 62.

FIG. 64 is a diagram schematically showing a cross sectional configuration taken along line 62B-62b in FIG. 62. As shown in FIG. 64, the memory cells (memory cell capacitors; active areas) adjacent to each other in the row direction are isolated from each other by means of buried insulating film 312 formed in the bottom of trench region 310. Conductive layer 306 constituting cell plate electrode CP is arranged continuously extending in the row direction. This conductive layer 306 includes side wall conductive layer 306b formed with capacitor insulating film 308b interposed in between on the side wall of trench region 310; bottom conductive layer 306b formed contacting buried insulating film 312; and planar conductive layer 306a formed facing, through capacitor insulating film 308a, to storage node 307a formed in the surface of semiconductor substrate area 300.

Therefore, as shown in FIG. 64, the side walls of trench region 310 formed at both sides in the row direction of the memory cell capacitor region can be used as a memory cell capacitor. Thus, the area of effective capacitor region MQ is made large so that the capacitance of the memory cell capacitor can be made sufficiently large.

In order to form isolation insulating film 312, it is sufficient to use an appropriate process for forming a buried insulating film.

In the above description, conductive layer 305 constitutes a word line WL. However, this conductive layer 305 may constitute sub word line in a hierarchical word line configuration. In this configuration, main word lines are formed as an even upper layer of, for example, a second metal interconnection layer.

Modification

Figure 65:
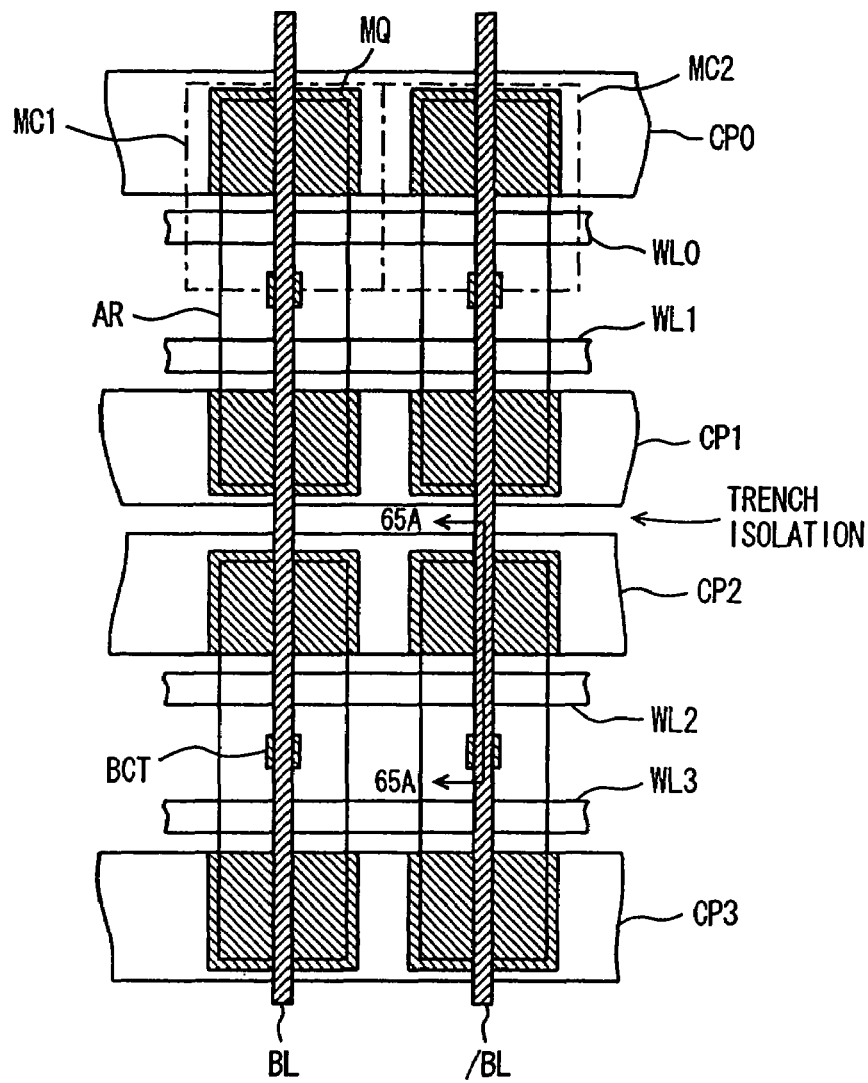
FIG. 65 is a diagram schematically showing a layout of a modification of the fifteenth embodiment of the present invention.

FIG. 65 is a diagram schematically showing a layout of a modification of the fifteenth embodiment of the present invention. In FIG. 65, cell plate electrodes CP are separately arranged corresponding to word lines (sub word lines) WL0-WL3. Therefore, cell plate electrodes CP0-CP3 each are arranged commonly to memory cells in one row. The cell plate electrodes in adjacent rows are separated from each other. Other elements are the same as in the layout shown in FIG. 62. The same reference numerals are attached to the corresponding elements, and detailed description thereof is omitted.

Figure 66:
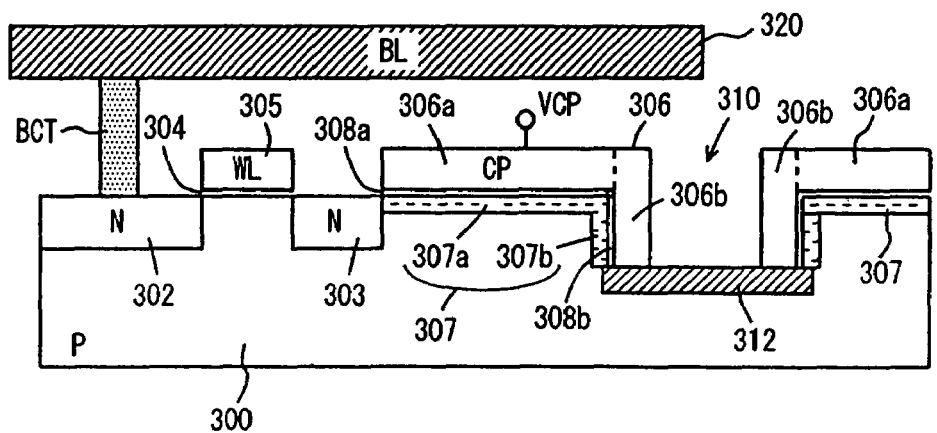
FIG. 66 is a diagram schematically showing a cross sectional structure taken along line 65A-65A in FIG. 65.

FIG. 66 is a diagram schematically showing a cross sectional structure taken along line 65A-65A in FIG. 65. If the cell plate electrode is formed on the surface of buried insulating film 312 in FIG. 66, conductive layers 306b formed on the side walls of trench regions 310 are isolated from each other by means of buried insulating film 312. Other elements in this memory cell configuration are the same as in the layout shown in FIG. 63. The same reference numerals are attached to the corresponding elements, and detailed description thereof is omitted.

The cross sectional structure of this cell plate electrode CP taken along the word line direction is the same as shown in FIG. 60.

For the manufacturing step of forming the conductive layer constituting cell plate electrode CP only on the side walls of trench region 310 but not forming the conductive layer constituting cell plate electrode CP in the bottoms of trench region 310, for example, the following steps can be used: a step of forming conductive layer 306 (306c) on isolation insulating film 312 in the same way as in the memory cell configuration as shown in FIG. 63, and a step of applying anisotropic etching (RIE; reactive ion etching) to remove conductive layer 306c in the bottom of the trench.

As shown in FIG. 66, by extending cell plate electrode CP on side walls of trench region 310 inside trench region 310 and exposing the surface of buried insulating film 312 without forming any conductive layer in the bottom of trench regions 310, the cell plate electrodes adjacent to each other can easily be isolated. Thus, the isolation merged type capacitor configuration can be achieved and cell plate electrodes CP can be arranged corresponding to the respective word lines (sub word lines).

In the above-mentioned memory cell configuration, the N channel MOS transistors (insulated gate type field effect transistors) are used as access transistors. However, P channel MOS transistors may be used for the access transistors.

The configuration, in which buried insulating film 312 in the trench region is used to isolate the memory cells and the side walls of this trench region are used as a capacitor, can be applied to the configurations of the first to fourteenth embodiments. The isolation merged type capacitor configuration utilizing the side wall of the trench region as a memory cell capacitor can also be applied to a configuration in which cell plate voltage VCP is controlled for each cell plate electrode.

In the case that a trench isolation configuration is used for isolating well regions or elements in a logic, trenches for isolating memory cells (active areas) may be simultaneously formed in the step of forming the isolating trenches in this logic. By simultaneous formation of the trenches for forming the capacitors with the formation of the isolating trenches in the logic in the same steps, the logic and the memory can be formed in the same manufacturing steps without an increase in manufacturing steps.

As described above, according to the fifteenth embodiment of the present invention, in the configuration in which memory cells are isolated by means of buried insulating film in the bottom of trench regions, the side walls of the trench regions are used as memory cell capacitors to achieve isolation merged type capacitors. Thus, a memory cell capacitor occupying only a small area and having a large capacitance can be implemented.

Other Embodiments

As the configuration of word lines, the hierarchical word line configuration of a main word line and sub word lines is not used but a word line shunt configuration, in which a polysilicon word line is shunted with low-resistance metal interconnection line, may be used. A combination of the hierarchical word line configuration and the word line shunt configuration may be used.

As the memory cell transistors, P channel MOS transistors may be used instead of the N channel MOS transistors.

As the memory cell capacitors, the planar capacitors are used. However, in the case that a trench isolation configuration is used in the logic, trench capacitors may be used as the memory cell capacitors. An increase in manufacturing process steps for forming the memory cell capacitors can be suppressed by forming trenches in the memory cells simultaneously with formation of the isolation trenches in the logic section.

As described above, according to the present invention, cell plate electrodes and word lines of memory cell capacitors are formed in the same interconnection layer, and memory cells are simultaneously connected to bit lines in a pair. Thus, additional manufacturing process steps for forming the memory cell capacitors can be made unnecessary. Logic and embedded semiconductor memory device can be formed by the same manufacturing processes. Moreover, a semiconductor memory device superior in data retention characteristics can be achieved. Furthermore, the height of the memory capacitors can be made low so that the step between the memory array section and the peripheral section thereof can be decreased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
    a plurality of memory cells arranged in row and columns, each of said memory cells including a capacitor including a cell plate electrode and a storage electrode arranged facing to said cell plate electrode, for accumulating electric charges corresponding to storage data;
    a plurality of word lines arranged corresponding to the rows of memory cells and each connecting to the memory cells in a corresponding row, said word lines being formed in a same interconnection layer as the cell plate electrodes;
    a plurality of bit lines arranged corresponding to the columns of memory cells and each connecting to the memory cells on a corresponding column, the bit lines being arranged in pairs and bit lines in each pair being arranged with a bit line of other pair interposed in between; and
    row selecting circuitry for selecting an addressed word line out of the word lines in accordance with an address signal, the memory cells being arranged such that data in selected memory cells on an addressed row are simultaneously read out onto bit lines in a pair by a selected word line, said row selecting circuitry selecting one word line out of the word lines in accordance with the address signal.

2. The semiconductor memory device according to claim 1, wherein
    the memory cells are arranged at alternate bit lines in a row direction, and one of the bit lines adjacent to each other in a same row is provided with a memory cell, and another bit line of said bit lines is provided with no memory cell, and
    said semiconductor memory device further comprises:
    a plurality of sense amplifiers provided corresponding to the bit line pairs, for amplifying a voltage of a corresponding bit line pair differentially when activated; and
    sense amplifier control circuitry for activating a sense amplifier arranged corresponding to a pair of bit lines connected to selected memory cells selectively out of said plurality of sense amplifiers in accordance with said address signal.

3. The semiconductor memory device according to claim 2, wherein said sense amplifiers comprise a group of sense amplifiers arranged corresponding to a first group of the bit line pairs and a second group of sense amplifiers arranged corresponding to a second group of said bit line pairs, and
    said sense amplifier control circuitry activates one of the first and second groups of sense amplifiers in accordance with said address signal.

4. The semiconductor memory device according to claim 3, wherein the first sense amplifier group comprises the sense amplifiers arranged at one side of said bit lines in a column direction and the second sense amplifier group comprises the sense amplifiers arranged at another side of said bit lines in said column direction.

5. The semiconductor memory device according to claim 3, wherein said sense amplifier control circuitry selectively activates the first and second sense amplifier groups in accordance with a bank address signal included in said address signal.

6. The semiconductor memory device according to claim 2 wherein said plurality of sense amplifiers are arranged in alignment at one side of the bit line pairs.

7. The semiconductor memory device according to claim 6, wherein said plurality of memory cells are divided into row blocks in a column direction, and
    the sense amplifiers are arranged between the row blocks such that the sense amplifiers are shared between the row blocks adjacent thereto, and that with respect to each row block, corresponding sense amplifiers are arranged at only one side of said each row block.

8. The semiconductor memory device according to claim 3, wherein said first and second groups of sense amplifiers are coupled to individual ports accessible independently of each other, respectively.

9. The semiconductor memory device according to claim 3, wherein the sense amplifiers of said first group and the sense amplifiers of said second group are alternately arranged oppositely with respect to the bit line pairs.

* * * * *